United States Patent [19]

Hamamoto et al.

[11] Patent Number: 5,731,609
[45] Date of Patent: Mar. 24, 1998

[54] MOS RANDOM ACCESS MEMORY HAVING ARRAY OF TRENCH TYPE ONE-CAPACITOR/ONE-TRANSISTOR MEMORY CELLS

[75] Inventors: Takeshi Hamamoto, Kanagawa-ken; Fumio Horiguchi, Tokyo, both of Japan

[73] Assignee: Kabushiki Kaisha Toshiba, Kawasaki, Japan

[21] Appl. No.: 804,573

[22] Filed: Feb. 24, 1997

Related U.S. Application Data

[60] Continuation of Ser. No. 524,970, Sep. 8, 1995, abandoned, which is a division of Ser. No. 418,877, Apr. 7, 1995, Pat. No. 5,477,071, which is a continuation of Ser. No. 36,534, Mar. 19, 1993, abandoned.

[30] Foreign Application Priority Data

| | | | |
|---|---|---|---|
| Mar. 19, 1992 | [JP] | Japan | 4-063890 |
| Mar. 19, 1992 | [JP] | Japan | 4-063891 |
| Sep. 10, 1992 | [JP] | Japan | 4-242377 |
| Feb. 19, 1993 | [JP] | Japan | 5-053171 |

[51] Int. Cl.$^6$ .................. H01L 29/68; H01L 29/78; H01L 29/92
[52] U.S. Cl. .................. 257/302; 257/301; 257/305
[58] Field of Search .................. 257/301, 302, 257/303, 305

[56] References Cited

U.S. PATENT DOCUMENTS

| | | | |
|---|---|---|---|
| 4,713,678 | 12/1987 | Womack et al. | |
| 4,864,374 | 9/1989 | Banerjee | |
| 4,914,628 | 4/1990 | Nishimura | 365/149 |
| 5,177,576 | 1/1993 | Kimura et al. | 257/71 |
| 5,216,266 | 6/1993 | Ozaki | 257/302 |

FOREIGN PATENT DOCUMENTS

| 63-17553 | 1/1988 | Japan | 257/302 |
|---|---|---|---|

*Primary Examiner*—Ngân V. Ngô
*Attorney, Agent, or Firm*—Oblon, Spivak, McClelland, Maier & Neustadt, P.C.

[57] ABSTRACT

A random access memory device includes a semiconductive substrate having a surface in which a groove pattern is formed to provide a plurality of rows and columns of island portions. A plurality of trenches are formed in the island portions, which are provided with an array of memory cells arranged in rows and columns. Each of these memory cells consists of a capacitor and a metal oxide semiconductor (MOS) transistor which are stacked on each other in a corresponding one of the trenches. Parallel word lines are coupled to the rows of memory cells, and parallel bit lines are coupled to the columns of memory cells. An insulative layer is buried in each groove for causing adjacent ones of the island portions to be electrically isolated from each other.

6 Claims, 49 Drawing Sheets

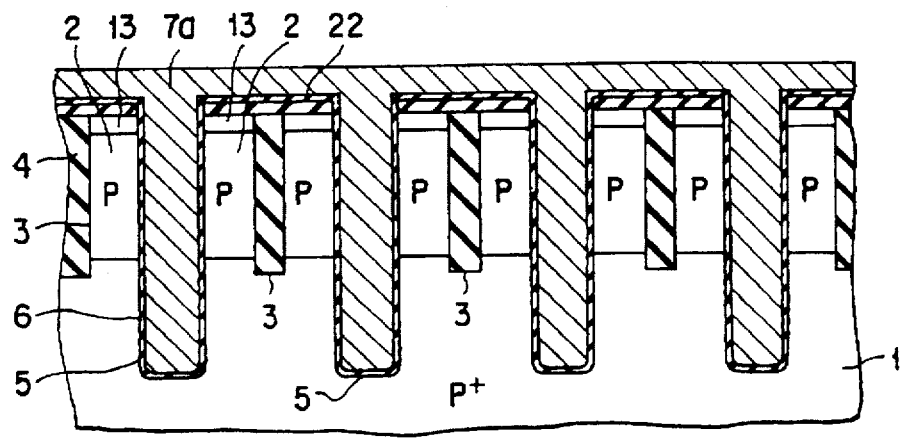
F I G. 3D
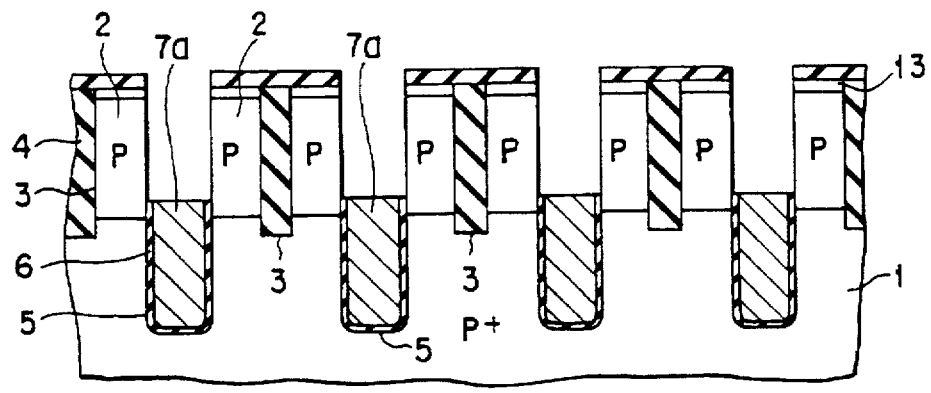
F I G. 3E
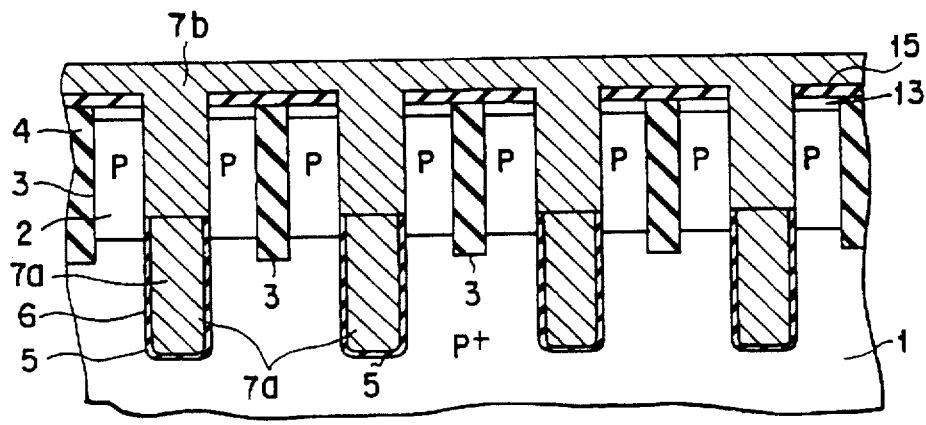
F I G. 3F

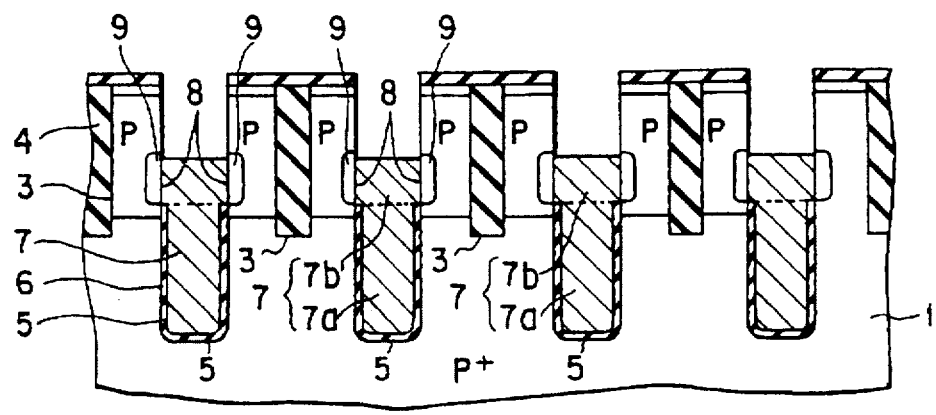
F I G. 3G
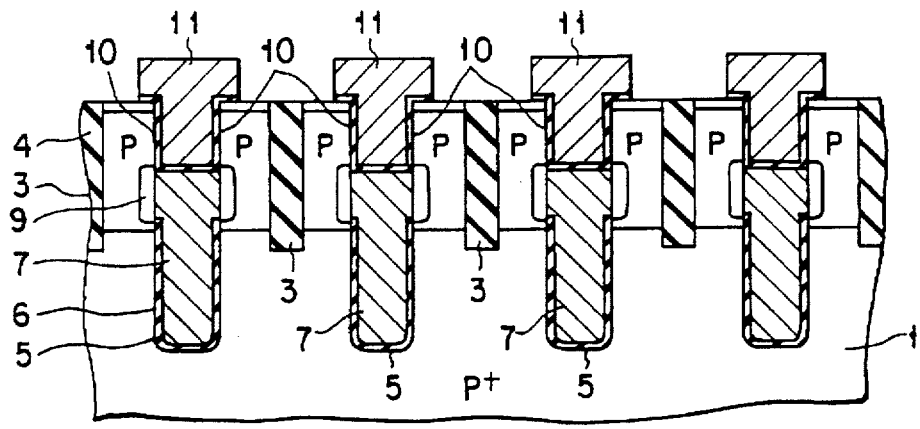
F I G. 3H
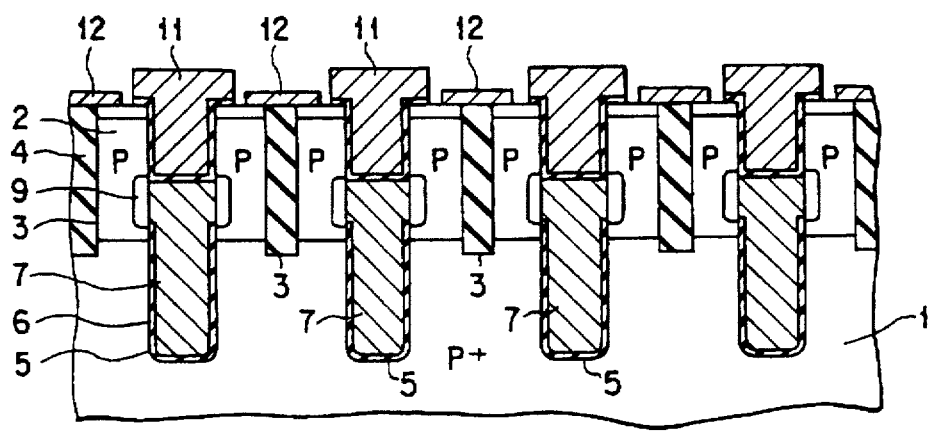
F I G. 3I

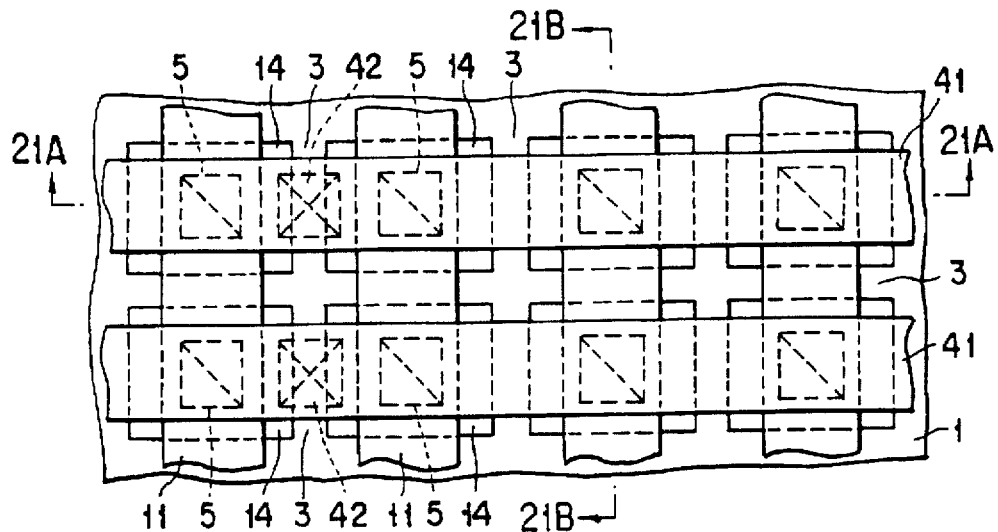
F I G. 20
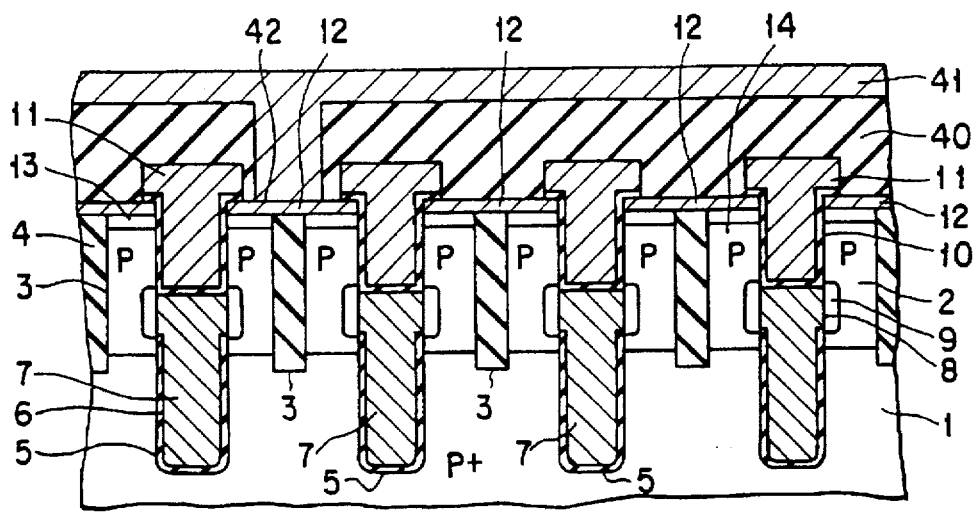
F I G. 21A
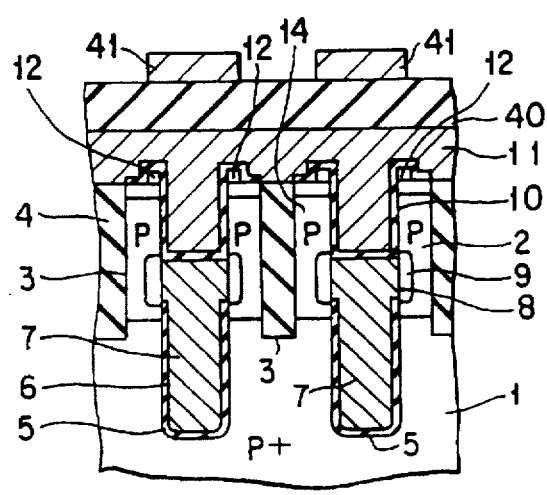
F I G. 21B

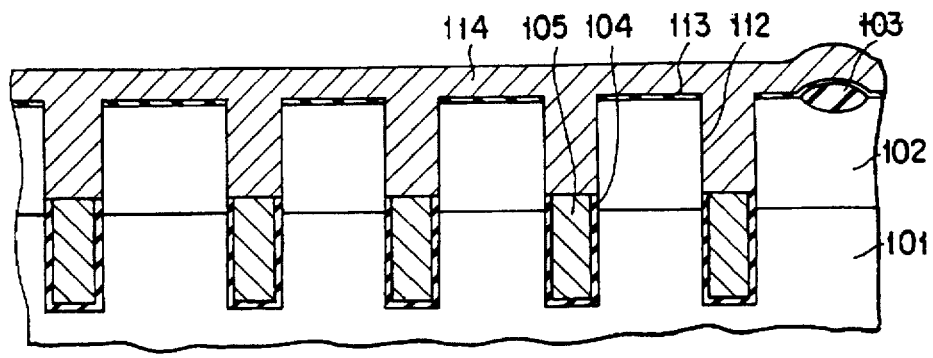
F I G. 29E
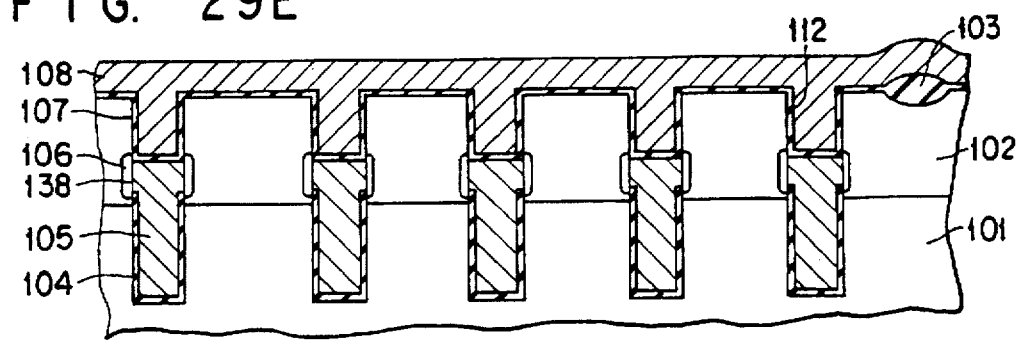
F I G. 29F
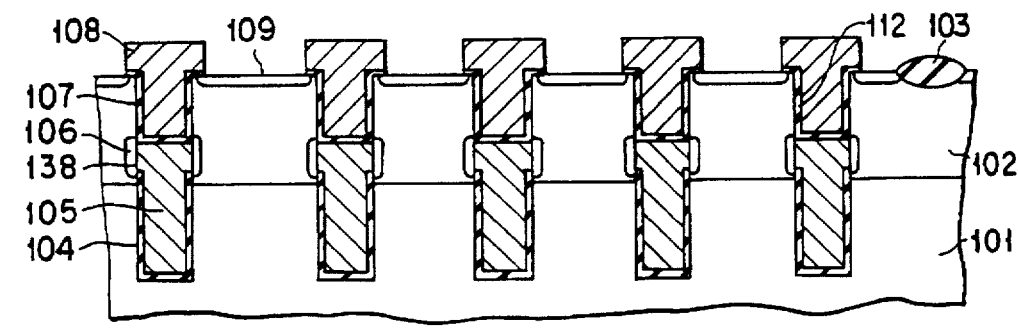
F I G. 29G
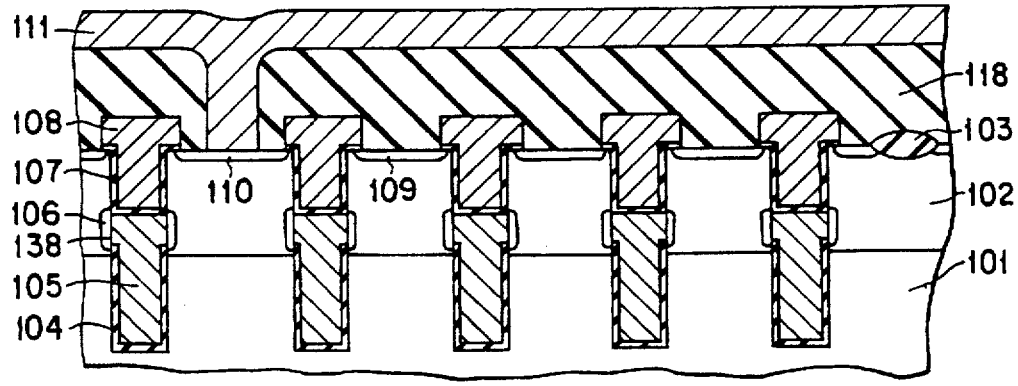
F I G. 29H

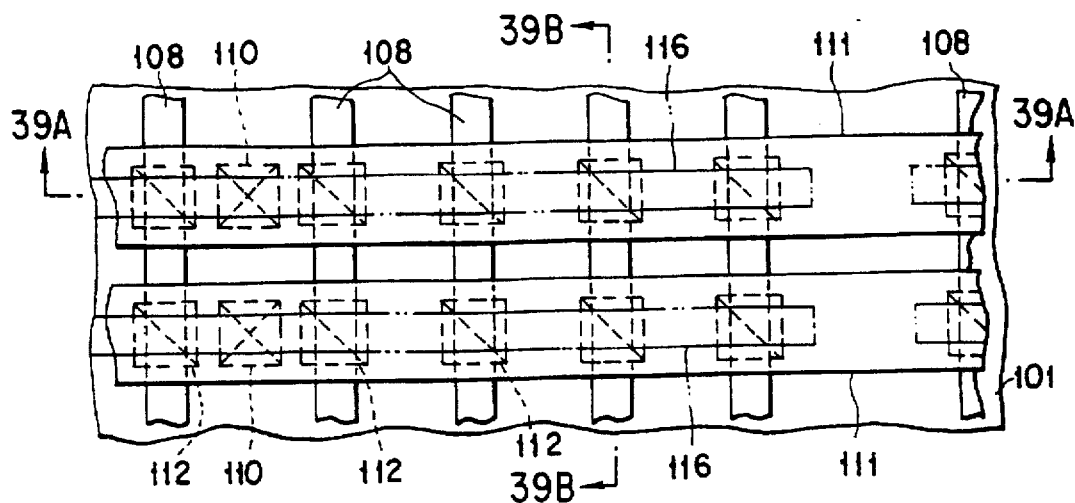
F I G. 38
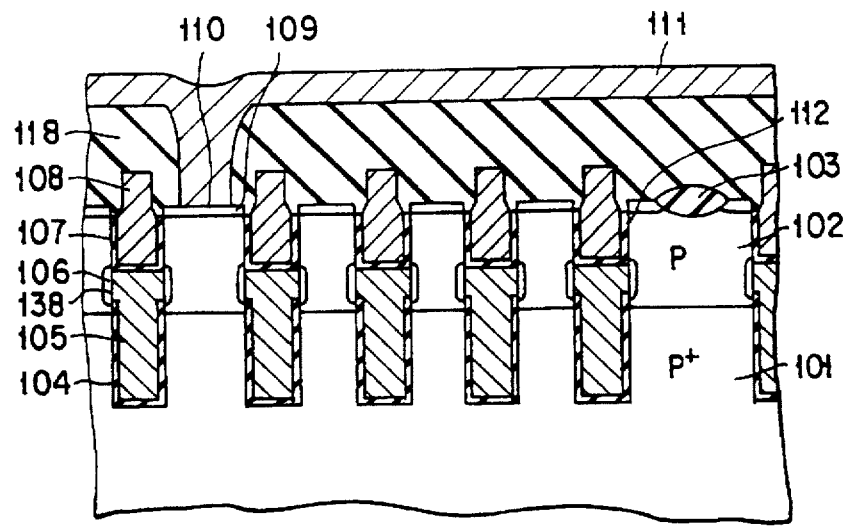
F I G. 39A
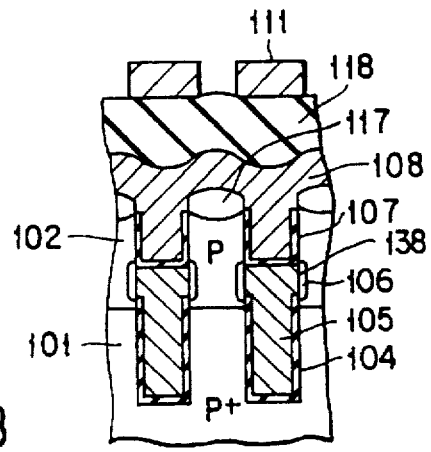
F I G. 39B

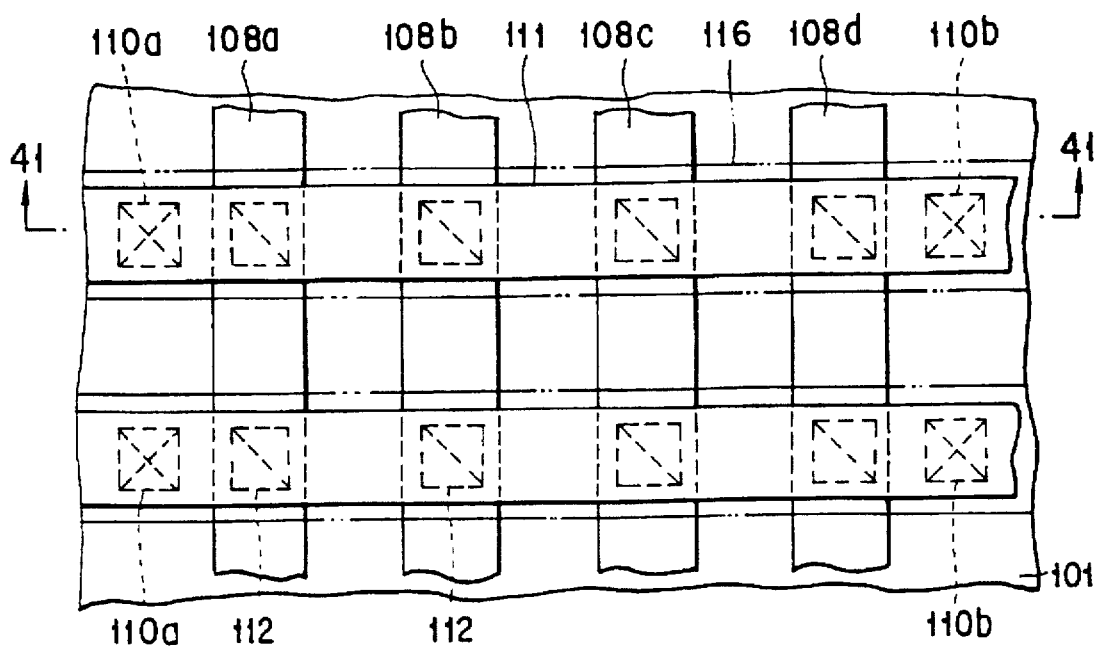
F I G. 40
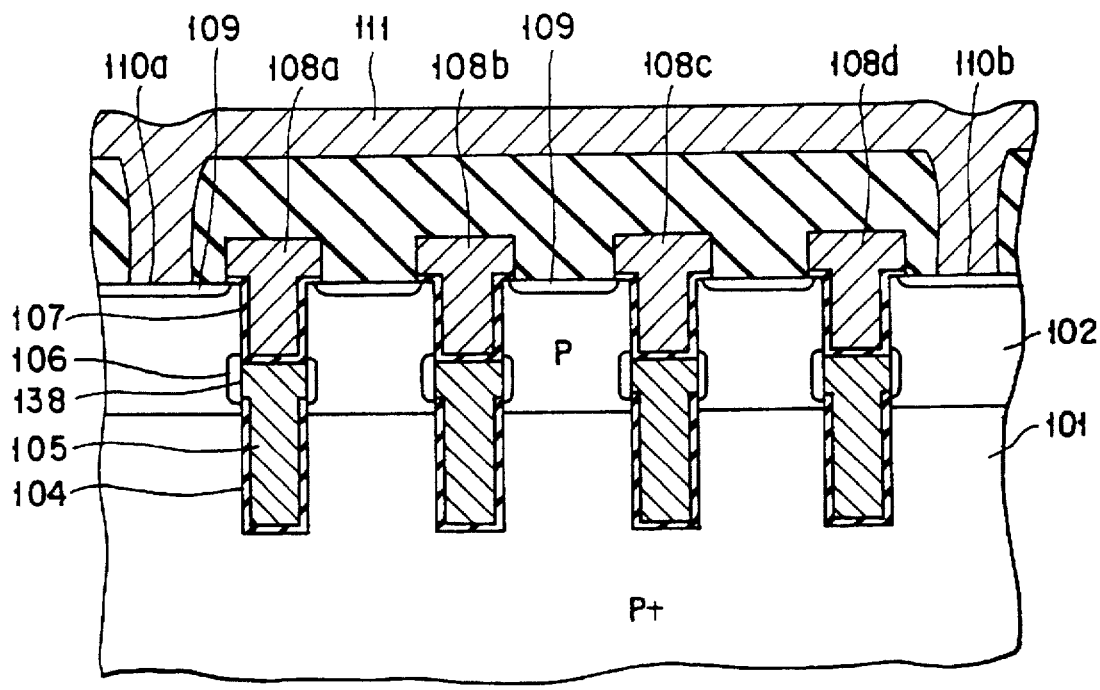
F I G. 41

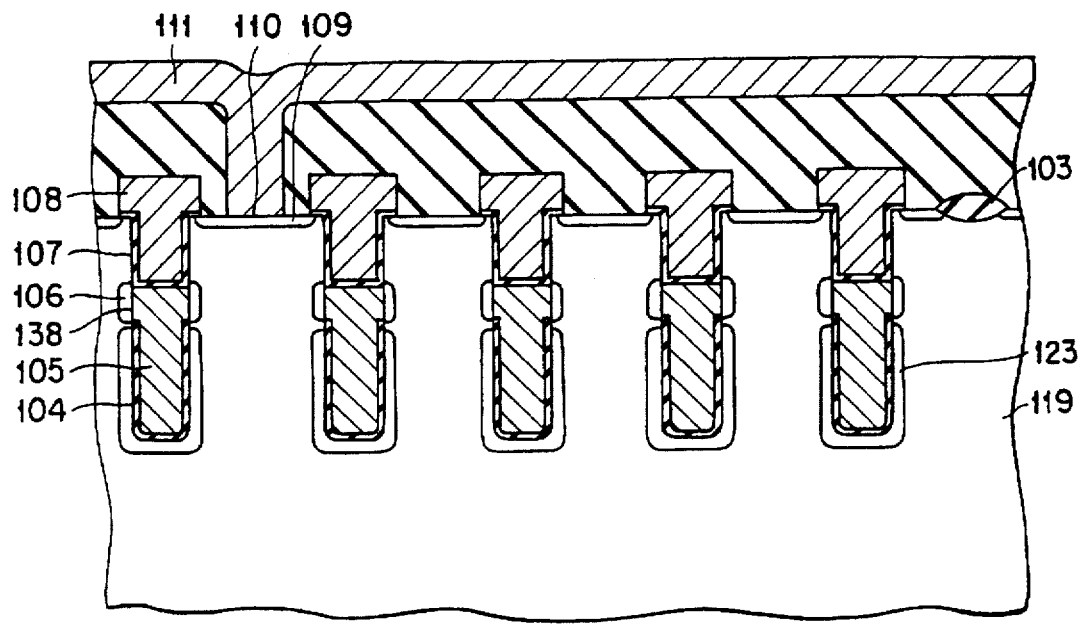
F I G. 44
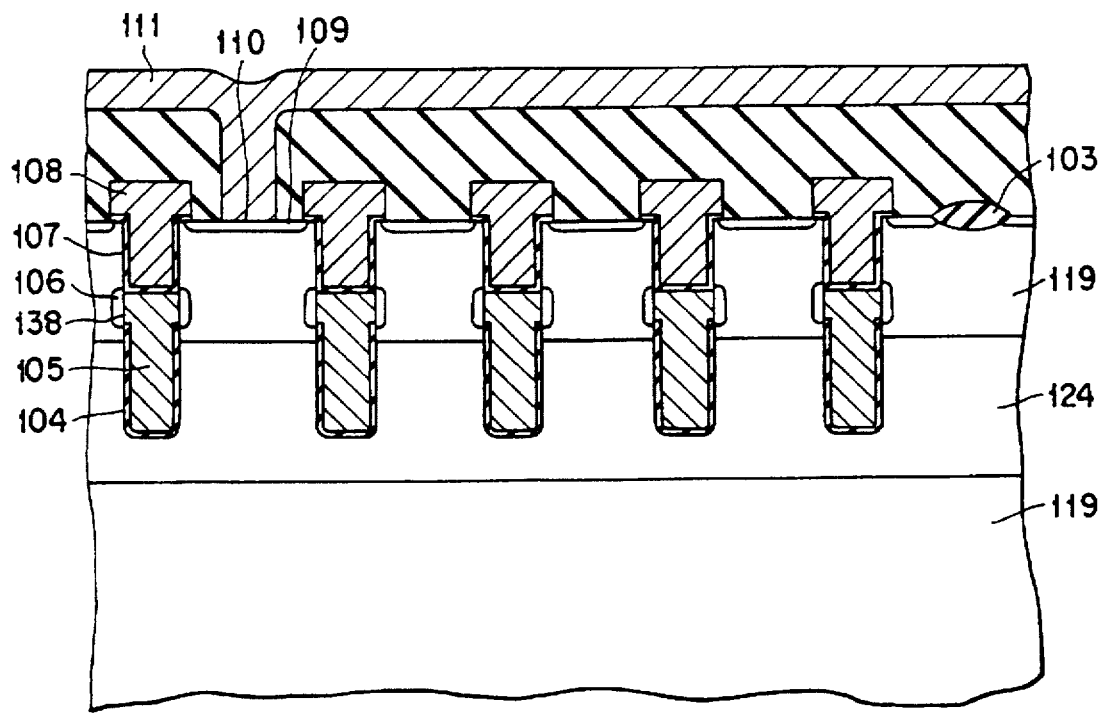
F I G. 45

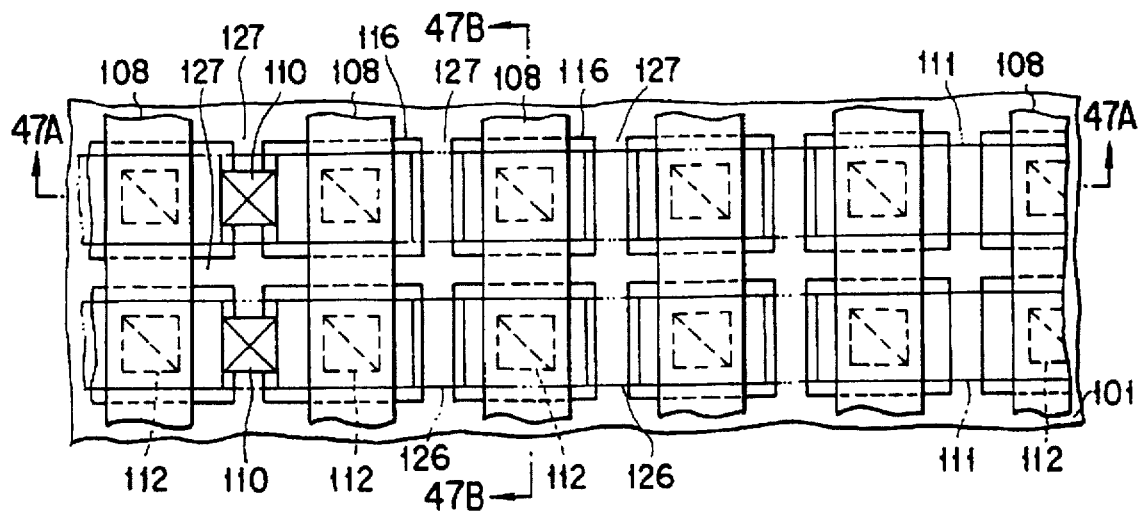
F I G. 46
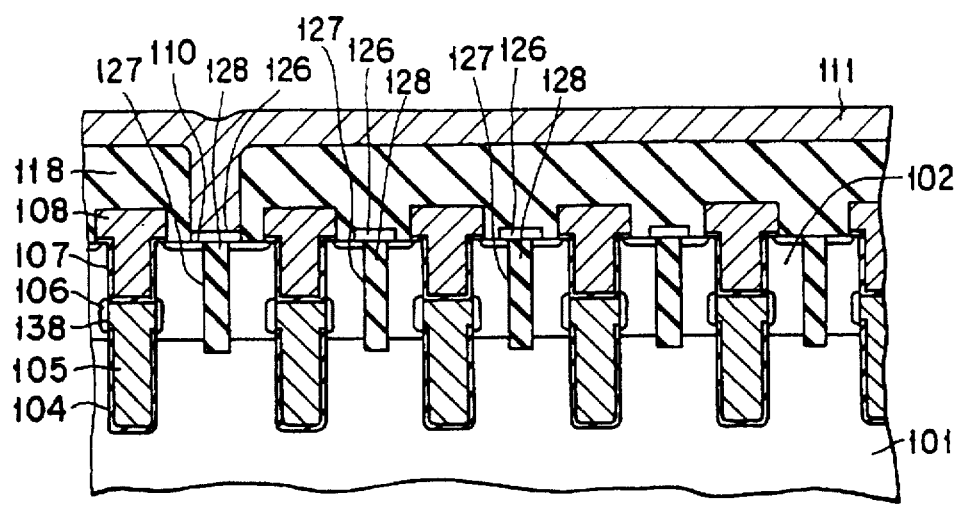
F I G. 47A
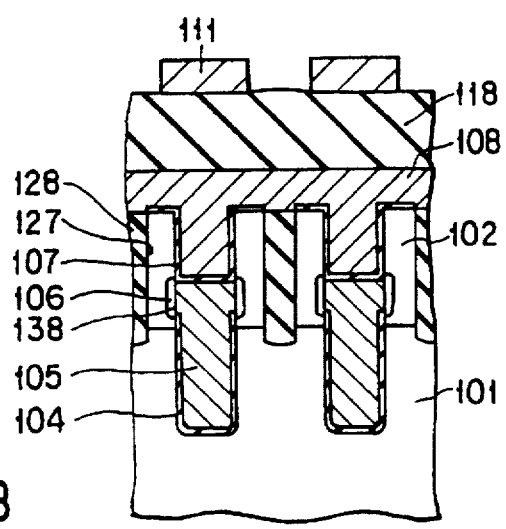
F I G. 47B

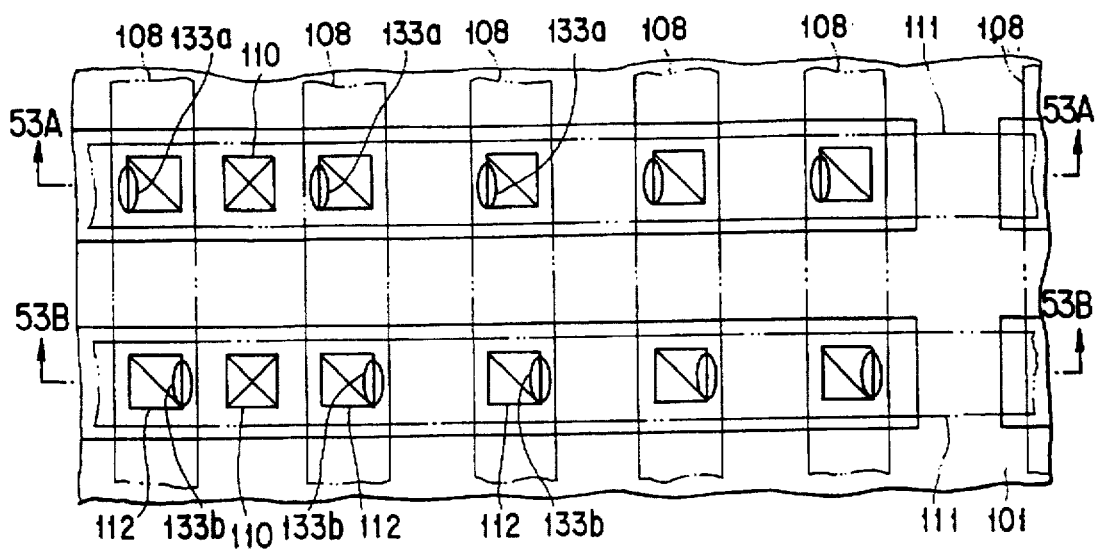
F I G. 52
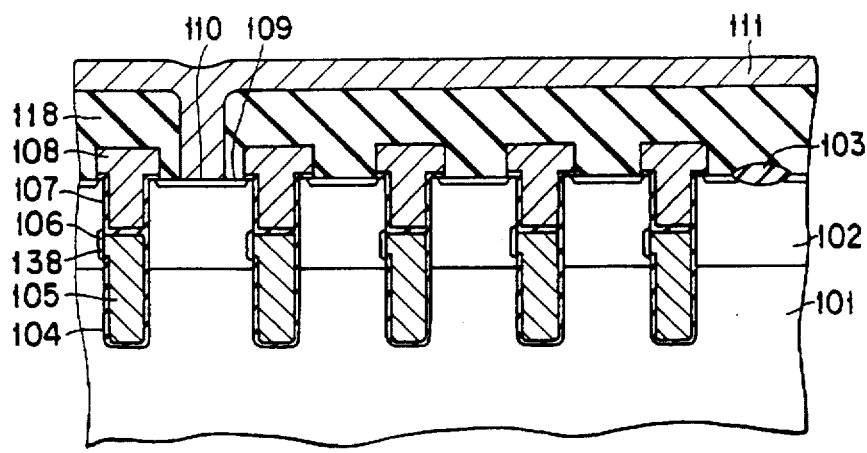
F I G. 53A
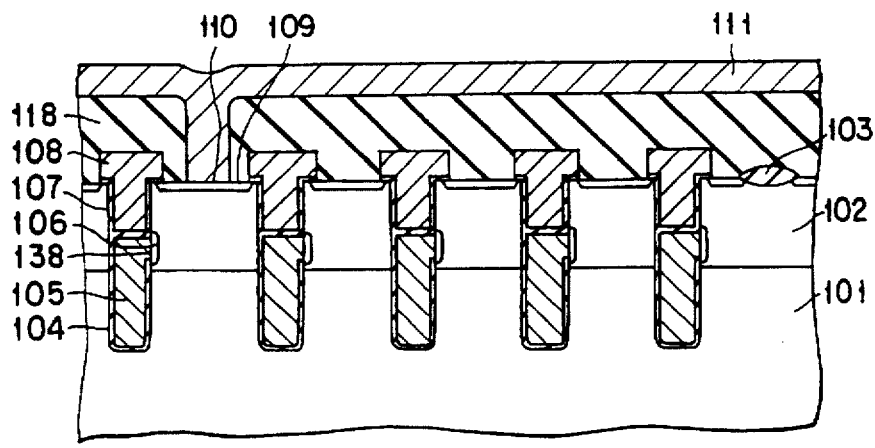
F I G. 53B

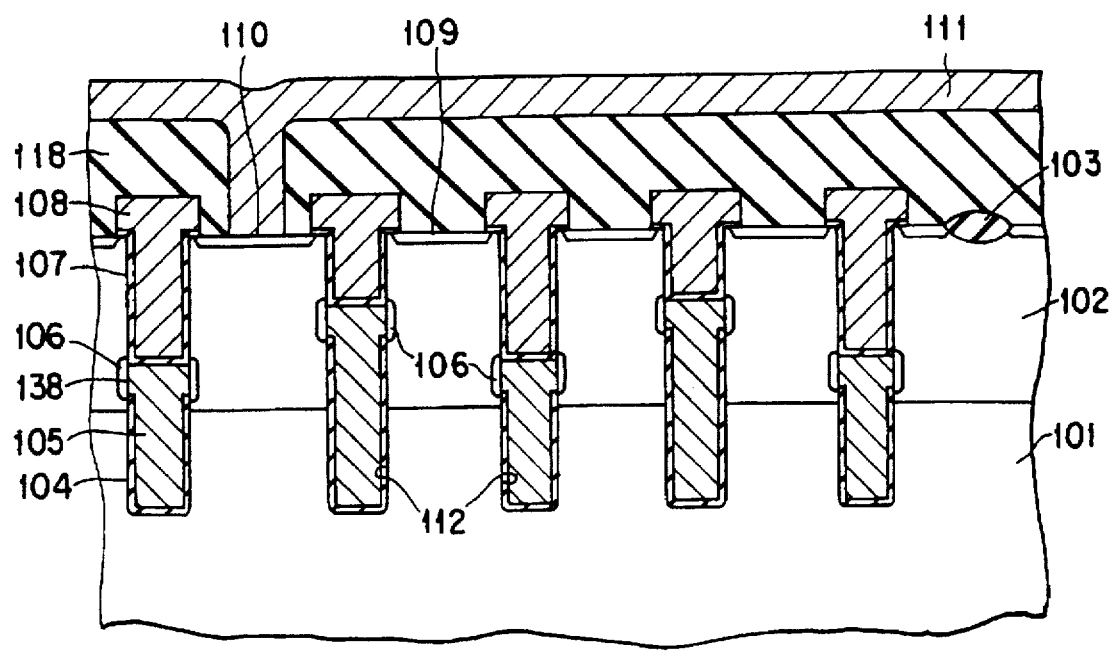
F I G. 59
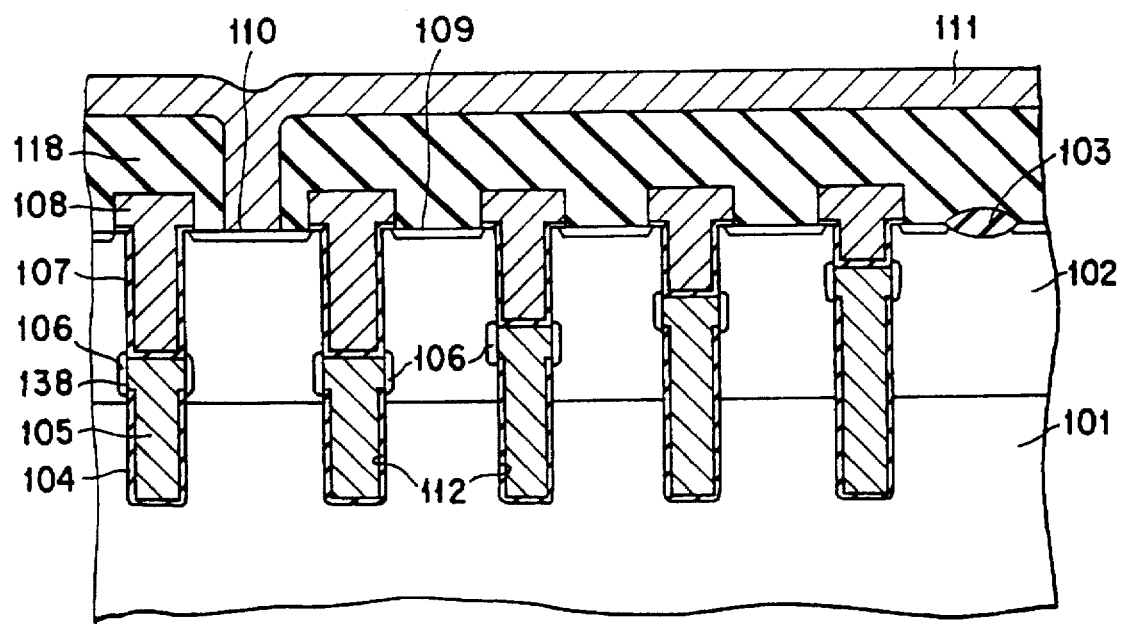
F I G. 60

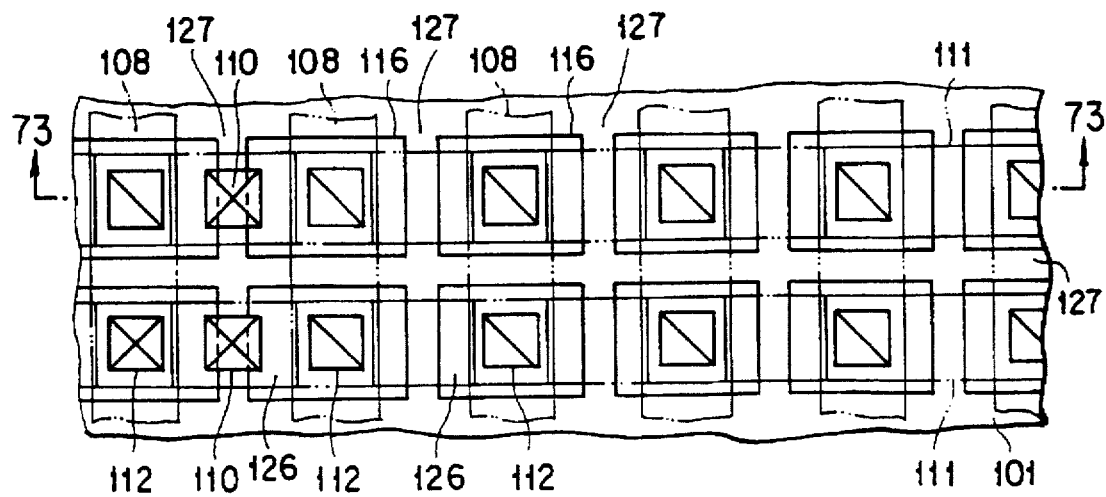
F I G. 72
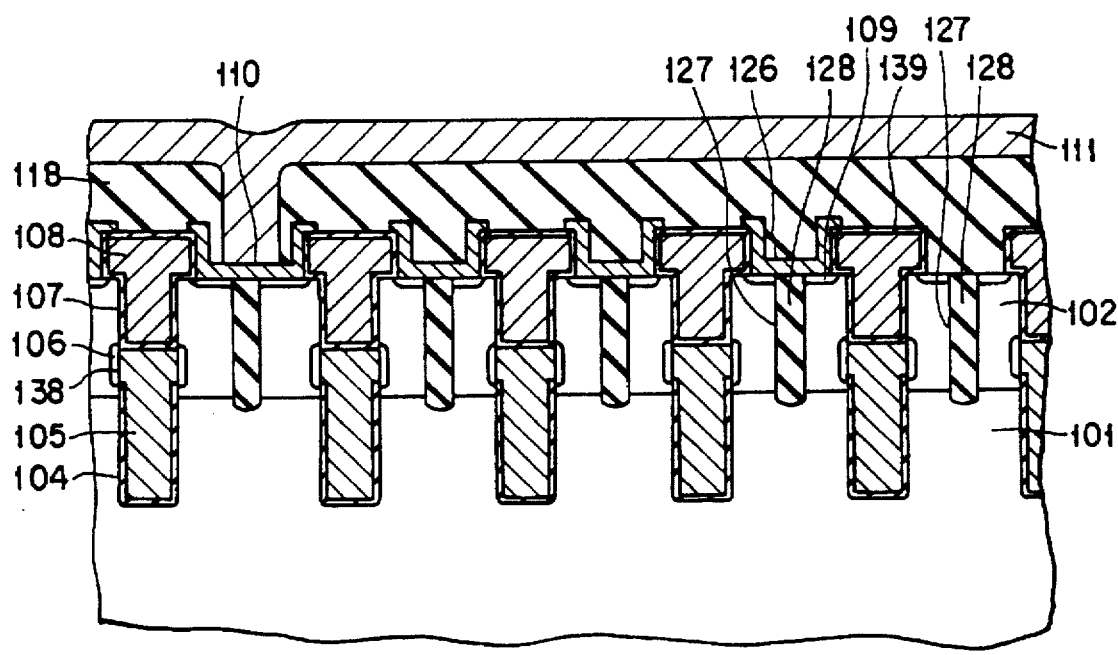
F I G. 73

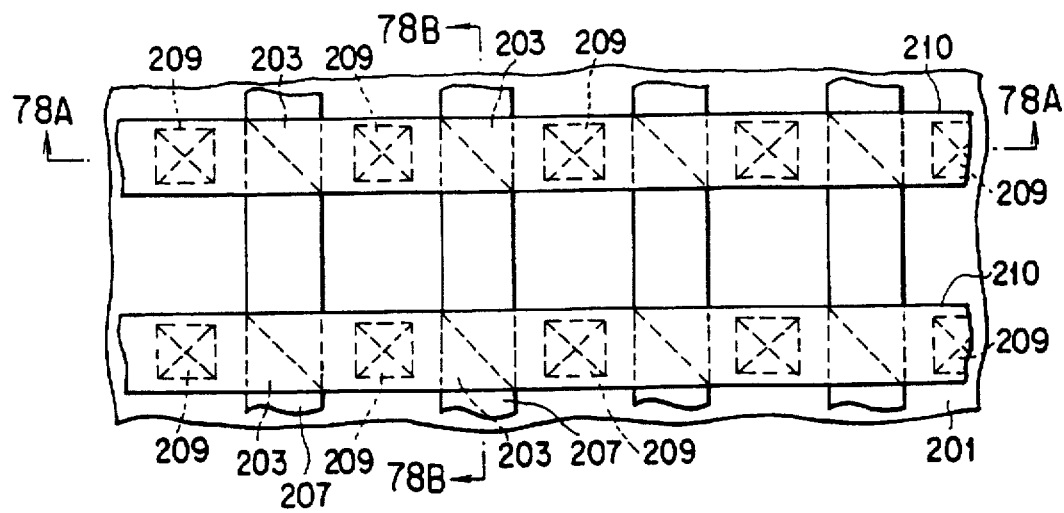
F I G. 77
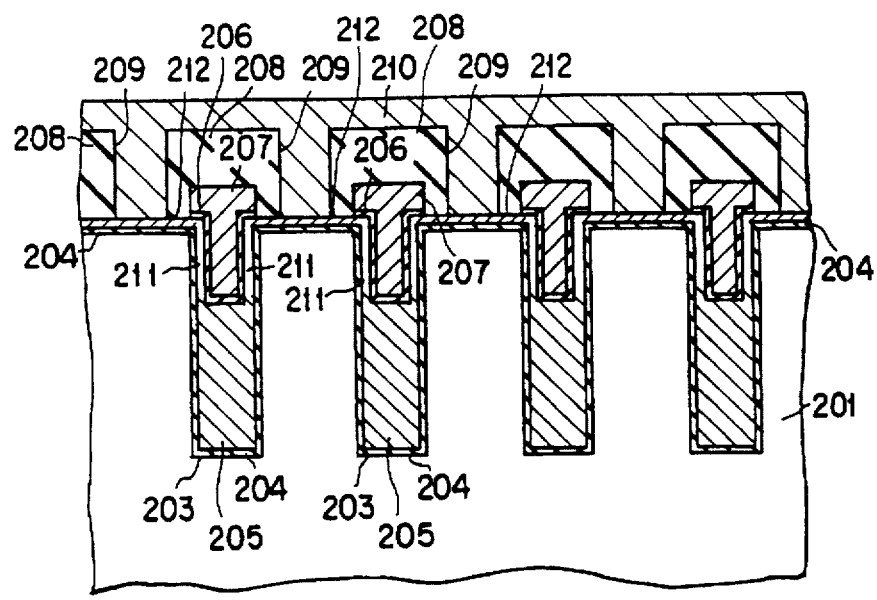
F I G. 78A
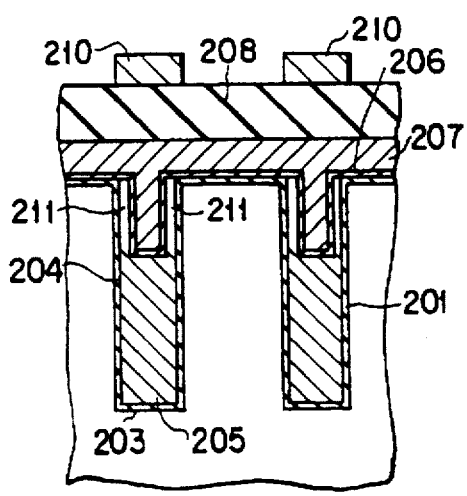
F I G. 78B

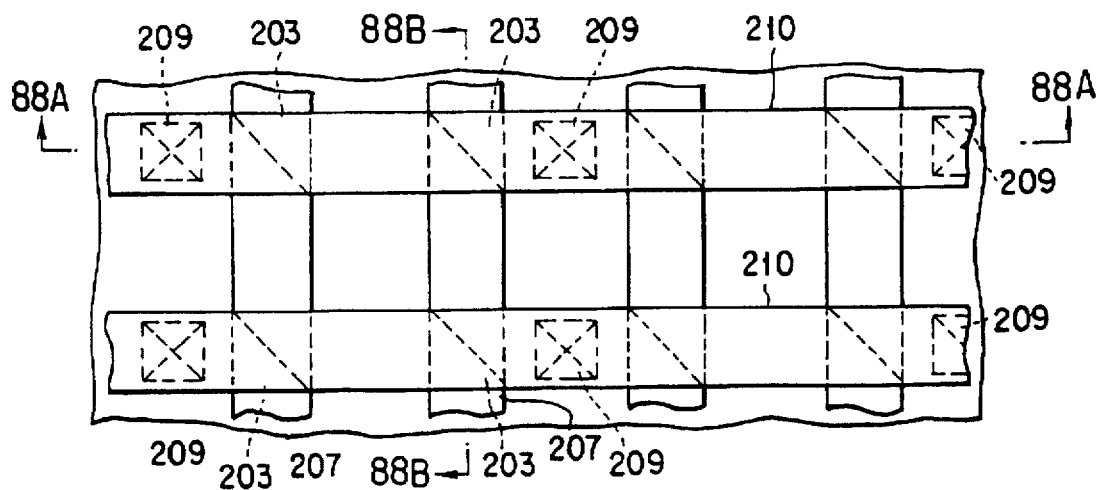
F I G. 87
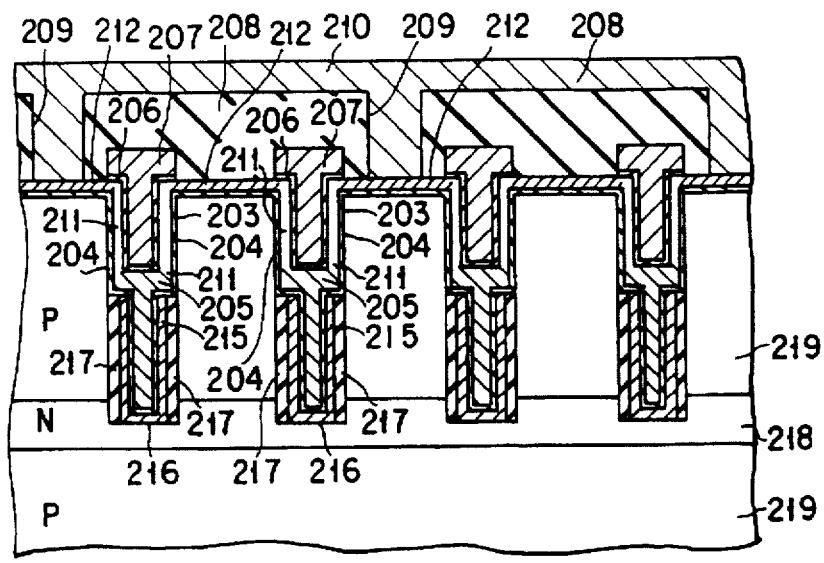
F I G. 88A
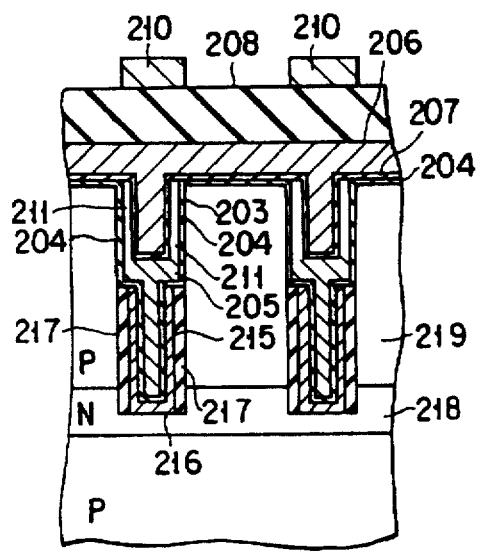
F I G. 88B

MOS RANDOM ACCESS MEMORY HAVING ARRAY OF TRENCH TYPE ONE-CAPACITOR/ONE-TRANSISTOR MEMORY CELLS

This application is a Continuation of application Ser. No. 08/524,970, filed on Sep. 8, 1995, now abandoned which is a division of application Ser. No. 08/418,877 filed Apr. 7, 1995 which issued as U.S. Pat. No. 5,477,071 which is a continuation of application Ser. No. 08/036,534 filed on Mar. 19, 1993, now abandoned.

BACKGROUND OF THE INVENTION

1. Field of the Invention

The present invention generally relates to semiconductor integrated circuit devices and, more particularly, to highly integrated MOS random-access memory devices having an array of rows and columns of memory cells each having a data storage capacitive element and a transfer-gate MOS transistor.

2. Description of the Related Art

With the increasing needs for high performance and reliability of digital computer systems, MOS random-access memory (RAM) devices are becoming more widely used in the manufacture of digital equipment as the speed and cost advantages of these devices increase. As the number of bits increases, the cell size decreases, the magnitude of the storage capacitor in each cell decreases to reduce the amount of charge carriers that can be stored in each cell. Such reduction in storage carrier amount may lead to the occurrence of an erroneous data accessing operation, causing the reliability to decrease. There is a trade-off between the higher packing density and reliability, making the cell size smaller can improve the integration density, but making it too small can also degrade the reliability.

A "trench" type dynamic RAM (DRAM) has been proposed to break through the trade-off problem. The basic structure of such trench-type DRAM is shown, for example, in IEDM Tech. Dig., "A Trench Transistor Cross-Point DRAM Cell," by W. F. Richardson et al., 1985 at pp. 714–717. A groove called the "trench" is formed in a semiconductive substrate at each of the cross points between the word lines and the bit lines being transverse to each other on the substrate. A capacitor and a MOS transistor are stacked in the trench. With such a trench cell structure, the data storage capacity may be increased in each cell while attaining an increased packing density.

However, the conventional trench-type DRAM cannot follow the recent high-integration requirement that is becoming more and more strict in the industry of semiconductor devices. As the packing density further increases, the distance between adjacent ones of the cell trenches decreases, causing the probability of occurrence of an undesirable "punch-through" phenomenon to increase between the adjacent trench cells. This may degrade the reliability. More specifically, as typically shown in FIG. 6 of the IEDM reference, each trench is provided with an impurity-doped semiconductive layer acting as an active region of a corresponding MOS transistor. The impurity-doped layer is opposite in conductivity type to the substrate, and is formed to surround the inner wall surface of the trench at a predetermined depth in the substrate. As the distance between adjacent trench cells decreases to increase the packing density, the impurity-doped layer of a certain trench cell becomes nearer in position to that of an adjacent trench. This may cause a leak current to flow more easily between adjacent trench cells due to the occurrence of a punch-through phenomenon, which will lead to a degradation in the reliability of the trench-cell type DRAM.

A specific type DRAM has also been proposed to improve the packing density, wherein a cell unit consists of a plurality of one-capacitor/one-transistor cells that are series-connected at a single contact node to a corresponding one of parallel bit lines on a semiconductive substrate. The cell unit having the series-connected cells is ordinarily called the "NAND cell" section. With such NAND-cell type DRAM, the contact nodes for coupling the cells to the bit lines can be reduced in number, causing the packing density to increase.

The NAND-cell type DRAM, however, suffers from the reduction in the data-storage capacity in each cell, as the cell capacitor decreases in area, the carrier storage amount decreases, with the result in the reliability being degraded. Such miniaturization of cell structure also leads to the difficulty in the manufacture of NAND-cell DRAMs at a desired production yield.

SUMMARY OF THE INVENTION

It is therefore an object of the present invention to provide a new and improved semiconductor random access memory device.

It is another object of the invention to provide a new and improved semiconductor random access memory device which can attain an increased packing density without degrading the reliability of it.

In accordance with the above objects, the present invention is drawn to a specific semiconductor memory device, which includes a substrate having a surface in which a plurality of trenches are formed, a plurality of parallel data transfer lines on the substrate, and an array of memory cells on the substrate. The memory cells are subdivided into a plurality of cell units which are coupled at a node to the data transfer lines, each of the cell units including a preselected number of memory cells each having a capacitive element and transistor. The capacitive element and the transistor of each of the memory cells are stacked in a corresponding one of the trenches in such a manner that the transistor overlies the capacitive element in the corresponding one of the trenches.

The invention is also drawn to a random access memory device which includes a substrate having a surface in which a groove pattern is formed to provide a plurality of rows and columns of island portions, and having a plurality of trenches formed in the island portions. An array of memory cells arranged in rows and columns at the island portions, the memory cells each including a capacitor and a metal oxide semiconductor (MOB) transistor which are stacked on each other in a corresponding trench. Parallel word lines are coupled to the rows of memory cells. Parallel bit lines are coupled to the columns of memory cells. Insulative layers are buried in the grooves for causing adjacent ones of the island portions to be electrically isolated from each other.

The foregoing and other objects, features, and advantages of the invention will become apparent from the following more particular description of preferred embodiments of the invention, as illustrated in the accompanying drawings.

BRIEF DESCRIPTION OF THE DRAWINGS

FIGS. 3A through 3I illustrate, in schematic cross-section, some of the major steps in the manufacturing process of the DRAM, of FIGS. 1 to 2B.

FIGS. 4, 6, 8, 10, 12, 14, 16, 18, 20, 22, and 24 are plan views of trench-type DRAMs in accordance with other embodiments of the invention; and FIGS. 5A–5B, 7A–7B, 9A–9B, 11A–11B, 13A–13B, 15A–15B, 17A–17B, 19A–19B, 21A–21B, 23A–23B, 25A–25B are diagrams showing cross-sectional views of the embodiments of the preceding figures.

FIGS. 29A to 29H illustrate, in schematic cross-section, some of the major steps in the manufacturing process of the DRAM of FIGS. 27 and 28.

FIGS. 30, 32, 34, 36, 38, 40 are plan views of trench-type DRAMs in accordance with other embodiments of the invention; and FIGS. 31, 33, 35, 37A–37B, 39A–39B, 41 are diagrams showing cross-sectional views of the embodiments of the preceding figures.

FIGS. 42 to 45 show the cross-sectional structures of NAND-cell type DRAM devices in accordance with further embodiments of the invention.

FIGS. 46, 48, 50, 52, 54 and 55 are plan views of trench-type DRAMs in accordance with further embodiments of the invention; and FIGS. 47A–47B, 49A–49B, 51, 53A–53B and 56 are diagrams showing cross-sectional views of the embodiments of the preceding figures.

FIGS. 59 and 60 illustrate the cross-sectional structures of NAND-cell type DRAM devices in accordance with further embodiments of the invention.

FIG. 72 is a plan view of a trench-type DRAM in accordance with an embodiment of the invention, and FIG. 73 shows the cross-sectional view of the DRAM of FIG. 72.

FIGS. 77, 79, 81, 83, 85, 87 and 89 are plan views of DRAM devices in accordance with further embodiments of the invention; and FIGS. 78A–78B, 80A–80B, 82A–82B, 84A–84B, 86A–86B, 88A–88B, 90A–90B are diagrams showing cross-sectional views of the embodiments of the preceding figures.

DESCRIPTION OF THE PREFERRED EMBODIMENTS

Figure 1:
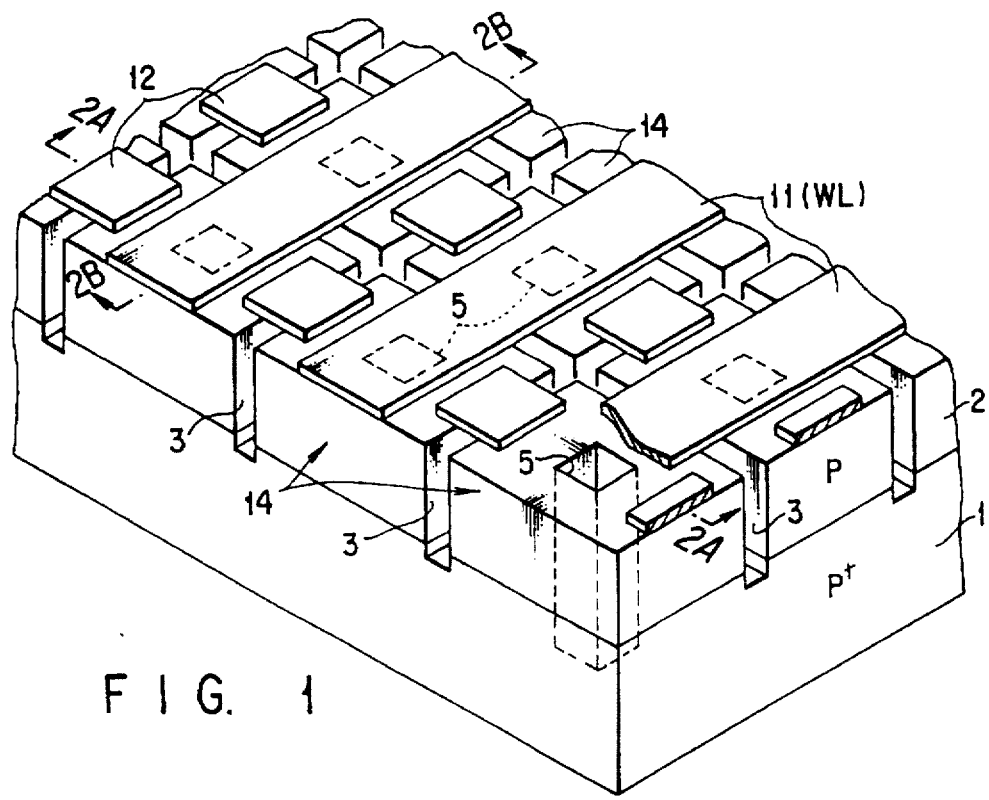
FIG. 1 illustrates a perspective view of the main section of a trench-type semiconductor dynamic random-access memory (DRAM) device in accordance with one preferred embodiment of the present invention.

A trench type semiconductor dynamic random-access memory (DRAM) device in accordance with one preferred embodiment of the invention is perspectively illustrated in FIG. 1, wherein insulative layers are omitted for purposes of illustration only. A semiconductive substrate 1 is made from a heavily-doped P (P+) type silicon. The P+ type substrate 1 has a top surface in which a P type epitaxial layer 2 is arranged. A plurality of grooves 3 are formed in substrate 1 in such a manner that first parallel grooves extend in a first direction and second parallel grooves extend in a second direction transverse to the first direction, thereby to define a plurality of rectangular-shaped P type "island" portions 14, which are arranged in rows and columns on substrate 1.

Figure 2A:
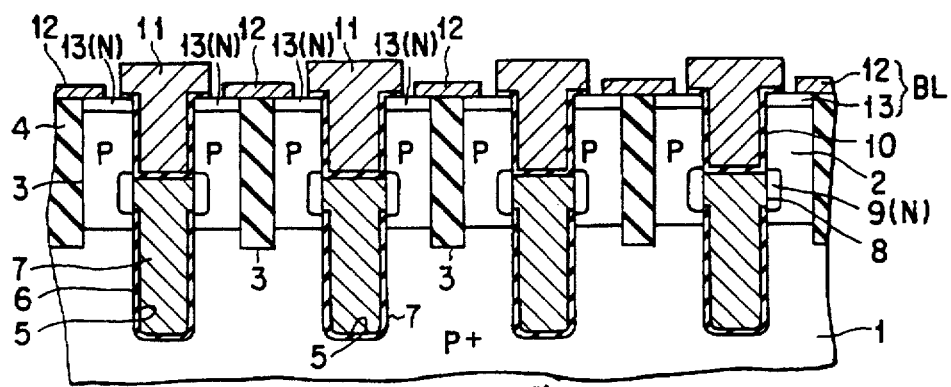
FIGS. 2A and 2B are cross-sectional views of the DRAM of FIG. 1 along lines 2A—2A and 2B—2B, respectively.
Figure 2B:
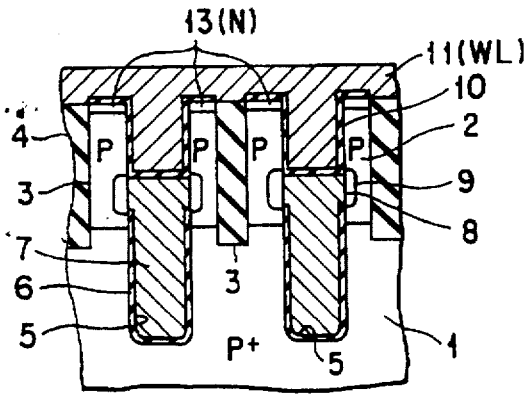

The cell-region separation grooves 3 are deep enough to cause their bottom portions to be positioned beneath the epitaxial layer 2 and within the substrate 1. Grooves 3 are buried with an insulative material 4 as shown in FIGS. 2A and 2B, so that the islands 14 are electrically separated from one another. Each of islands 14 serves as a cell region of the DRAM.

As shown in FIG. 1, a plurality of well-like grooves (trenches) 5 are formed at the central portions of the cell islands 14, respectively. These trenches 5 are greater in depth than the cell separating grooves 3 as apparent from FIGS. 2A and 2B. Each trench 5 is used to form therein a capacitor and a transfer-gate MOS transistor in such a manner that the capacitor and the MOS transistor are stacked on each other in the trench 5. Trench 5 will be referred to as the "capacitor/transistor forming trench" or "cell trench" hereinafter.

In each cell trench 5, the capacitor is formed at the lower half portion of trench 5, whereas the MOS transistor is arranged at the upper half portion of it. More specifically, as shown in FIGS. 2A and 2B, a thin insulative layer (thin film) 6 is formed on the inner wall surface of each trench 5 to cover its substantially the lower half portion. A conductive layer 7 is arranged in trench 5 to bury insulative thin film 6 thereunder. Conductive layer 7 insulatively faces the P+ type substrate 1 with insulative thin film 6 being sandwiched therebetween, thus providing a capacitor structure. With such an arrangement, P+ substrate 1 acts as a common capacitor-plate electrode for the trench cells. Conductive layer 7 serves as a carrier-storage electrode. Insulative thin film 6 functions as a capacitor insulation layer.

As shown in FIG. 2A or 2B, the storage layer 7 is greater in height than insulative thin-film 6 in trench 5, so that layer 7 has a vertical side wall portion which is in direct contact with an N type semiconductor region 9 being formed at a corresponding portion of the P type epitaxial layer 2. In other words, capacitor insulation layer 6 defines, at its top edge portion within trench 5, a side-wall contact region 8 through which storage layer 7 is contacted with N type layer 9, which may be a square-ring shaped layer for horizontally surrounding the side-wall contact region 8 of trench 5 at a predetermined depth in epitaxial layer 2. The remaining inner wall (upper portion) of trench 5 is covered with another insulative thin film 10, which also covers the top surface of storage electrode 7. A conductive layer 11 is buried in trench 5 to have a "T"-shaped profile; the cross-bar portion of the "T" is coupled with those of adjacent cell islands 14 on the top surface of epitaxial layer 2 as is illustrated in FIG. 1 or FIG. 2B. A shallow N type layer 13 is formed in the top surface of P type epitaxial layer 2 in each cell island 14. The T-shaped layer 11 is insulated by insulative film 10 from P type epitaxial layer 2 and the underlying storage electrode 7 in trench 5. A transistor is thus formed with the insulated T-shaped layer 11 being as the gate electrode of a transistor in a corresponding cell trench 5, and with the N-type layers 9, 13 being as its active regions (source and drain). The commonly coupled cross-bar portions of the T-shaped insulated gate electrodes 11 provide a plurality of parallel word lines WL above epitaxial layer 22 as clearly shown in FIG. 1.

The shallow N type layers 13, which are formed at the top surface portions of the rows and columns of cell islands 14 on substrate 1, are coupled to one another by a plurality of square thin conductive layers 12 each of which is arranged to "bridge" a corresponding insulated cell-separator groove 3 between adjacent ones of islands 14 in a direction perpendicular to the word lines WL (11). Layers 12 may be made from N type polycrystalline semiconductor material. Those N type layers 13 and conductive layers 12 arrayed perpendicularly to word lines WL provide parallel bit lines BL being transverse to word lines WL.

Figure 3A:
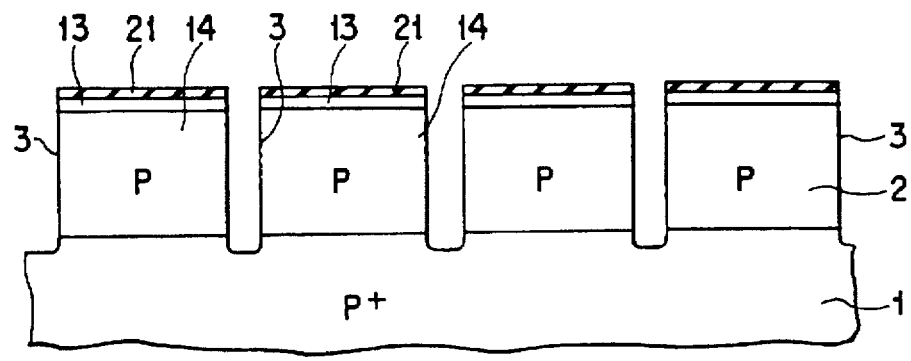

The trench type DRAM shown in FIGS. 1 to 2B is manufactured as follows. In FIG. 3A, there is shown a P+ type silicon substrate 1 doped with a p-type impurity such as B (boron) to a concentration of $10^{19}$ atoms per cubic centimeter. A P type epitaxial layer 2, typically 2 micrometers thick, is formed in the surface region of substrate 1 such that layer 2 is doped with a p-type impurity such as B to a concentration of $10^{15}$ atoms per cubic centimeter. The impurity of boron is doped by using a known ion implantation technique into a plurality of cell array regions of the substrate structure, and the well diffusion process is performed to optimize the impurity concentration of epitaxial layer 2 in the cell regions. An n-type impurity such as As (arsenic) is then doped by the ion implantation into the top surfaces of each cell region to form an N type diffusion layer 13 therein. A silicon oxide film 21 is then deposited on the resultant structure as a mask layer to be used during a subsequent etching process. The film 21 is patterned to have an opening for defining the planar shape of cell separator groove 3 of FIG. 1. The lithography and reactive ion etching (RIE) techniques may be employed to form the cell separation grooves 3 which define a plurality of rows and columns of memory-cell islands 14 in the substrate structure. The depth of grooves 3 is greater than the thickness of P type epitaxial layer 2; it may be 2.5 micrometers, for example. A resulting structure is shown in FIG. 3A in cross-section.

Figure 3B:
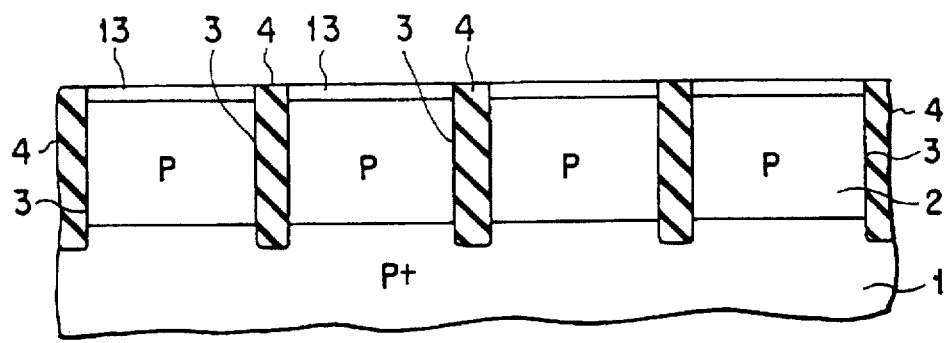
Figure 3C:
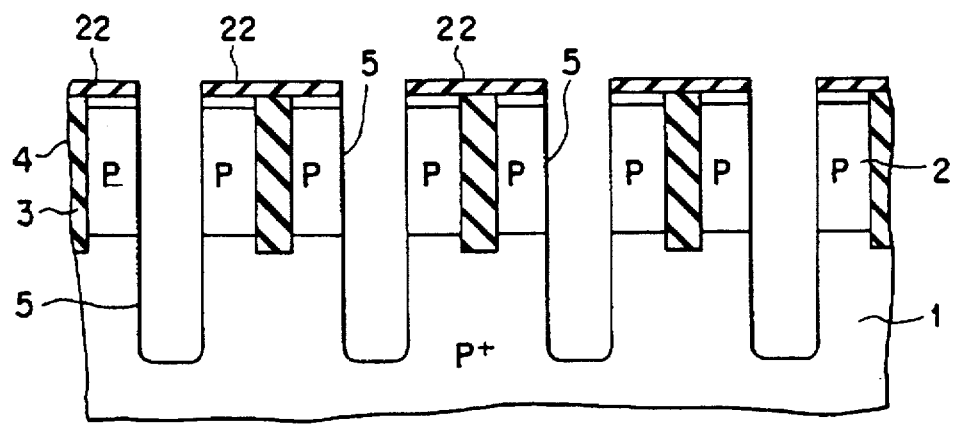

Subsequently, as shown in FIG. 3B, after a silicon oxide film 4 is deposited by the CVD method on the entire top surface of the structure of FIG. 3A, the RIE ion-etching process is carried out to remove (etch back) the exposed portion of film 4 on the structure, while allowing the buried portions of oxide film 4 to remain in respective grooves 3. Resultant silicon oxide film portions are flush at their top surface with the top surface of substrate 1. Insulated cell-separating grooves 3 are formed. Then, as shown in FIG. 3C, a silicon oxide film 22 is deposited on the structure of FIG. 3B as an etching mask layer having a plurality of openings for defining cell trenches 5 in islands 14. The lithography and RIE techniques are used to form trenches 5 to a predetermined depth, for example, 5 micrometers. Trenches 5 are greater in depth than cell separation grooves 3 as is apparent from FIG. 3C.

Then, as shown in FIG. 3D, after a capacitor insulation film 6 is formed on the inner wall of each of the trenches 5, a first polycrystalline silicon layer 7a, which will be the capacitor electrode in each cell trench 5, is deposited on the entire top surface of the structure of FIG. 3C. The effective thickness of layer 6 is 10 nanometers (nm), for example. The capacitor insulation layer 6 may be a multi-layered structure that is made of the lamination of silicon oxide film, a silicon nitride film and a silicon oxide film. An n-type impurity such as As is doped by the ion implantation technique into polycrystalline silicon layer 7a causing its resistivity to decrease.

Then, as shown in FIG. 3E, a known chemical dry etching (CDE) technique is used to etch the first polycrystalline silicon layer 7a so that the upper portion of layer 7a, which may be 1.5 micrometers thick, is removed so that a lower portion of layer 7a remains in respective one of trenches 5 as a part of the carrier-storage electrode (7 of FIG. 2A) of a corresponding cell capacitor. Thereafter, exposed portions of the capacitor insulation film 6 are removed by a known etching technique.

Subsequently, as shown in FIG. 3F, a second polycrystalline silicon layer 7b is deposited on the entire top surface of the resultant structure. An n-type impurity such as As is doped by well-known ion implantation in second polycrystalline silicon layer 7b, which is then subjected to a RIE process. During this RIE process, layer 7b is partly etched so that the exposed upper portion of layer 7b is removed, causing a lower portion to remain stacked on the underlying layer in each trench 5 in such a manner that its top surface is located at depth of 1.2 micrometers from that of the epitaxial layer 2 as shown in FIG. 3G. Such remaining portion of second polycrystalline silicon layer 7B and the underlying layer portion 7a constitute the carrier storage electrode 7 in each trench 5. The resulting structure is then annealed at 900° C. for 30 minutes, whereby As is outdiffused from the buried polycrystalline silicon layer 7b into the side wall of trench 5 so that an N type diffusion layer 9 is formed around trench 5 in epitaxial layer 2. With such impurity diffusion process, the buried carrier storage electrode 7 in trench 5 is directly contacted with N type diffusion layer 9 at the selected area of its side wall.

Then, as shown in FIG. 3H, after a gate insulation film 10 is formed to cover the upper wall portion of each trench 5 in which the carrier storage electrode 7 is buried, a third polycrystalline silicon layer is deposited on the entire surface of the resulting structure. The third polycrystalline silicon layer is then subjected to the POCl$_3$ diffusion process, whereby the resistivity of it is decreased. Thereafter, the resistivity-decreased polycrystalline silicon layer is chemically treated using the lithography and RIE techniques, so that an insulated gate electrode 11 is formed in the upper portion of each trench 5. Another polycrystalline silicon layer is then deposited on the entire top surface of the resultant structure. After a chosen impurity is doped in the polycrystalline silicon layer, this layer is patterned using the lithography and RIE techniques to form a plurality of patterned polycrystalline silicon layers 12, each of which causes the N type diffusion layers 13 of adjacent ones of the memory-cell islands 14 to be connected to each other.

As is apparent from the above description, with the present embodiment, a highly-integrated DRAM having an increased number of trench memory cells each of which is effectively insulated from neighboring cells by cell separating grooves 3 can be manufactured using the presently available manufacturing techniques for a higher production yield.

Figure 4:
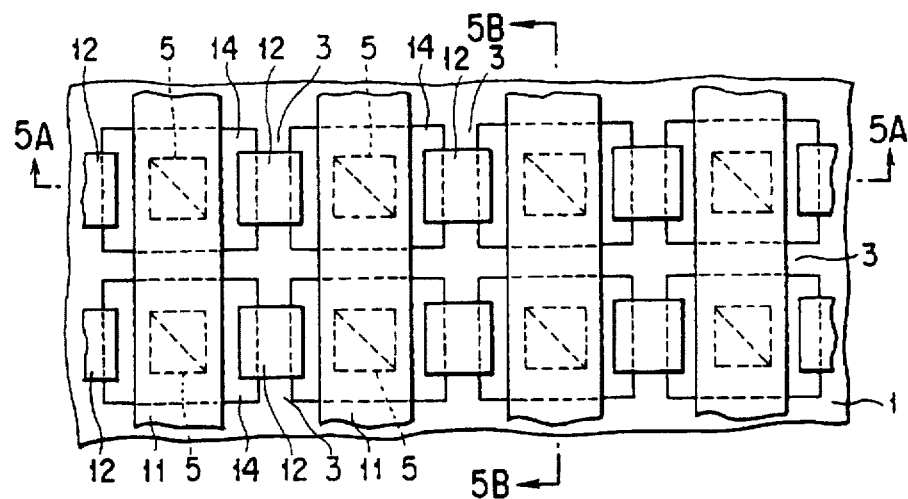
Figure 5A:
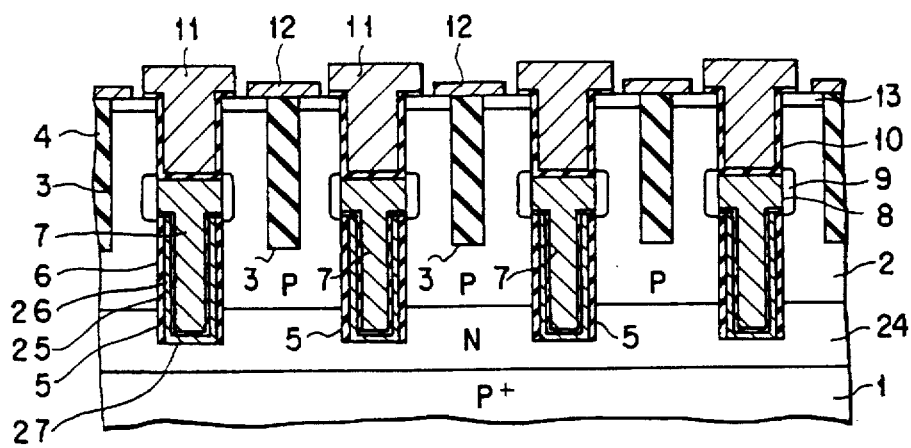
Figure 5B:
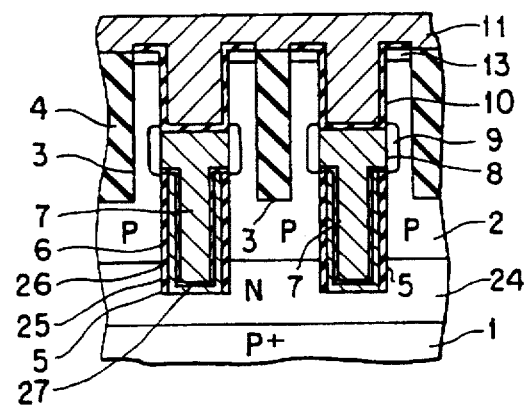

A trench type DRAM shown in FIGS. 4 and 5A–5B employs a semiconductor wafer structure wherein an N type buried layer 24 is formed in the P+ type substrate 1 so that it is located between substrate 1 and the underlying P type epitaxial layer 2. Memory-cell trenches 5 are formed in the substrate structure so that the depth of each trench 5 is so controlled as to cause its bottom portion to be terminated within N type buried layer 24. A plate electrode 26 made of N type semiconductor material such as polycrystalline silicon is formed in the bottom portion of each trench 5 with an insulative thin film 25 being disposed between plate electrode 26 and the inner vertical wall of trench 5. Plate electrode 26 has a "U"-shaped cross-section, and is coupled to N type buried layer 24 at the bottom surface of trench 5. The U-shaped N type polycrystalline silicon plate electrode 26 is covered at its inner surface with a capacitor insulation film 6, on which a carrier storage electrode 7 is insulatively buried so that this electrode is insulated by capacitor insulation film 6 from plate electrode 26 in each trench 5. Since plate electrode 26 is in contact with N type buried layer 24 at the trench bottom surface, layer 24 may serve as a plate-electrode wiring line. The structure of the remaining portions of this embodiment is similar to that of the DRAM shown in FIGS. 1 and 2A-2B.

The significant feature of the DRAM of FIGS. 4 and 5A-5B is that it becomes possible to potentially control the U-shaped plate electrode 26 independently of the epitaxial layer 2 such that the potential of electrode 26 is set at a desired level while epitaxial layer 2 is at another potential level. In other words, the substrate bias voltage of a MOS transistor can be freely set at a desired level independently of the voltage being applied to the plate electrode, which may lead to the achievement of an enhanced cut-off characteristic of the MOS transistor and an improved reliability of the memory-cell capacitor.

Figure 6:
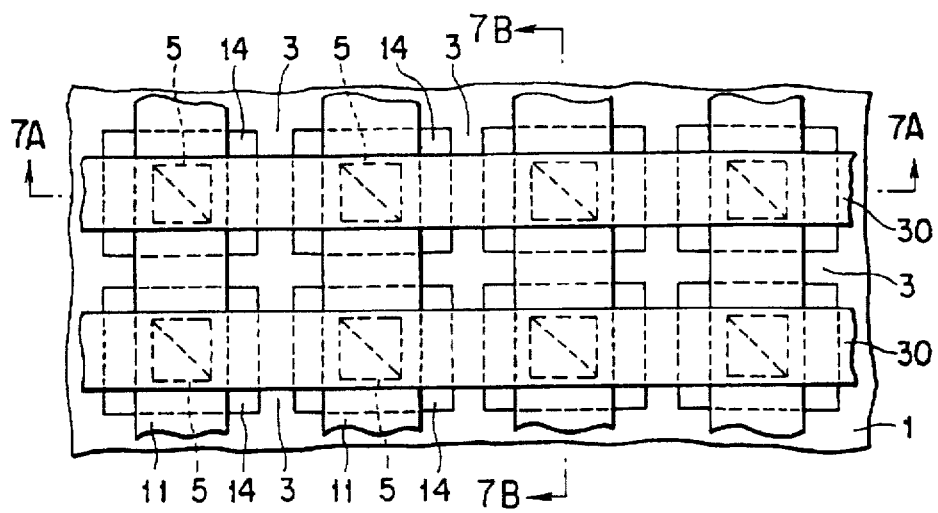
Figure 7A:
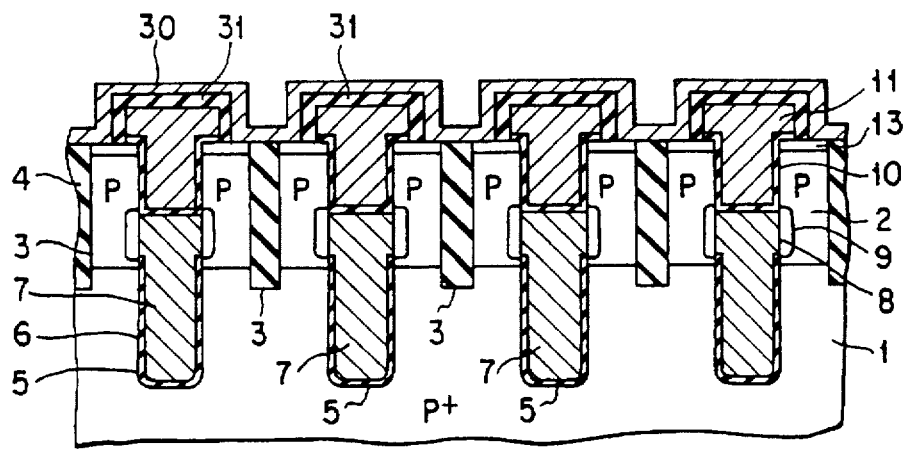
Figure 7B:
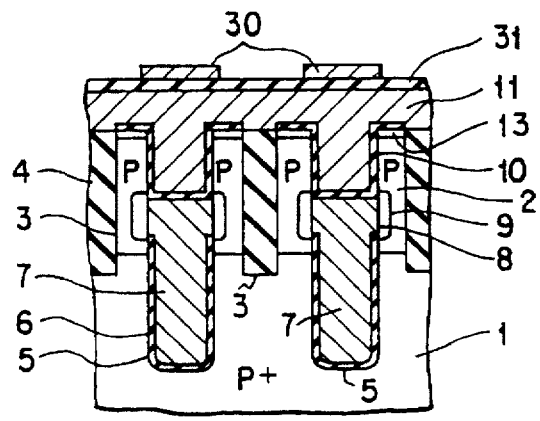

A trench type DRAM shown in FIGS. 6 and 7A-7B is a slightly modified device of the embodiment of FIGS. 1 and 2, wherein a plurality of N type polycrystalline silicon layers, each of which corresponds to an array of the N type polycrystalline silicon layer 12 acting as a bit-line wiring layer, are insulative disposed above the gate electrode layers 11 (word lines WL) to intersect them. Gate electrodes 11 and polycrystalline silicon layers 30 are electrically separated by a silicon oxide film 31 being sandwiched therebetween. Each N type polycrystalline silicon layer 30 causes the N type diffusion layers on the top surface of cell islands 14 to be connected to one another, and therefore serves as a bit line BL. With such an arrangement, the fabrication of such N type polycrystalline silicon layers 30 is performed along a single direction transverse to the extending direction of gate electrodes 11; therefore, it is possible to make the cell area much smaller than the device of FIGS. 1 and 2.

Figure 8:
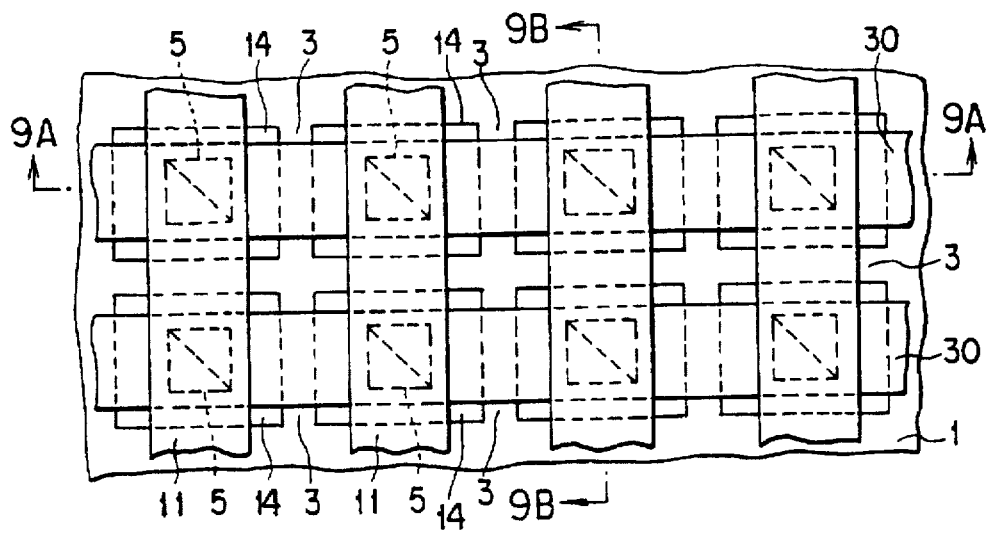
Figure 9A:
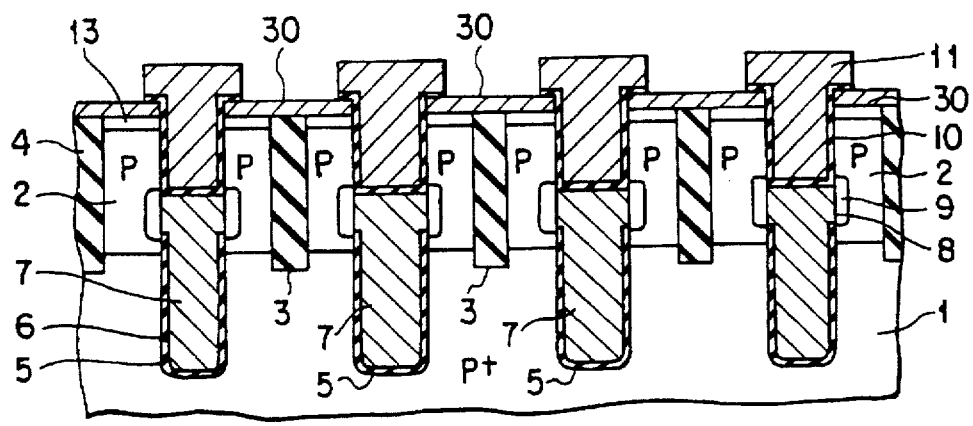
Figure 9B:
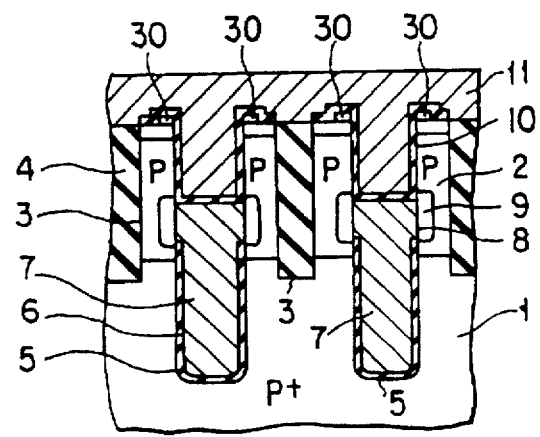

A trench type DRAM shown in FIGS. 8 and 9A-9B is similar to that of FIGS. 6 and 7 with the N type polycrystalline silicon layers 30 being formed on the top surface of islands 14 so that these layers 30 extend under the gate electrodes 11. As in the device of FIGS. 6 and 7, each of N type polycrystalline silicon layers 30 connects a corresponding array of the N type diffusion layers 13 with one another, thereby to constitute a bit line BL.

Figure 10:
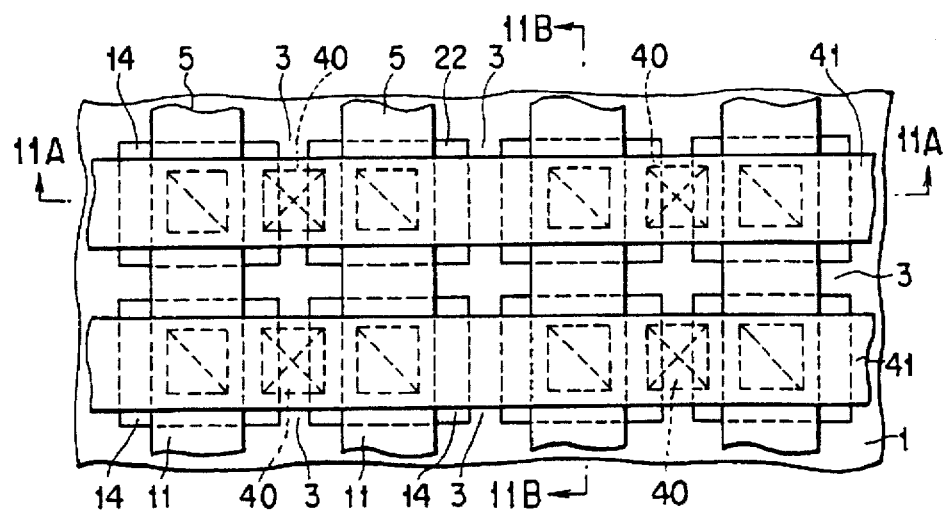
Figure 11A:
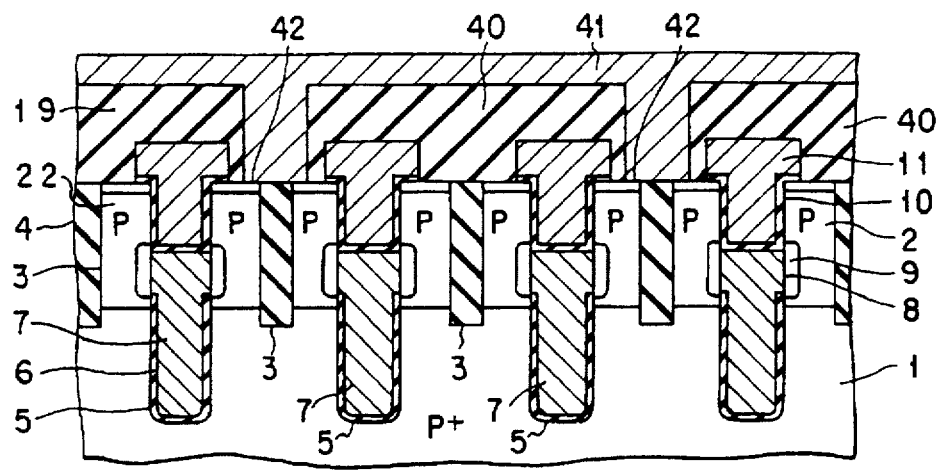
Figure 11B:
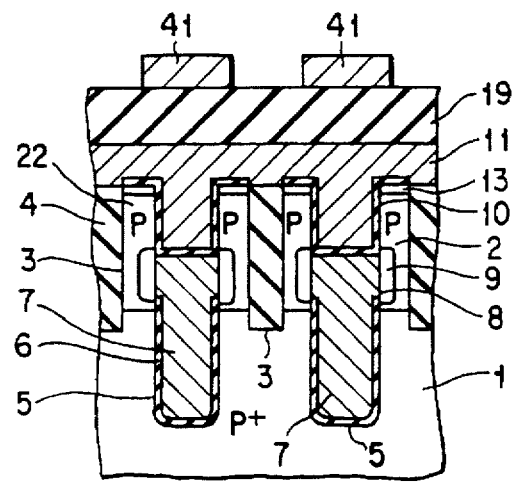

A trench type DRAM shown in FIGS. 10 and 11A-11B is similar to that of FIGS. 8 and 9 with an insulative layer 40 being additionally formed as an interlayer insulating layer to cover the gate electrodes 11, and with a plurality of parallel elongate bit lines 41 being arranged on insulative layer 40. Bit lines 41 are electrically contacted with the N type diffusion layers 13 of cell islands 14 through a plurality of bit-line contact sections 42, which are alternately located on the cell-separator grooves 3 along the direction of bit lines 41, as is shown in FIG. 10. Each contact section 42 is so formed as to be located between neighboring gate electrodes 11 (word lines WL) and to bridge a corresponding insulated cell-separator groove 3 between adjacent ones of cell islands 14, thus causing N type diffusion layers 13 thereof to be electrically coupled to each other. With such an arrangement, the capacitance between bit lines 41 and gate electrodes 11 can be made smaller to attain a high-speed operation with a reduced noise.

Figure 12:
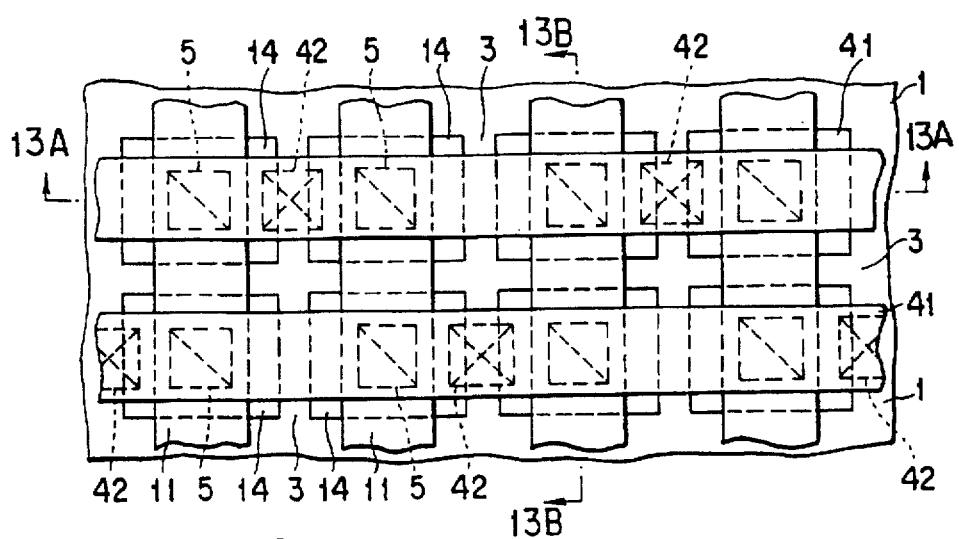
Figure 13A:
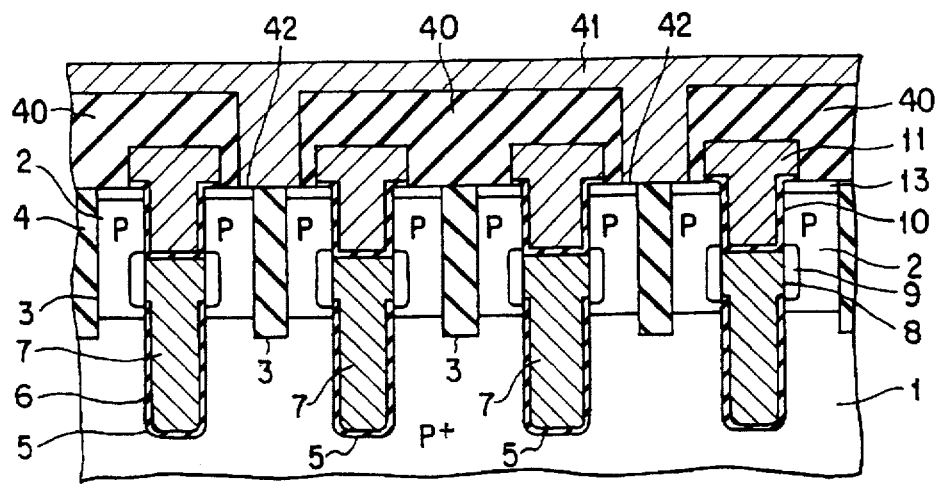

A trench type DRAM shown in FIGS. 12 and 13A-3B is similar to that of FIGS. 10-11 with the bit-line contact sections 42 being specifically located between gate electrodes 11 in such a manner that the alternate positioning of contact sections 42 is shifted between every two neighboring bit lines 41 to provide a planar zig-zag positioning pattern as shown in FIG. 12. With such an arrangement, it becomes possible to increase the margin of bit lines 41 with respect to bit-line contact sections, thereby to decrease the wiring resistance of bit lines.

Figure 14:
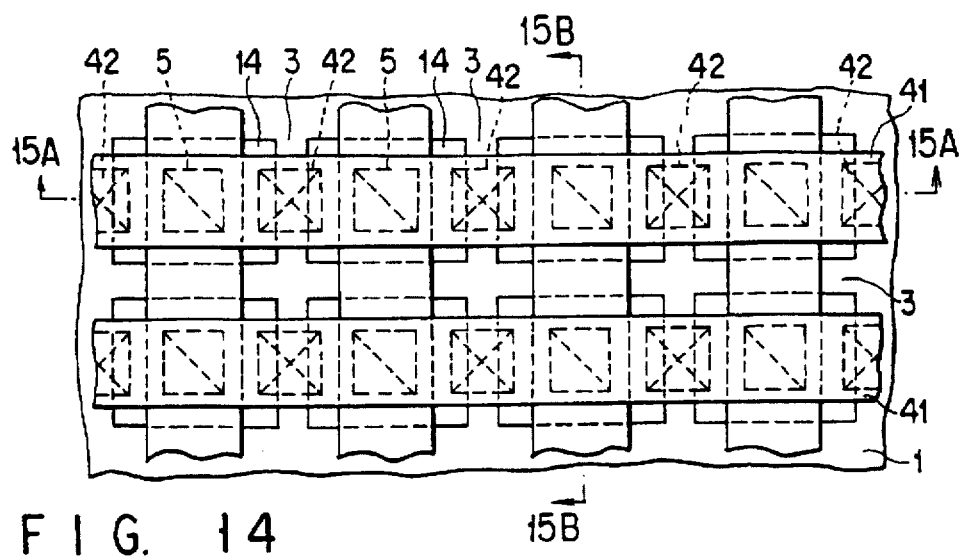
Figure 15A:
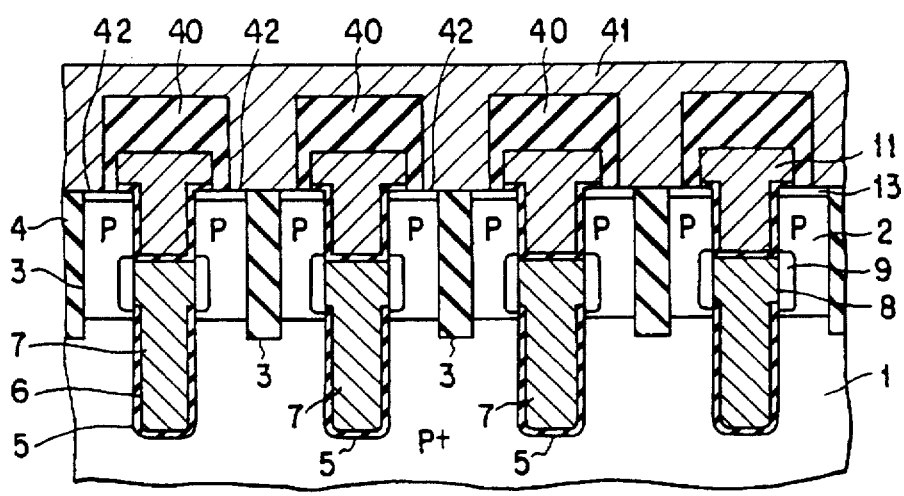

A trench type DRAM shown in FIGS. 14 and 15A-5B is similar to that of FIGS. 10-11 with the bit-line contact sections 42 being increased in number so as to be arranged on respective insulated cell-separating grooves 3 between gate electrodes 11. With such an arrangement, the bit-line contact resistance can be decreased to improve the operation speed.

Figure 13B:
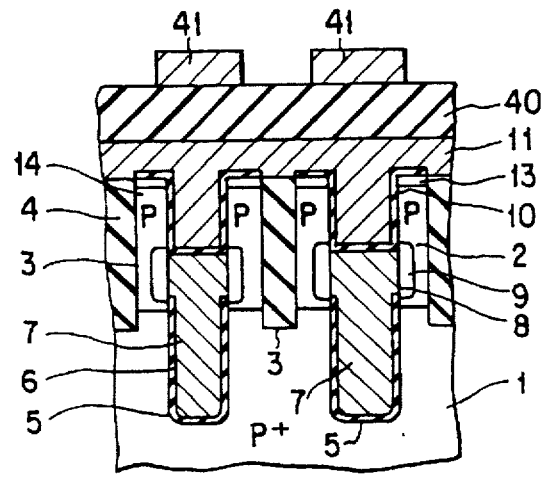
Figure 16:
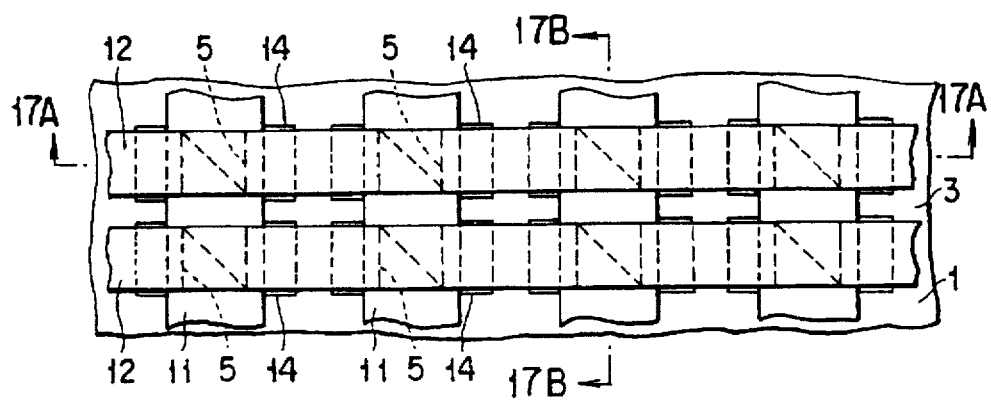
Figure 17A:
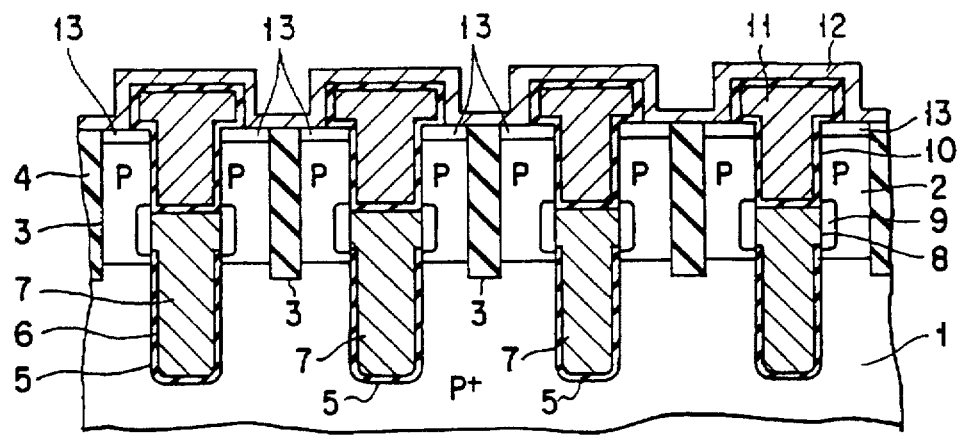
Figure 17B:
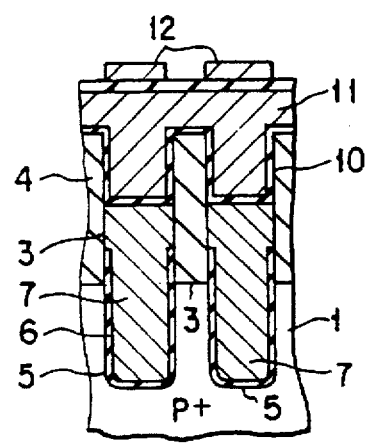

A trench type DRAM shown in FIGS. 16 and 17A-17B employs the structure of the embodiment of FIGS. 12-13 as its basic structure, wherein the side walls of memory-cell trenches 5 are aligned with those of insulated cell-separating grooves 3 extending along the word-line direction as typically shown in FIG. 16. Note in FIG. 16 that the narrowed islands 14 are so illustrated as to be slightly wider than the overlying bit line 12 for purposes of illustration only, and that, actually, the long-side edge lines of narrowed islands 14 are just aligned with the edge lines of bit line 12 as shown in FIG. 7B. No capacitor and MOS transistor are formed at the side-wall portions of trenches 5 arrayed in the word-line direction. This results in that a cell structure consisting of a capacitor and a MOS transistor around each trench 5 is divided into two parts, each of which includes a MOS transistor structure arranged at one side-wall of the trench 5. With such an arrangement, the memory cell structure can be further decreased in size in the word-line direction to further improve the packing density of DRAM. Furthermore, the gate capacitance of the MOS transistor can be further decreased in each memory cell to achieve an enhanced high-speed access operation.

Figure 15B:
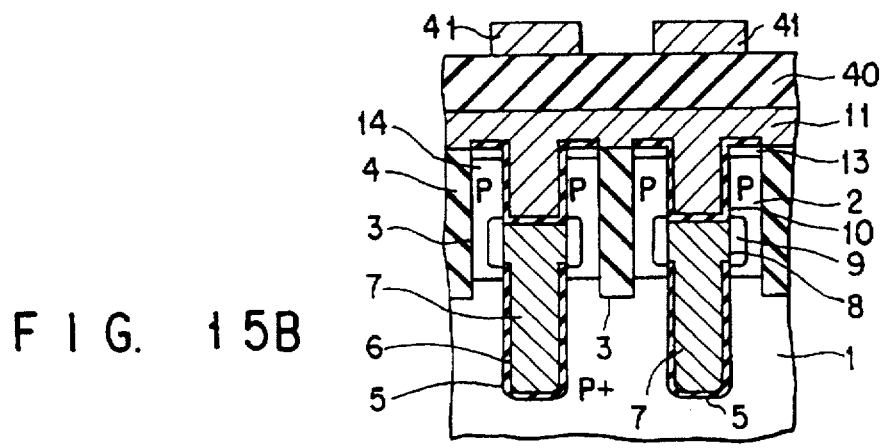
Figure 18:
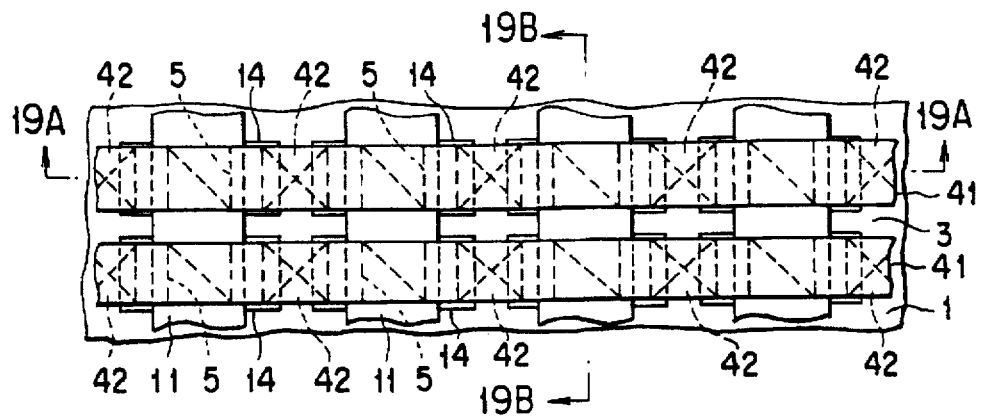
Figure 19A:
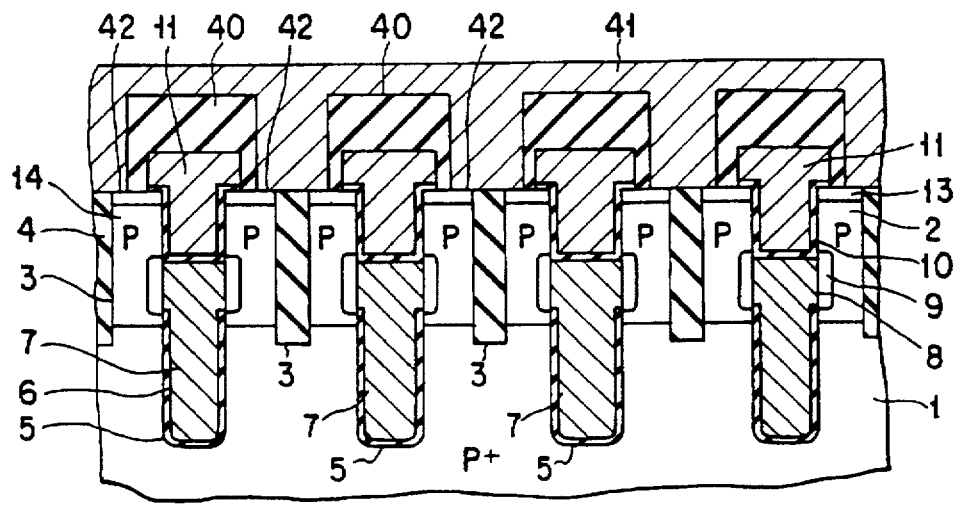
Figure 19B:
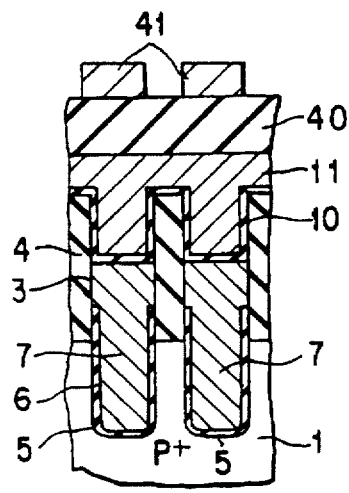

A trench type DRAM shown in FIGS. 18 and 19A-19B is an embodiment that is the combination of the structures of the device shown in FIGS. 16-17 and the device of FIGS. 14-15. In other words, the DRAM of FIGS. 18 and 19 employs the "highly packed" narrowed cell islands 14 of FIGS. 16-17 and yet uses the bit-line structure shown in FIGS. 14-15. With such a combined memory-cell structure, the cell area and the gate capacitance can be decreased while having the bit-line contact resistance decreased.

A trench type DRAM shown in FIGS. 20 and 21A-21B is similar to that of FIGS. 10-11 with the bit-line contact sections 42 being decreased in number.

Figure 22:
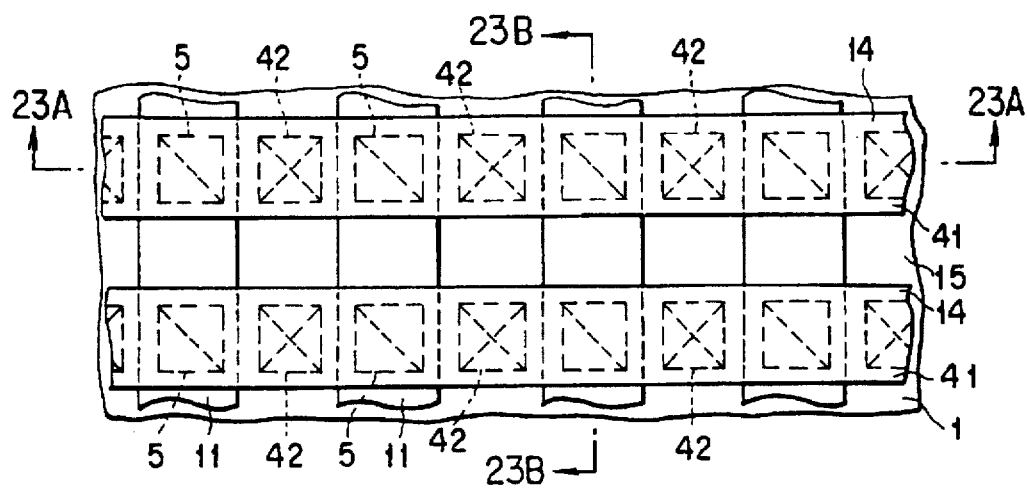
Figure 23A:
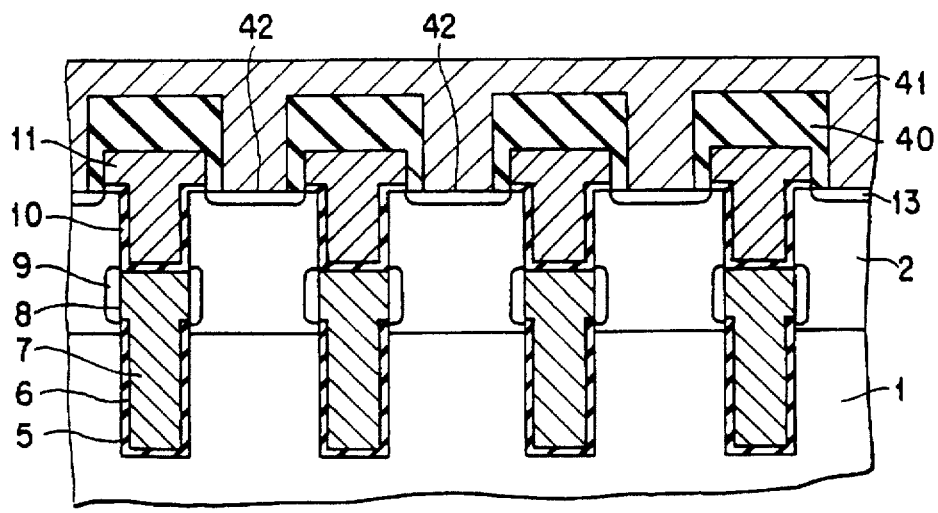
Figure 23B:
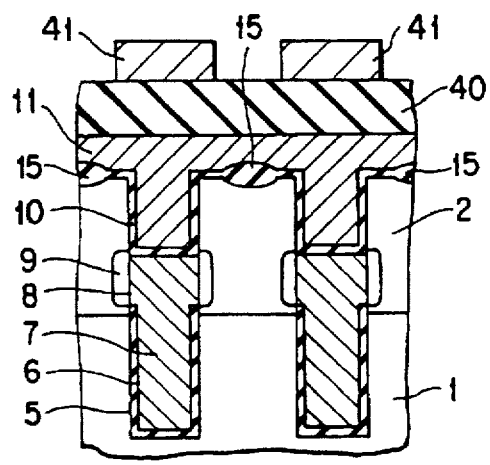

A trench type DRAM shown in FIGS. 22 and 23A-23B is different from the above embodiments in that it does not have the cell-region separating insulated grooves 3. With this DRAM, a "capacitor-transistor stacked" memory cell is arranged in a region in which a P type epitaxial silicon layer 2 is formed on P+ type silicon substrate 1. This memory-cell region is divided into a plurality of linear element-formation regions 14 by element separation region 15.

As shown in FIG. 22, a trench 5 is arranged at each of the crossing sections of the element regions 14 and the word lines 11. A vertical MOS transistor is formed at the upper portion of trench 5 with the trench side wall being as its channel region. An information storage MOS capacitor is formed at the lower portion of trench 5 to provide a trench type memory cell structure. The plate electrode of the MOS capacitor is constituted by P+ type silicon substrate 1. A carrier storage electrode 7 is insulatively buried in the lower portion of each trench 5 so that storage electrode 7 is insulated by capacitor insulation film 6 from substrate 1. Storage electrode 7 is coupled at the side wall of trench 5 to N type diffusion layer 9 through a side wall contact portion 8 as shown in FIG. 23A or 23B. A transfer gate is formed of the vertical MOS transistor, wherein N type diffusion layer 9 and N type diffusion layer 13 act as the source and drain (or vice versa) so that a potential at N type diffusion layer 13 may be applied to storage electrode 7 by way of N type diffusion layer 9 and side-wall contact 8, causing carriers to be accumulated therein.

Patterned word lines (gate electrodes) 11 are covered with respective interlayer-insulation films 40, on which bit lines 41 are formed to insulatively intersect word lines 11 as shown in FIG. 22. A bit-line contact 42 is formed at each element region 14 between neighboring ones of the bit lines 11, causing bit line 41 and diffusion layer 13 to be connected to each other.

with such a "cell-separating groove-less" memory cell structure, the diffusion layers 13 do not constitute a bit line by themselves; alternatively, each bit line 41 is contacted with diffusion layers 13 only at specific positions that do not overlap the word lines 11, thereby causing the bit lines including diffusion layers 13 to decrease in resistance. This means that, even when the cell area is decreased to attain a further enhanced packing density, a sufficiently lower bit-line resistance can be maintained to provide a great significance for the miniaturization and high-packing density of DRAMs. In addition, by forming diffusion layers 13 with word lines 11 being as a mask, diffusion layers 13 can be prevented from being undesirably formed to expand beneath word lines 11. This can decrease the capacitance between bit lines 41 and word lines 11.

Figure 24:
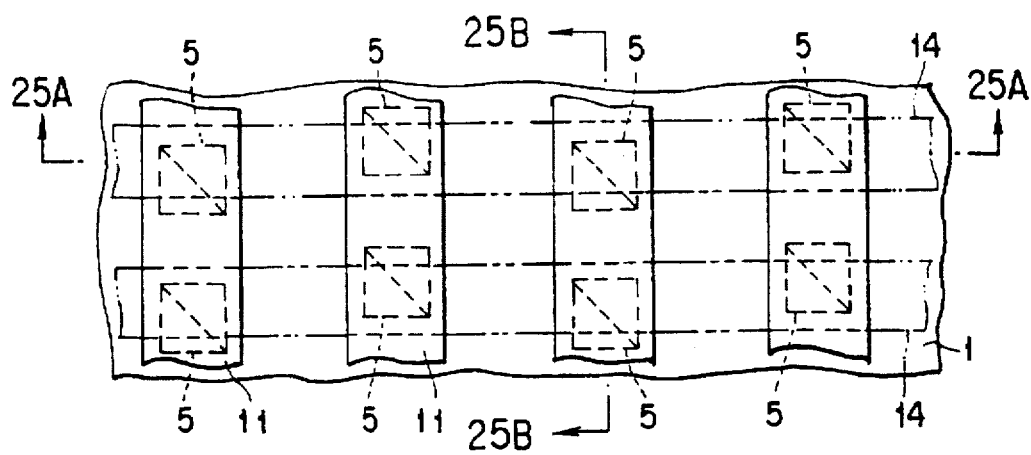
Figure 25A:
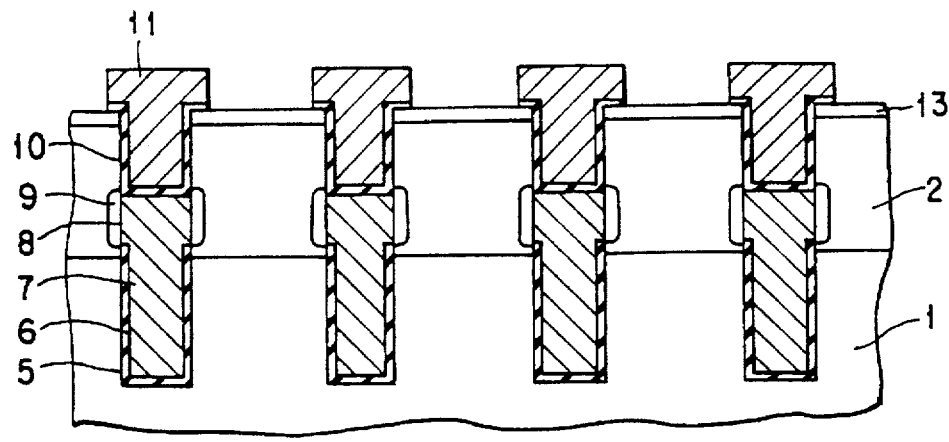
Figure 25B:
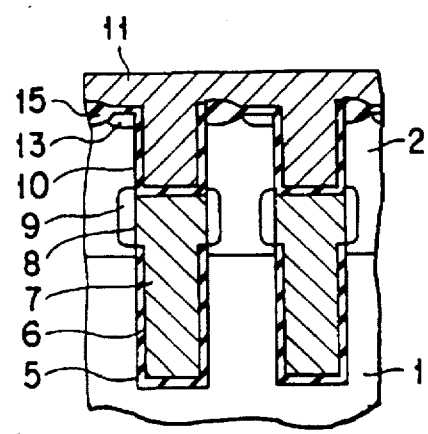

Another "cell-separation groove-less" trench type DRAM is shown in FIGS. 24 and 25A-25B, wherein, while the cell trenches 5 are arranged at the crossing portions of the element regions 14 and the gate electrodes 11, these trenches 5 are prevented from being simply aligned along a straight line perpendicular to the extending direction of word lines 11. As is typically shown in the plan view of FIG. 24, certain trenches 5 along a word line 11 are slightly shifted by a predetermined distance, whereas an adjacent array of trenches 5 neighboring thereto is shifted in the opposite direction by the same distance to provide a planar zig-zag trench pattern along the direction perpendicular to word lines 11. Each element region 14 extends, without causing the element region to become discontinuous at trenches 5, to have a "serpentine" planar shape as shown in FIG. 24. Diffusion layers 13 function also as the bit lines.

With such a "serpentine element region" arrangement having alternately shifted trenches 5 in the word-line direction, shifting trenches 5 alternately from the center of respective crossing points between element regions 14 and word line 11 in the opposite directions can increase the effective side wall area (the remaining width) of element region 14 at each trench; therefore, it becomes possible to minimize an increase in the resistance of each bit line including diffusion layers 13 due to the existence of trenches 5. Additionally, the aforementioned "cell-separation groove-less" DRAMs may be modified by those skilled in the art in various manners as will be described at the end of this description with respect to the embodiment of FIGS. 1 and 2.

The present invention may also be applied, in addition to the normal type DRAMs with the one-capacitor/one-transistor cell structure as previously described, to what is called the "NAND-cell" type DRAMs which will be presented below. NAND-cell type DRAM devices are the specific DRAMs having a plurality of memory cell portions (NAND cell units) each of which consists of a preselected number of series-connected 1-bit cells being coupled at a single node to a corresponding one of the bit lines.

Figure 26:
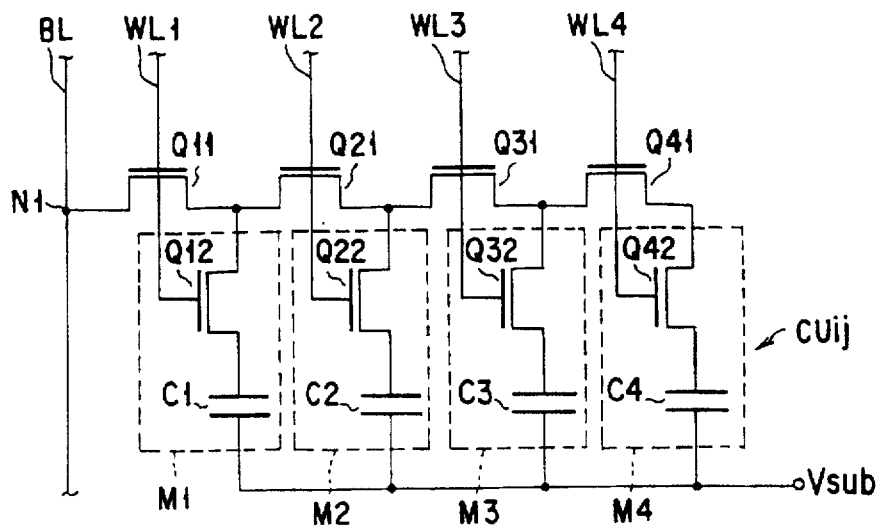
FIG. 26 is a circuit diagram of a NAND-cell type DRAM in accordance with another embodiment of the invention.

As shown in FIG. 26, the NAND-cell type DRAM in accordance with one embodiment of the invention has a, NAND cell unit CUij which includes four series-connected 1-bit cells M1, M2, M3 and M4, for example, which are associated at a node N1 (read/write node) with a corresponding bit line BL. A series circuit of four first transfer-gate MOS transistors Q11, Q21, Q31, Q41 is provided and coupled at node N1 to bit line BL at the drain of transistor Q11. The gate electrodes of transistors Q11–Q41 are coupled to word lines WL1, WL2, WL3, WL4, respectively. The 1-bit cells M1–M4 are coupled to the sources of transfer transistors Q11–Q41, respectively. Each of 1-bit cells M1–M4 includes a data-storage capacitor C (C1, C2, C3 or C4 and a second transfer-gate MOS transistor Q2 (Q12, Q22, Q32 or Q42). Regarding cell M1, capacitor C1 has a first (storage) electrode coupled to the source and drain of transistor Q12, which has a gate coupled to that of transistor Q11. The remaining cells M2–M4 are arranged similarly. Capacitors C1–C4 have second electrodes that are coupled in common to a substrate potential vsub.

Figure 27:
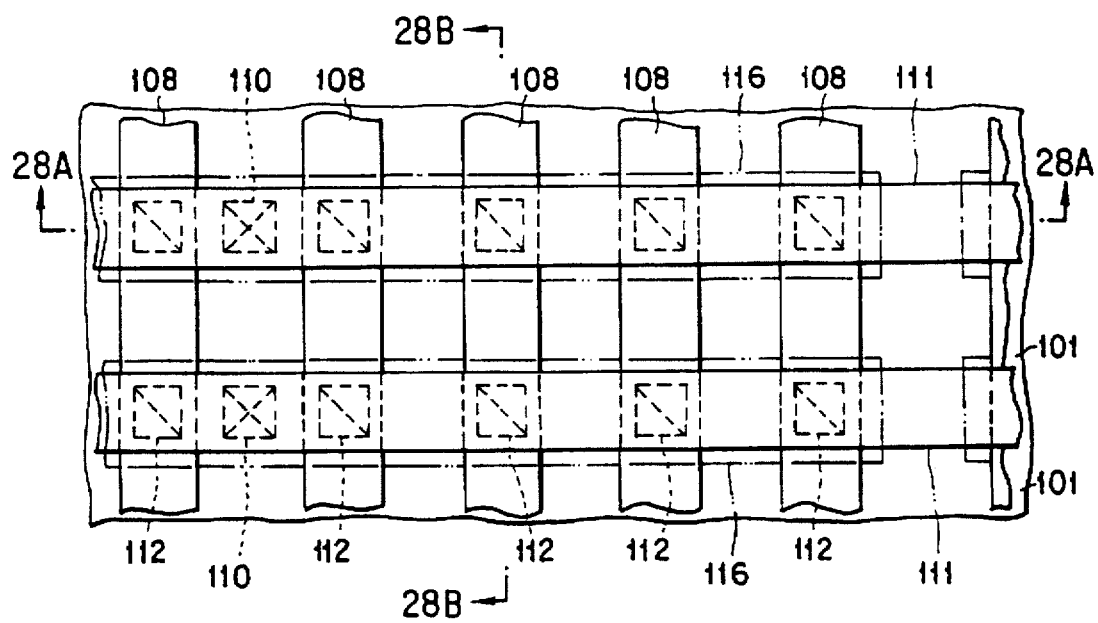
FIG. 27 shows a perspective view of the main section of the NAND-type DRAM in accordance with an embodiment of the present invention.
Figure 28A:
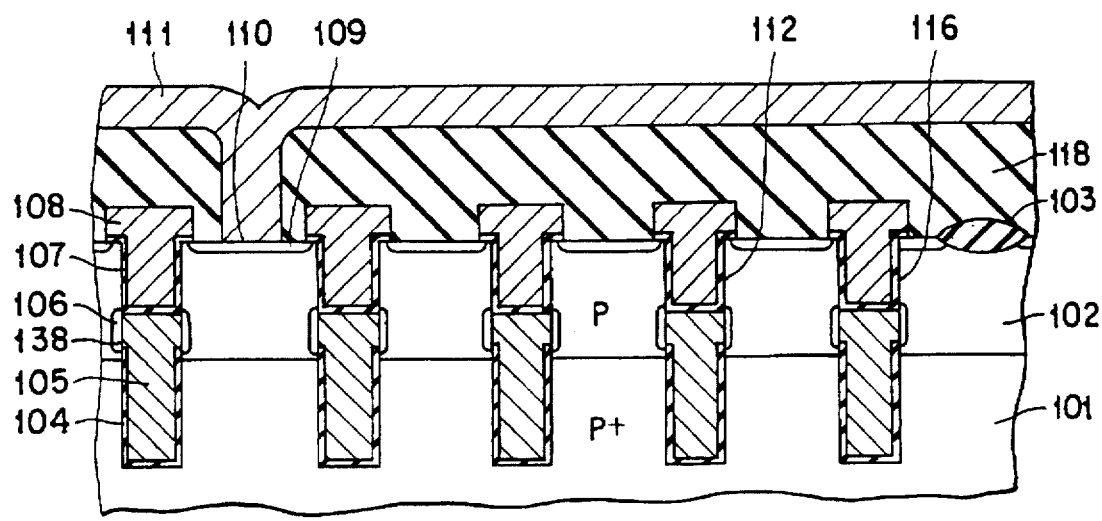
FIGS. 28A and 28B are cross-sectional views of the DRAM of FIG. 27 along lines 28A—28A and 28B—28B, respectively.
Figure 28B:
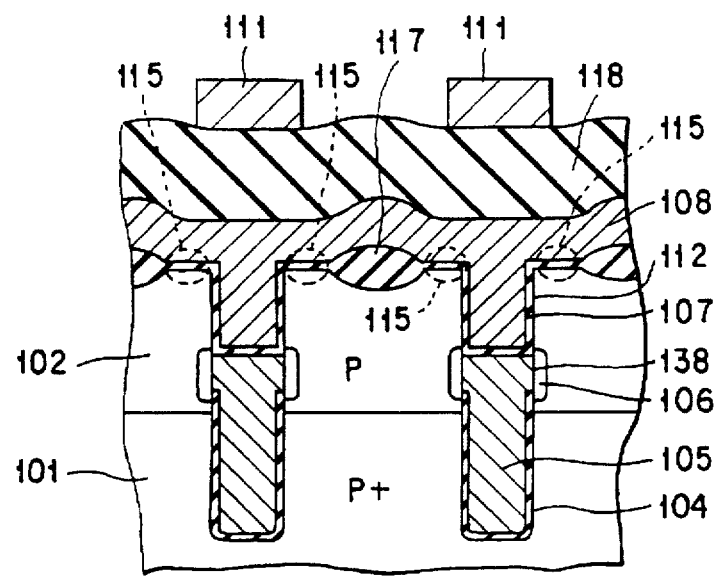

The detailed physical structure of the NAND-cell DRAM will be explained with reference to FIGS. 27, 28A and 28B, wherein FIGS. 28A and 28B illustrate the cross-sectional views of the plan structure of FIG. 27 along lines 28A–28A and 28B–28B respectively. The main feature of this NAND-cell DRAM is that each of 1-bit cells M employs the trench-type cell structure.

More specifically, a plurality of cell trenches 112 are formed in a P type epitaxial layer 102 arranged on a P+ type silicon substrate 101 so that each trench 112 is used to constitute a memory cell. Trenches 112 are located at respective crossing points between elongate "SDG" regions 116 (each of which is an active region including source, channel and drain regions) and gate electrodes 108 transverse thereto as shown in FIG. 27. The upper portion of each trench 112 is occupied by a vertical type MOS transistor, and an information storage MOS capacitor is buried in the lower portion of the trench. In this embodiment, the plate electrode of the MOS capacitor is constituted by P+ type silicon substrate 101. The MOS capacitor has an insulated storage electrode 105, which is buried in the lower portion of trench 112 so that it is insulated by a capacitor insulation film 104 from substrate 101 and epitaxial silicon layer 102 as shown in FIGS. 28A and 28B. Storage electrode 105 is contacted with an N type diffusion layer 106 through a side-wall contact 138 formed at a selected side wall section of trench 112.

The transfer gates Q12, Q22, Q32, Q42 of FIG. 26 are formed of trench-type MOS transistors, each of which has an N type diffusion layer 109 and an N type diffusion layer 106 as its source and drain (or vice versa). In each transistor, a potential applied at N type diffusion layer 109 is transferred to storage electrode 105 by way of N type diffusion layer 106 and side-wall contact 138, whereby carriers are accumulated in storage electrode 105. The transfer MOS transistors Q11, Q21, Q31, Q41 are arranged within memory cells M respectively as shown in FIG. 26, may be planar type MOS transistors 115 shown in FIG. 28B.

Figure 29A:
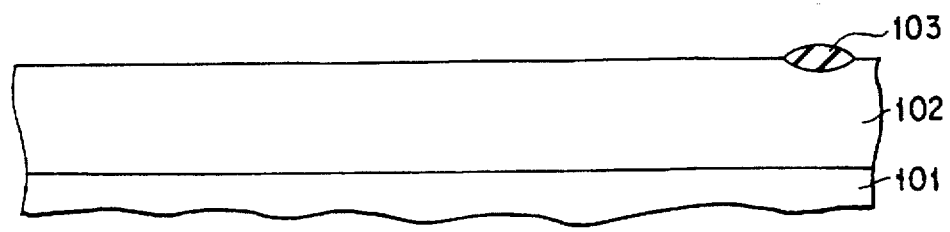

The above NAND-cell type DRAM may be manufactured as follows. Firstly, there is prepared a P+ type silicon substrate 101 doped with a p-type impurity such as B (boron) to a concentration of $10^{19}$ atoms per cubic centimeter. A P type epitaxial layer 102 is grown in the top surface of substrate 101 in a preselected area including memory cells in such a manner that layer 102 is doped with the same impurity (B) to a concentration of $10^{15}$ atoms per cubic centimeter, as shown in FIG. 29A. The thickness of epitaxial layer 102 is 2 micrometers, for example. Then, the same impurity (B) is doped in a resultant structure by using well-known ion implantation technique, whereby a well is formed in the cell section. An insulative film 103 is formed on the structure as a field insulation film for element separation.

Figure 29B:
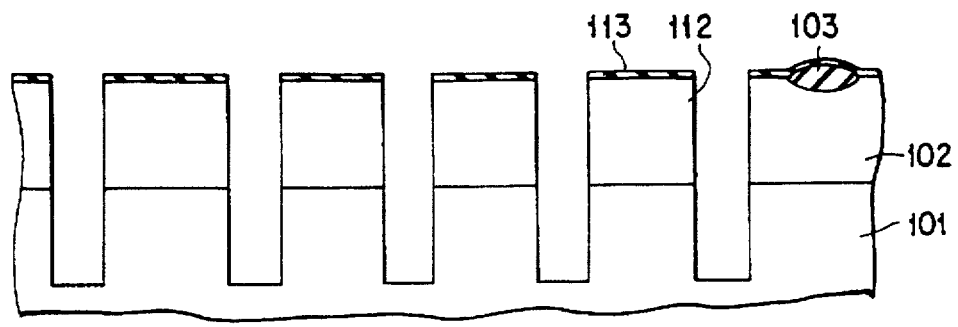

Subsequently, as shown in FIG. 29B, a silicon oxide film 113 and a silicon nitride film (not shown) are sequentially stacked on the P type epitaxial silicon layer 102 to form a stacked mask layer, which is then patterned to have openings. Known lithography and RIE techniques are used to form a plurality of trenches 112 in the substrate 101 and epitaxial layer 102. The overlying silicon nitride film is then removed while the underlying silicon oxide film 113 is remained.

Figure 29C:
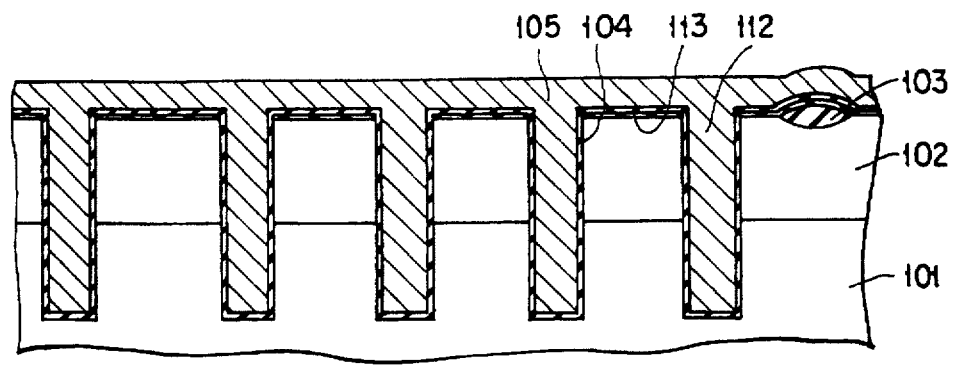

Then, as shown in FIG. 29C, a capacitor insulation film 104 is formed on the entire surface of the structure of FIG. 29B; the film 104 is made of a silicon-oxide film, a silicon-nitride film and a silicon-oxide stacked in this order to a predetermined thickness of 10 nm, for example. A first polycrystalline silicon layer 105 is deposited on film 104 such that layer 105 has a flat top surface. Layer 105 will be the storage electrode in each trench cell. An n-type impurity such as As (arsenic) is doped into polycrystalline silicon layer 105 by using known ion implantation technique.

Figure 29D:
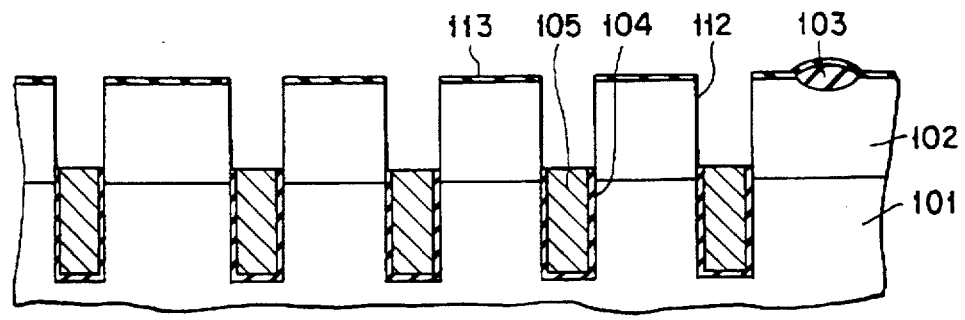

Then, as shown in FIG. 29D, the exposed upper portion of the impurity-doped polycrystalline silicon layer 105 is removed by 1.5 micrometers, for example, using the CDE technique, causing its lower portions to remain in the trenches 112. The exposed portions of the capacitor insulation film 104 are then etched away, so that each remaining portion in trench 112 is insulated by a corresponding etched insulation film 104 from the substrate 101 and the epitaxial layer 102 as shown in FIG. 29D.

Subsequently, as shown in FIG. 29E, a second polycrystalline silicon layer 114 is deposited on the entire surface of the structure of FIG. 29D. The upper portion of this layer 114, which is 1.2 micrometers thick from the top surface of the epitaxial layer 102, is removed using RIE technique. The resulting structure is then annealed at 900° C. for 30 minutes, whereby the doped impurity (As) is outdiffused from the polycrystalline silicon layer 105 into a certain portion of epitaxial layer 102 surrounding the side wall of each trench 112, so that an N type diffusion layer 106 is formed around each trench in epitaxial layer 102, for allowing the storage electrode buried in trench 112 to be contact with epitaxial layer 102 through N type diffusion layer 106 at a corresponding portion of the trench side-wall.

Subsequently, as shown in FIG. 29F, a gate oxide film 107 is formed on the entire surface of the resultant structure. A third polycrystalline silicon layer 108 is then deposited on the entire surface of structure to have a flat top surface. A $POCl_3$ diffusion treatment is performed; thereafter, a chosen impurity is doped into polycrystalline silicon layer 108.

Subsequently, as shown in FIG. 29G, the impurity-doped polycrystalline silicon layer 108 is subjected to a patterning process, whereby layer 108 is partly etched using the lithography and RIE techniques to form a plurality of T-shaped portions, which function as the gate electrodes of vertical type MOS transistors and the gate electrode of transfer-gate MOS transistors. An ion implantation is then carried out to form a plurality of source/drain diffusion regions 109.

Subsequently, as shown in FIG. 29H, an insulative layer 118 is deposited as a layer-to-layer separator on the entire surface of the structure of FIG. 29G. Layer 118 is patterned using known lithography and etching techniques to form a bit-line contact hole 110 at a selected position. A conductive layer 111 is deposited on the entire surface of the resulting structure, and is then patterned to form a plurality of parallel elongate bit lines (see FIG. 27) on insulative layer 118. One of such bit lines 111 is shown in FIG. 29H wherein it is contacted with a selected source/drain diffusion region 109 through contact hole 110.

With the above embodiment, the trenches 112 are formed in the silicon substrate 101 and the epitaxial layer 102, and a MOS capacitor and a vertical type transfer-gate MOS transistor are then formed in each of the trenches 112. Therefore, it can assure that sufficient storage capacitance is attained while the occurrence of underlying step-pattern portions is reduced. This makes it easier to fabricate the underlying wiring layers during the process of forming bit lines. In addition, since the transfer gates are specifically formed of vertical type MOS transistors, any undesirable decrease in the threshold voltage can be prevented from taking place due to the "short channel" effect. It is therefore possible to improve the cut-off characteristic and the reliability while attaining an enhanced integration density.

Furthermore, the NAND-cell type DRAM of higher integration density can be manufactured without any particular difficulty by using the presently available manufacturing technology. This may lead to a significant reduction in the production cost per bit. Such cost reduction will be advantageous especially for the manufacture of low-cost/high-capacity DRAMs that are replacing the existing external information storage medium, such as magnetic disks.

Figure 30:
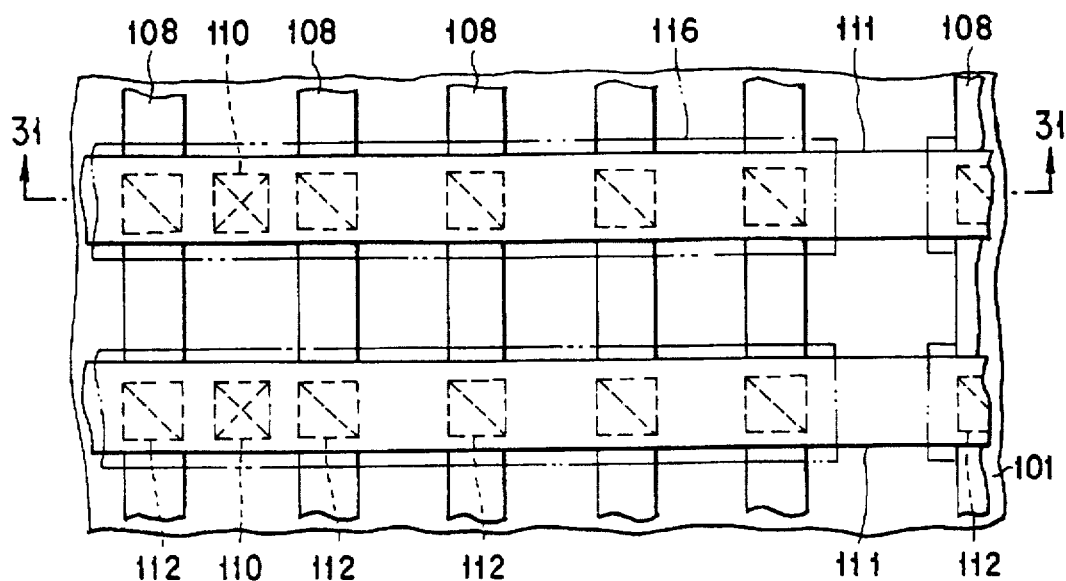
Figure 31:
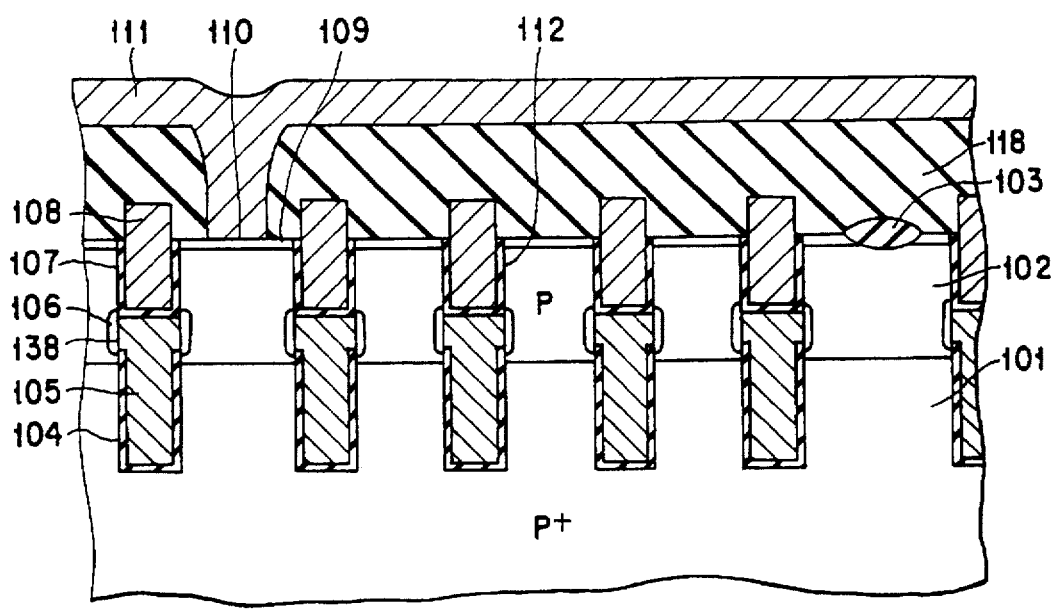

Another NAND-cell DRAM is shown in FIGS. 30 and 31, wherein the elongate gate electrodes 108 are decreased in line width so that the width of each gate electrode 108 (i.e., the length of gate electrode 108 in a direction parallel with the bit line 111) is equivalent to the length of a side of the planar square shape of trench 112 in the direction parallel with bit line 111. With such a "short-width gate-electrode" arrangement, the cell size can be decreased to further improve the integration density. Furthermore, the contact area between each gate electrode 108 and a corresponding source-drain diffusion layer 109 can be made narrower than that of the embodiment of FIGS. 27–28, whereby the capacitance between them can be reduced to improve the operation speed of the DRAM.

Figure 32:
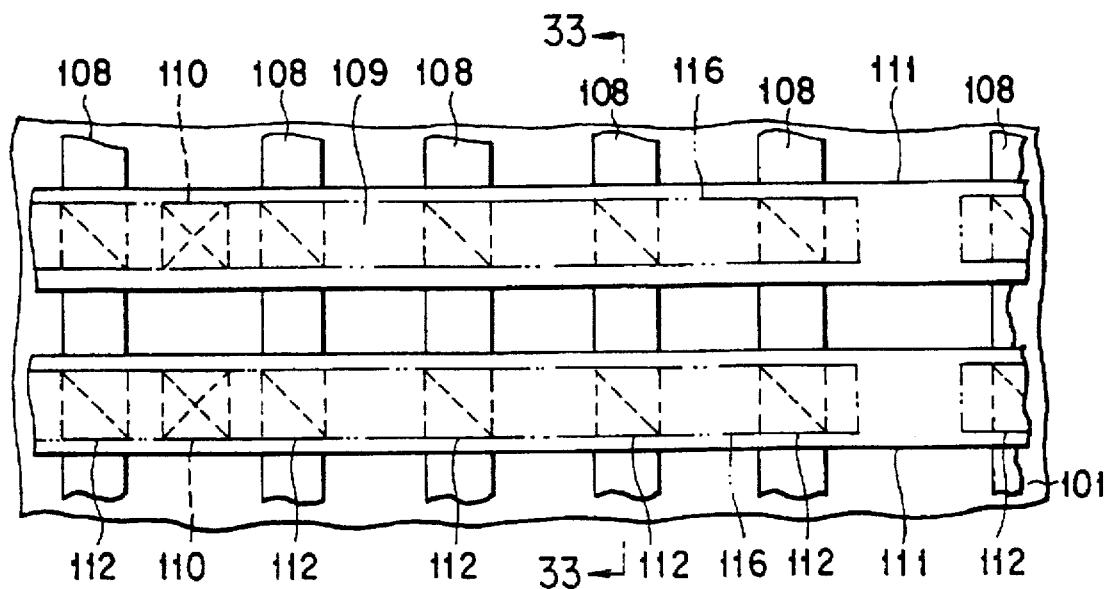
Figure 33:
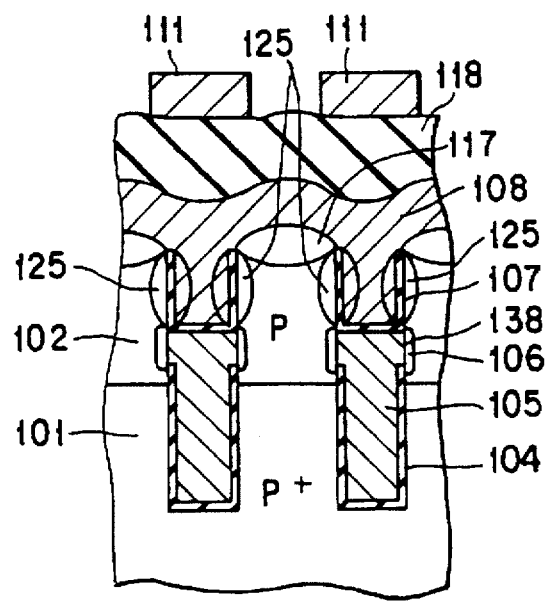

A NAND-cell DRAM shown in FIGS. 32 and 33 is similar to that of FIGS. 30 and 31 with the SDG regions 116 being decreased in width to allow the trench openings to be aligned with a boundary between a corresponding SDG region 116 and a field oxide film 117 extending perpendicular to the bit lines 111. With the arrangement, each vertical-type MOS transistor also functions as a transfer-gate MOS transistor. A part of the vertical-type MOS transistor designated by the numeral 125 in the cross-sectional structure of FIG. 33 corresponds to a transfer-gate MOS transistor. An electrical connection with a neighboring cell is attained by causing a current to flow through this part 125 in a direction perpendicular to the paper. Employing this structure may lead to the possibility to decrease the length of SDG region 116 in the direction perpendicular to bit lines 111, whereby the cell size can be further decreased.

In the above embodiment, the length (line width) of gate electrode 108 in the direction parallel with the bit lines 111 is equal to the length of the opening of each trench 112 in the same direction parallel with bit lines 111. Such arrangement may be modified as follows: The length of gate electrode 108 in the parallel direction with bit lines 111 is greater than the length of trench opening 112 in the same direction, causing the gate electrode 108 and the source-drain diffusion layer 109 to face each other with a gate oxide film 107 being sandwiched therebetween on the surface of the P type epitaxial silicon layer 102 as in the embodiment of FIGS. 1-2.

Figure 34:
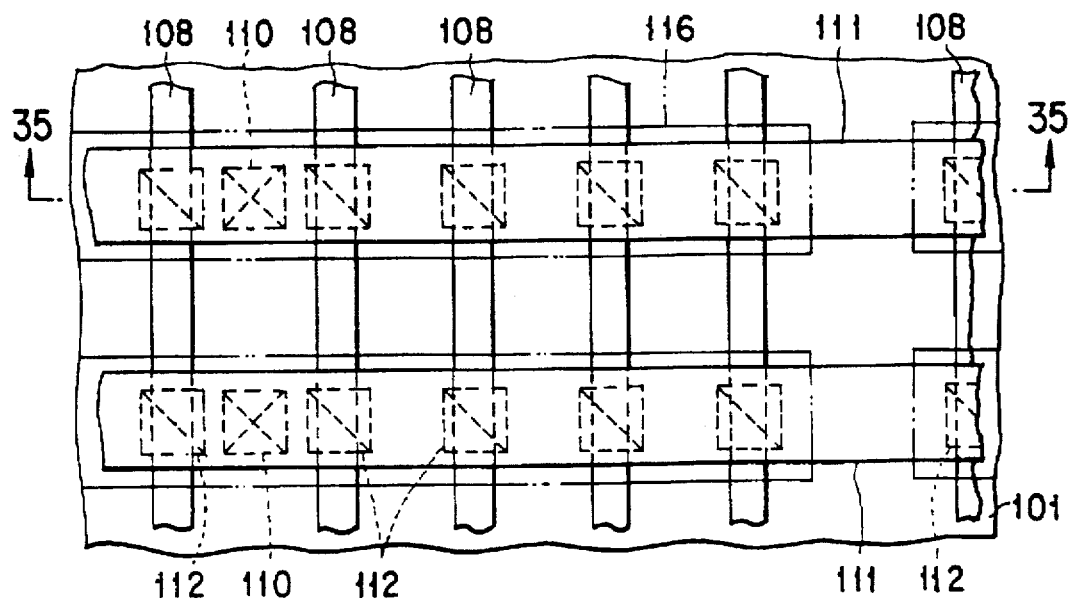
Figure 35:
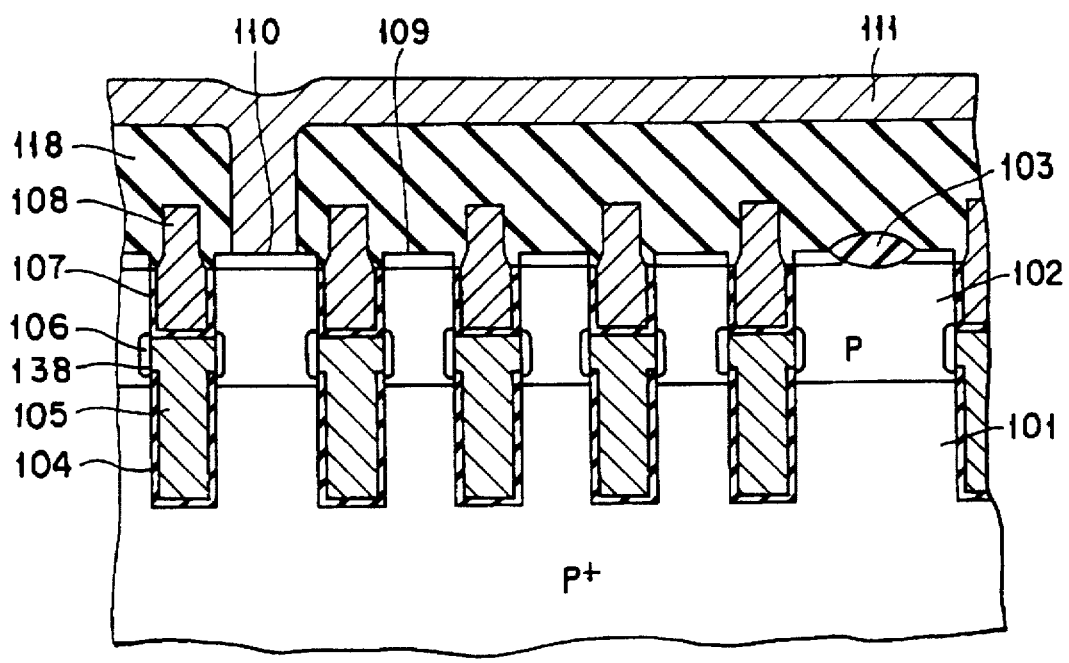

A NAND-cell DRAM is shown in FIGS. 34 and 35, wherein the gate electrodes 108 are further decreased in line width so that the length of each gate electrode 108 in the direction parallel with bit lines 111 is less than the length of the trench opening 112 in the same "bit-line parallel" direction. As a result, the opposing edge lines of each gate electrode 108 are positioned inside the trench openings 112 as shown in FIG. 34. The profile of each gate electrode 108 is shown in FIG. 35, wherein the upper portion of it is partly narrowed. With such an arrangement, the cell size can be further miniaturized to improve the integration density.

Figure 36:
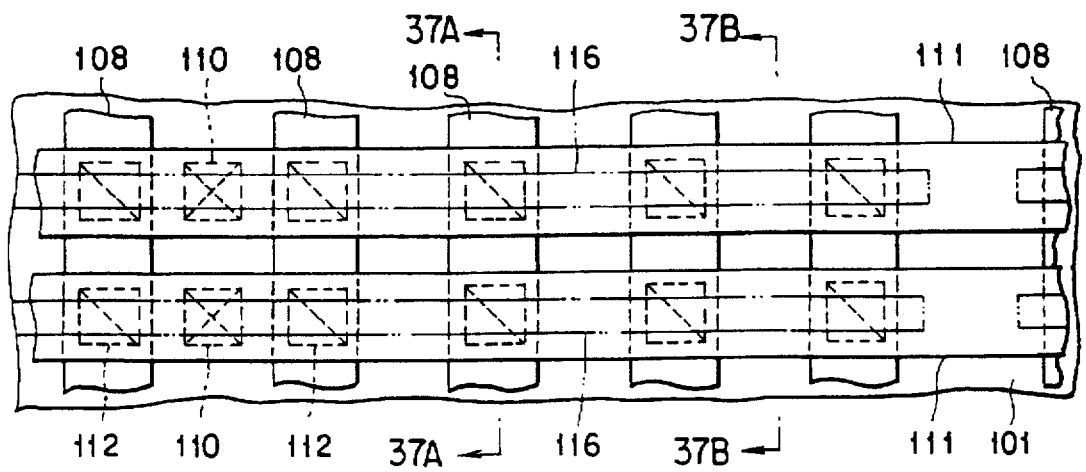
Figure 37A:
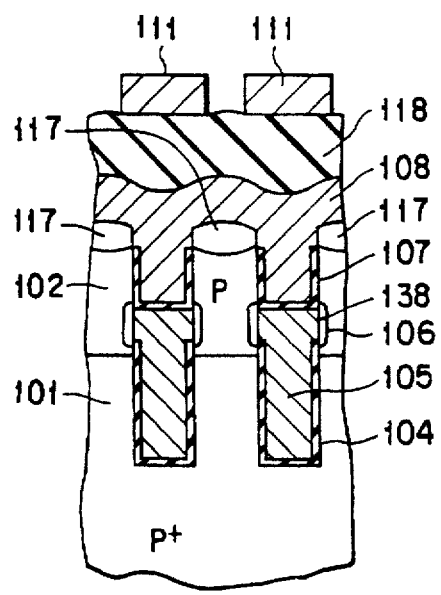
Figure 37B:
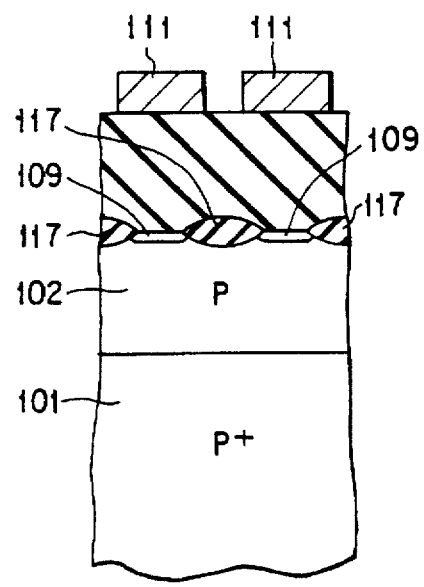

A NAND-cell DRAM is shown in FIGS. 36 and 37, wherein the SDG regions 116 are decreased in line width so that the length (width) of each SDG region 116 in the direction perpendicular to bit lines 111 is shorter than the length of trench opening 112 in the same direction. The length of the field oxide film 117 in the "bit-line perpendicular" direction at a certain position including a gate electrode 108 as shown FIG. 37A (which shows the cross-sectional structure along line 37A—37A in FIG. 36) is shorter than the length of field oxide film 117 in the same direction at a different position between neighboring gate electrodes 108 as shown in FIG. 37B (which shows the cross-sectional structure along line 37B—37B of FIG. 36). With such an arrangement, each vertical-type MOS transistor may also serve as a transfer-gate MOS transistor as in the embodiment of FIGS. 32–33. Furthermore, shortening of the line width of gate electrodes 108 can lead to a further miniaturization of the cell size, as compared with the embodiments shown in FIGS. 27–28 and that of FIGS. 32–34.

A NAND-cell DRAM is shown in FIGS. 38, 39A and 39B, wherein both the gate electrodes 108 and the SDG regions 116 are decreased in line width. The line width of gate electrodes 108 is made smaller so that the length of each gate electrode 108 in the bit-line parallel direction is shorter than the length of trench opening 112 in the same direction. The length of each SDG region 116 in the bit-line perpendicular direction is less than the length of trench opening 112 in the same direction. With such an arrangement, the cell size can be further miniaturized as compared with the embodiments of FIGS. 34–35 and that of FIGS. 36–37.

A NAND-cell DRAM is shown in FIGS. 40 and 41, wherein an increased number of bit-line contact portions are arranged so that two (four in the previous embodiments) transfer-gate MOS transistors are series-connected with respect to one bit-line contact. A bit-line contact 110a is associated with two transfer-gate MOS transistors having gate electrodes 108a,108b, which transistors are series-connected to contact 110a. Another bit-line contact 110b is associated with other series-connected two transfer-gate MOS transistors having gate electrodes 108c, 108d. Those transistors having gate electrodes 108b, 108c are coupled to each other by a source-drain diffusion layer 109, which is arranged in the top surface of epitaxial layer 102 as shown in FIG. 41. No element-separation regions using a field oxide film (such as 103 of FIG. 39A) are arranged. Elimination of the necessity of forming an element-separation region between gate electrodes 108b, 108c is based on the fact that the two gate electrodes will not turn on simultaneously; even with no element-separation therebetween, it will never happen that a cell data is destroyed. With such an arrangement, the cell length in the bit-line parallel direction can be shortened to improve the integration density.

Figure 42:
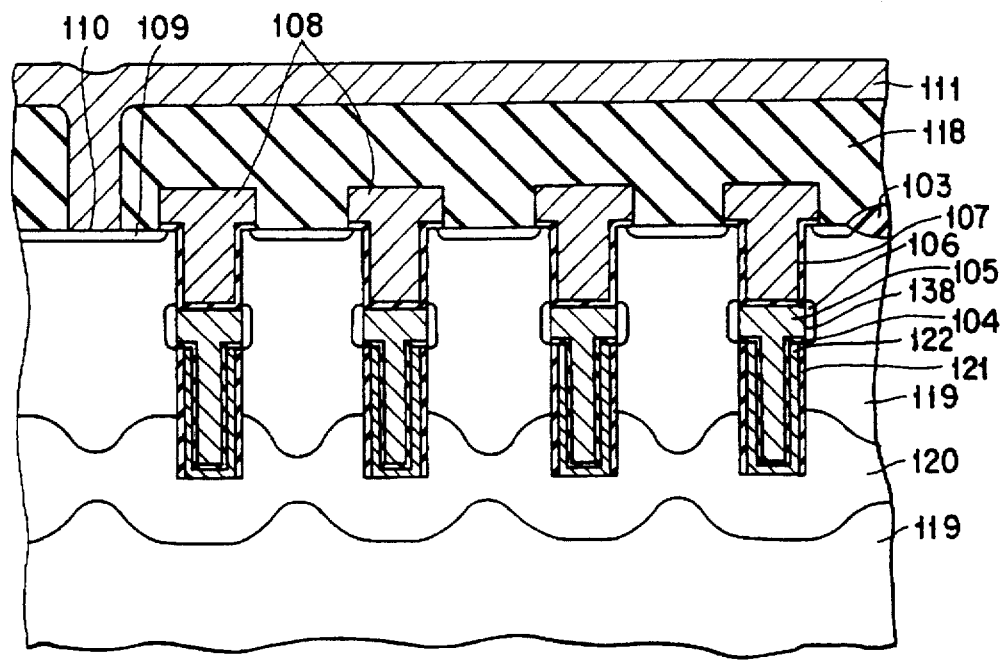

A NAND-cell DRAM is shown in FIG. 42, wherein the plate electrode consists of a layer 122, which is insulatively buried in the lower portion of each trench with a silicon oxide film 121 being formed between the trench side-wall surface and layer 122. The buried plate 122 may be made from a polycrystalline silicon material doped with a chosen impurity such as P or As. An N type diffusion layer 120 is formed in the P type silicon substrate 119; each buried plate 122 is contacted with this diffusion layer at its bottom portion. The cell capacitor of this embodiment is constituted by buried plate 122, capacitor insulation film 104 and storage electrode 105 with respect to each trench cell. With such a memory cell structure, the buried plate 122 can be potentially controlled independently of substrate 119. Such independent potential setting can allow the substrate bias voltage being applied to the transfer-gate MOS transistor and the vertical-type MOS transistor to be set independently of the plate voltage, thereby to improve the cut-off characteristics of the transfer-gate and vertical-type MOS transistors. This can improve the reliability of cell capacitor.

Note that, in the embodiment, the profile of N type diffusion layer 120 is illustrated in FIG. 42 under an assumption that layer 120 is formed by outdiffusing the impurity from the bottom portions of trenches. However, layer 120 may be arranged differently. For example, a chosen impurity such as P may be doped in substrate 119 using known ion-implantation technique under the application of a high acceleration voltage such as 3 MeV, thereby forming an N type diffusion layer. The buried plate 122 made from polycrystalline silicon may alternatively be made from another material selected from the group including a single-crystalline silicon, porous silicon, metal (such as W, Te, Ti, Hf, Co, Pt, Pd, or the like), or silicide of these metals. Buried plate 122 may also be comprised of a multi-layered structure including a plurality of stacked layers made from selected materials from the group.

Figure 43:
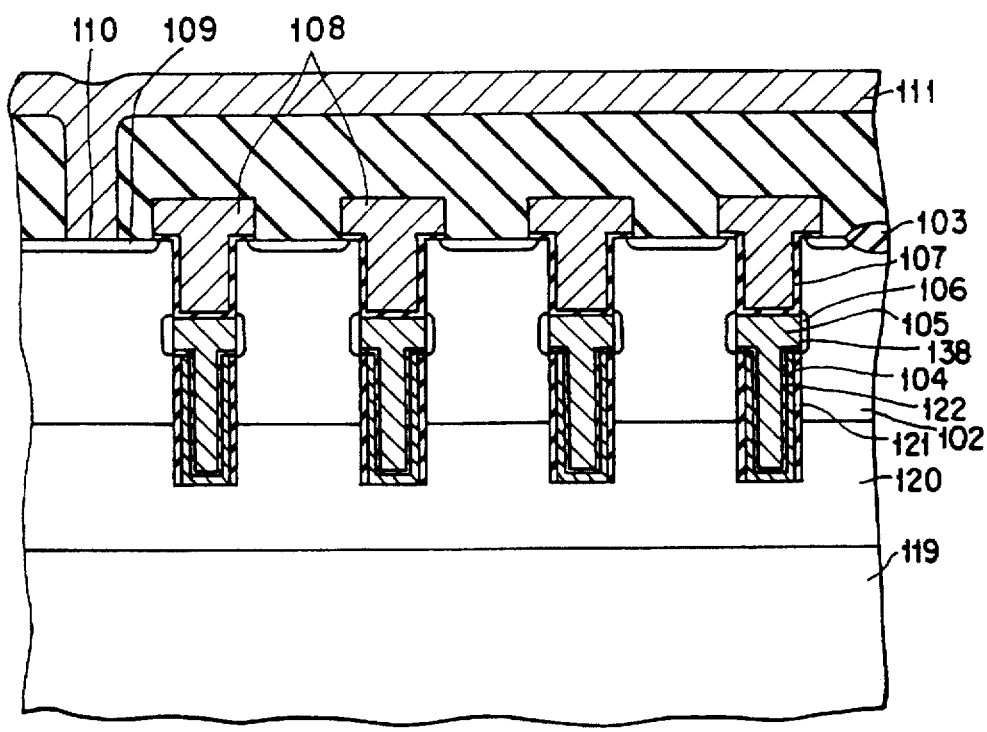

A NAND-cell DRAM shown in FIG. 43 is similar to that of FIG. 42 with the substrate structure being modified to consist of a P type silicon substrate 119, an N type diffusion layer 120 arranged in the upper surface region of substrate 119, and a P type epitaxial silicon layer 102 on substrate 119. This embodiment is similar to that of FIG. 42 in that the plate electrode being formed of the buried layer 122 which is insulatively disposed in the lower portion of each trench with the silicon oxide film 121 being sandwiched between the trench side-wall and the plate layer 122. With such a memory-cell structure, the manufacture of N type diffusion layer can be simplified more compared to that of FIG. 42. If required, the P type silicon substrate is replaced with an N type silicon substrate. The N type diffusion layer 120 may be omitted so that P type epitaxial layer 102 is formed directly on N type silicon substrate 119. Alternatively, the P type epitaxial silicon layer 102 may be replaced by an N type epitaxial layer; in such case, a P type well may be formed in a substrate region including at least memory cell formation region. It is also an alternative structure that no epitaxial silicon layer is formed, and that an N type silicon substrate is used in which a P type well is formed in a region including a memory cell formation region.

A NAND-cell DRAM shown in FIG. 44 employs a P type silicon substrate 119, wherein a partial region around a corresponding trench and including a capacitor section is greater in p-type impurity concentration than the remaining memory-cell formation region to provide a P+ type diffusion layer 123 surrounding each trench. P+ type diffusion layer 123 is used as the plate electrode. With such an arrangement, memory cells can be formed without making use of any epitaxial layer, causing the manufacturing method thereof to be simple with a decrease in the production cost.

A NAND-cell DRAM shown in FIG. 45 uses a P type silicon substrate 119, wherein a P+ type diffusion layer 124 is formed by doping a p-type impurity such as B (boron) using well-known ion implanting technique into a selected substrate region including memory cells under the application of a high acceleration voltage, 3 MeV, for example. With such a memory cell structure, the memory cells can be formed without using an epitaxial layer, which may cause the manufacturing process to be simple while allowing the manufacturing cost to decrease. Note that the P type silicon substrate may be replaced with an N type silicon substrate, which is doped or ion-implanted with a chosen impurity such as B or P in a selected region including memory cells under the application of a 3 MeV-acceleration voltage to provide a P+ type or N+ type diffusion layer. In this case, a P type well may be formed in the upper region of such diffusion layer including memory cells.

A NAND-cell DRAM shown in FIGS. 46, 47A and 47B has an element-separation (cell separation) groove 127, which is formed in a substrate 101 so that adjacent ones of element formation trenches 112 each including a vertical type transistor and a capacitor are separated from each other. Groove 127 causes the SDG region 116 to be divided into a plurality of island portions. An insulative material such as silicon oxide 128 is buried in groove 127. The island of SDG regions 116 are electrically connected to one another in the direction parallel with bit lines 111, by using polycrystalline silicon layers 126 each of which is mounted on a corresponding isolated groove portion 127, thereby causing transfer-gate MOS transistors to be series-connected in this direction.

With this embodiment, the series connection of four transfer-gate MOS transistors is performed by using four polycrystalline silicon layers 126 including a bit-line contact portion 110. The insulated element-separation trench 127 is arranged between adjacent ones of the N type diffusion layers 106 located at a selected position of the opposing side walls of neighboring trenches 112; it is therefore possible to eliminate the occurrence of any punch-through phenomenon between the adjacent N type diffusion layers 106. This can make shorter the required distance between neighboring trenches 112. The memory cell area can thus be decreased to improve the integration density.

The embodiment may be modified as follows. The depth of the element separation groove 127 may be freely modified as far as groove 127 is greater in depth than the N type diffusion layer 106; for example, groove 127 may be formed to be deeper than trenches 112. The insulative material to be buried in groove 127 is not limited to the silicon oxide only, and may be alternatively made of a layer of PSG, BSG, BPSG, silicon nitride film, polycrystalline silicon, or a multi-layered structure made from some selected from these materials. It is not always required that both the element separation groove 127 and the polycrystalline silicon layer 126 are arranged at the bit-line contact section; at least one of these layers may be omitted. The transistor-connecting polycrystalline silicon layers 126 may alternatively be one or a plurality of stacked layers made from amorphous silicon, single-crystalline silicon, germanium, metal, silicide, etc.

Figure 48:
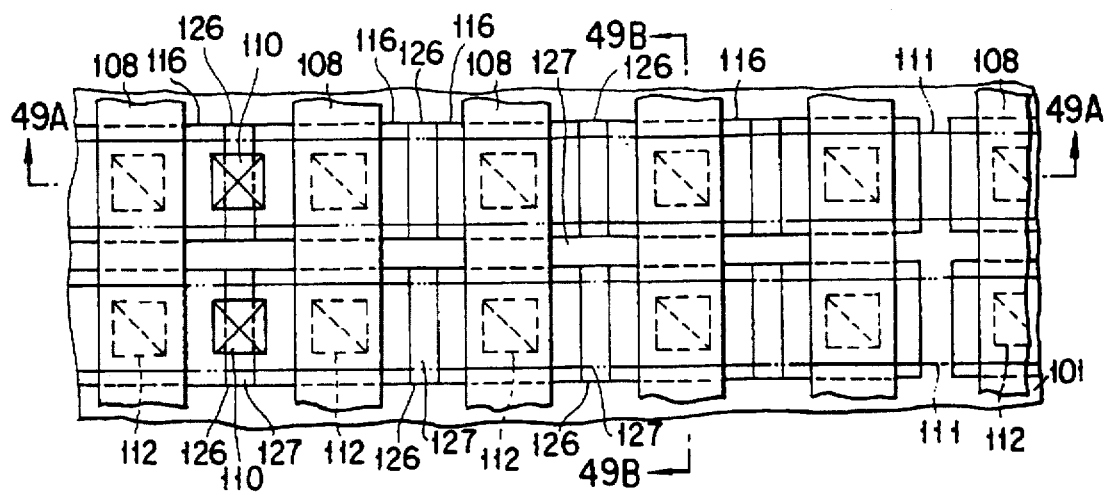
Figure 49A:
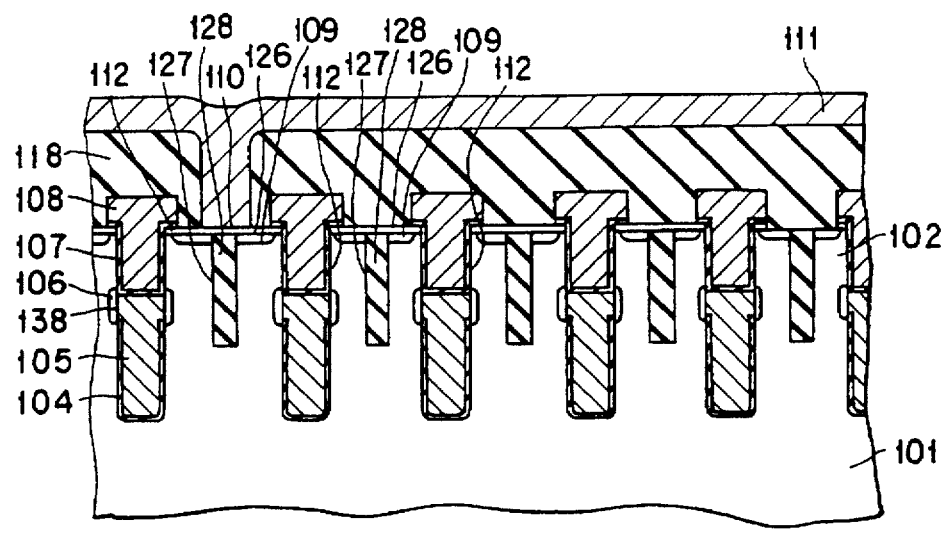
Figure 49B:
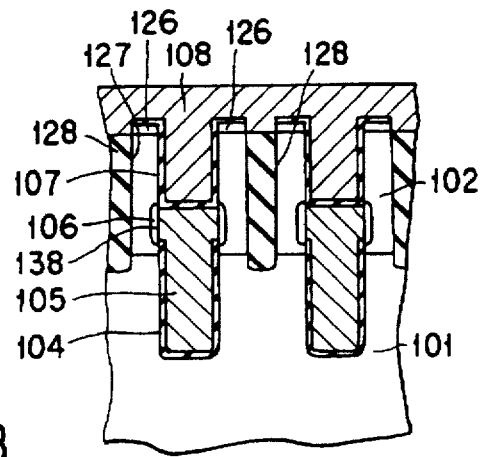

A NAND-cell DRAM shown in FIGS. 48, 49A and 49B is similar to that of FIGS. 46 and 47 with the transistor-connecting polycrystalline silicon layers 126 being modified so that each layer 126 is enlarged in planar shape to lie under cross-bar portions of the "T"-shaped gate electrodes 108 of the transfer-gate MOS transistors, as shown in FIG. 49A or 49B. This causes the channel region of each transfer-gate MOS transistor to be formed in the surface of polycrystalline silicon layer 106 or within this layer.

With this embodiment, unlike the embodiment of FIGS. 46, 47, the polycrystalline layer 126 for connecting four transfer-gate MOS transistors in series to one another is prevented from being discontinuous on the SDG region 116, and can remain entirely continuous through the transfer-gate MOS transistors. This may eliminate the necessity of providing an extra region for the formation of polycrystalline layer 126, whereby the required distance between trench 112 and groove 127 can be decreased to further miniaturize the cell area. Note here that, while polycrystalline layer 126 is reduced in resistivity (by being doped with a chosen impurity using the ion implantation technique with the gate electrodes 108 being as an ion-implanting mask) to function as the transfer-gate MOS transistor connecting electrode, layer 126 remains greater in resistivity at certain portions beneath the cross-bar portions of T-shaped gate electrodes 108. Such higher resistivity portions may act as a part of semiconductor substrate structure for the formation of elements.

The device structure of FIGS. 48 and 49 may be modified in essentially the same manner as that of FIGS. 46 and 47 as previously described. In addition, the transistor-connecting polycrystalline silicon layer 126 is identical with SDG region 116 in length along the direction perpendicular to bit lines 111 (i.e., line width) as shown in FIG. 48. However, such arrangement will not be strictly required, and may be modified as far as a resultant structure may permit at least a part of the channel region of each transfer-gate MOS transistor to be formed in the surface of layer 126 or inside this layer.

Figure 50:
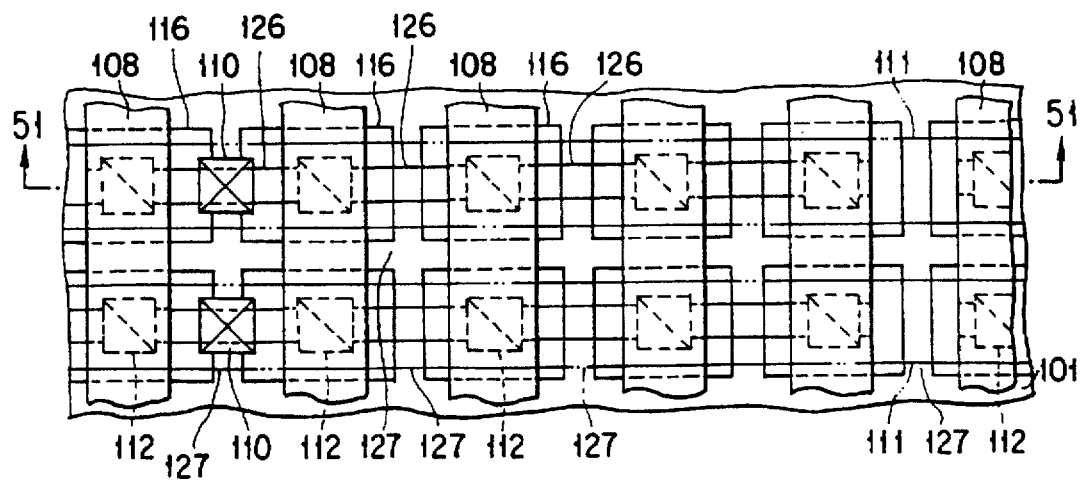
Figure 51:
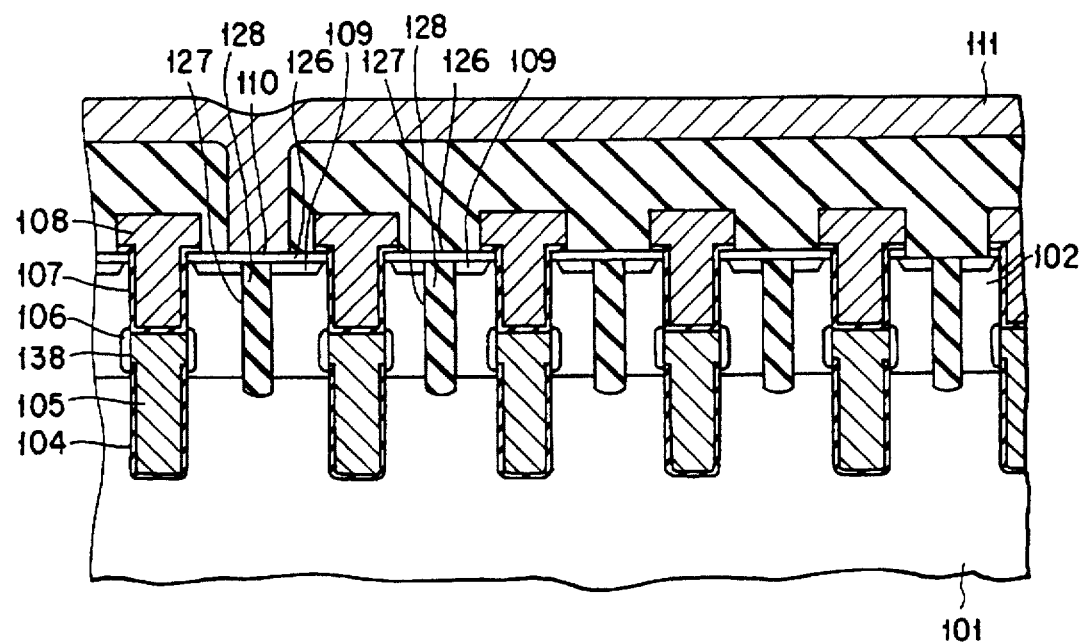

A NAND-cell DRAM shown in FIGS. 50 and 51 is similar to that of FIGS. 48 and 49 with the transistor-connecting polycrystalline silicon layer 126 being decreased in line width to be equivalent to or less than the trench opening 112 as is apparent from viewing FIG. 50. Employing such narrowed layer 126 can reduce the inherent capacitance of bit lines 111. This embodiment may also be modified in substantially the same way as previously described with respect to the device of FIGS. 46 and 47.

An "element-separating groove-less" type NAND-cell DRAM is shown in FIGS. 52, 53A and 53B, wherein each trench 112 is provided with an N type diffusion layer 106 and a side-wall contact 138, which are selectively arranged at a limited region corresponding to only one (133) of the four vertical side-wall surfaces of the trench. More specifically, each storage electrode 105 is contacted with the epitaxial layer 102 only at a limited side-wall portion whereat diffusion layer 106 and contact 138 are selectively arranged. Such selective arrangement of diffusion layer 106 and contact 138 is made different between two neighboring memory-cell arrays each including four transfer-gate MOS transistors series-connected to a corresponding bit-line contact 110. Regarding a first cell array as shown in the upper side of the drawing of FIG. 52, diffusion layer 106 and side-wall contact 138 are formed at one side-wall portion 133a of each trench 112 as shown. In a second cell array shown in the lower side of the illustration of FIG. 52, layer 106 and contact 138 are located at the opposite side-wall portion 133b. Looking at the planar pattern of FIG. 52 along the direction of one line-shaped gate electrode 108, the limited side-wall contact portions 133a, 133b are alternately arranged with respect to the opposing side-walls of trenches 112. With such "alternate side-wall contact positioning" feature, it is possible to increase the effective distance of N type diffusion layers 106 between the first and second cell arrays neighboring to each other. This means that the distance between neighboring trenches 115 in the direction of gate electrodes (word lines) 108 can be decreased, thereby to allow the cell size to be further miniaturized, which will lead to the achievement of a higher integration density.

Figure 54:
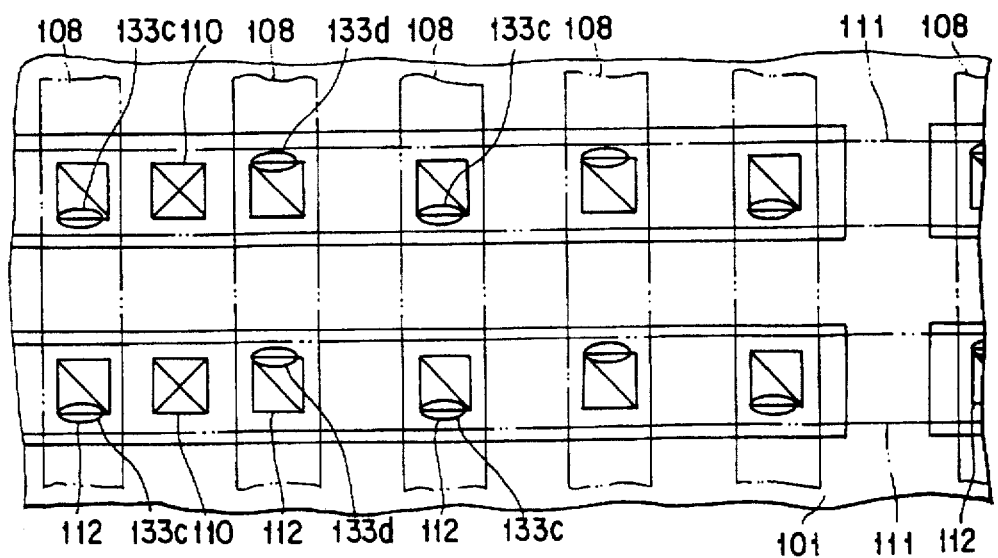

The "alternate side-wall contact positioning" scheme may be modified in various ways. Some possible modifications will be described as follows. As shown in FIG. 54, the N type diffusion layer 106 and side-wall contact 138 are selectively arranged at the same side-wall portion (either a third one 133c or a fourth one 133d of the four side-walls) of each trench 112 in the direction of gate electrodes (word lines) 108. In the bit-line direction transverse to the word-line direction, these components 106, 138 are alternately located at the third and fourth side-wall portions 133c, 133d of trenches 122 aligned in this direction.

Figure 55:
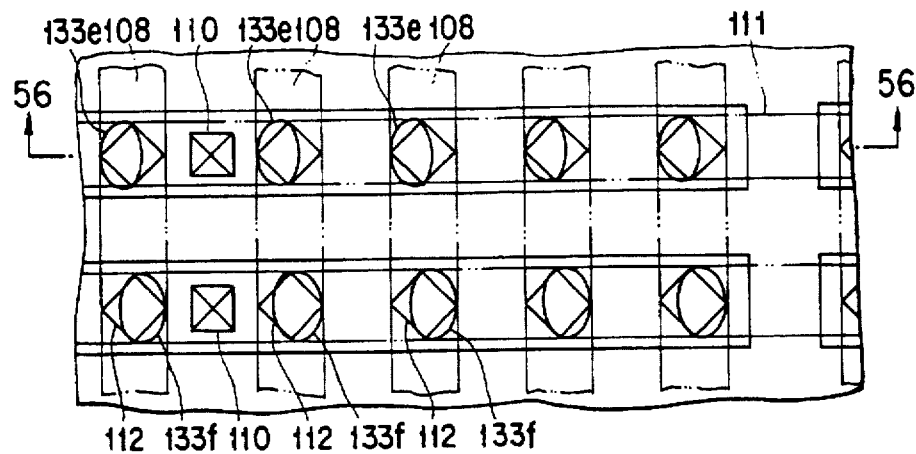
Figure 56:
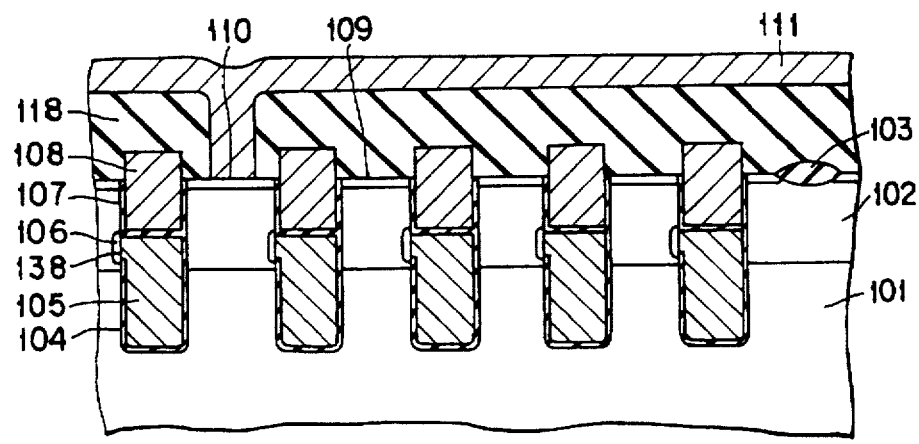

A NAND-cell DRAM shown in FIGS. 55 and 56 employs 45-degree rotated trenches 112 in the substrate surface, wherein the diagonal lines of each trench opening 112 are parallel with the word lines 108 and bit lines 111. The N type diffusion layer 106 and side-wall contact 138 are selectively arranged at two neighboring ones (i.e., "L"-shaped contact portions 133e or 133f of the four side-walls of each 45-degree rotated trench 112. Looking at the planar pattern along the direction of one word line 108, the side-wall contact portions are alternately arranged between opposing side-wall portions 133e and 133f as shown in FIG. 55. Such alternate side-wall contact positioning concept may be similar to that shown in FIG. 52, rather than that of FIG. 54.

With such an arrangement, it is possible to increase the effective distance of N type diffusion layers 106 between the first and second cell arrays neighboring to each other. This means that the distance between neighboring trenches 112 in the direction of gate electrodes (word lines) 108 can be decreased, thereby to allow the cell size to be miniaturized, which leads to the achievement of a higher integration density. Furthermore, each side-wall contact 138 at the L-shaped portions 133e, 133f can be increased in area, as compared with the embodiment of FIGS. 52-53, to enable the contact resistance to decrease at each side-wall contact portion. The selection of L-shaped contact portions 133e, 133f may be modified when the invention is reduced to practice.

Figure 57:
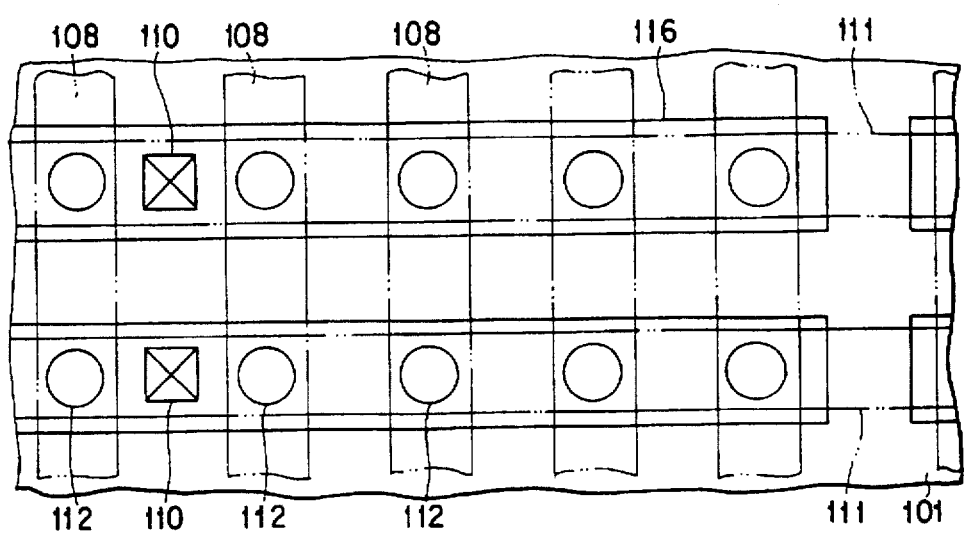
FIG. 57 is a plan view of a trench-type DRAM in accordance with an embodiment of the invention.
Figure 58A:
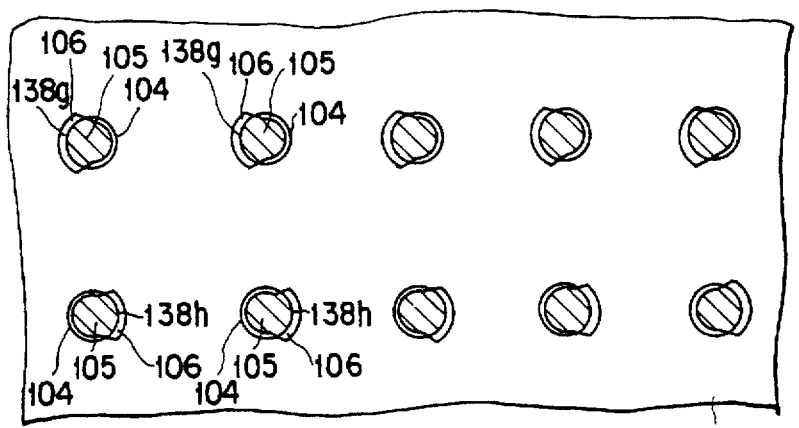
FIGS. 58A and 58B show two possible examples of the planar arrangement of trenches on the surface of a substrate.
Figure 58B:
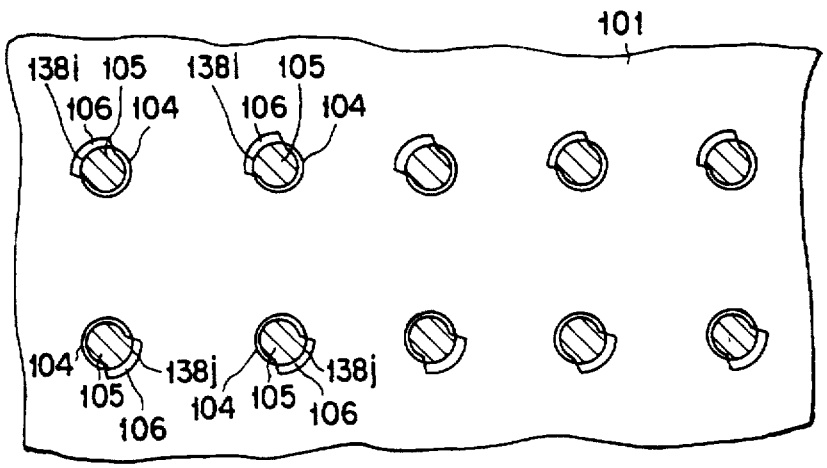

A NAND-cell DRAM shown in FIG. 57 uses circular-profile trench openings 112, each of which is located at a corresponding one of the cross-points between the word lines 108 and the bit lines 111. The positioning of side-wall contact portions 138 for such trenches 112 of FIG. 57 may be performed as shown in FIG. 58A or 58B. In the planar structure of FIG. 58A. which is cut off in a plane parallel with the surface of epitaxial silicon layer 102 (see FIG. 56, for example), the N type diffusion layer 106 and side-wall contact 138 are arranged at an arc-shaped portion 138g or 138h of each trench. The angle of each arc is less than 80 degrees. With respect to an array of circular trenches 112 illustrated in the upper section of FIG. 58A, the arc-shaped side-wall contact portions 138g face to the same direction, i.e., the left-hand direction. Another trench array neighboring to the above array is arranged so that the arc-shaped side-wall contact portions 138h face to the opposite (right-hand) direction. Looking at the planar pattern along the direction of one word line 108, the side-wall contact portions are alternately arranged between the opposite arc-shaped portions 133g and 133h as shown in FIG. 55. Such "alternate side-wall contact positioning" concept may be similar to that shown in FIG. 52. With such an alternate arc-shaped side-wall contact arrangement, the effective distance of N type diffusion layers 106 can be increased between the first and second cell arrays neighboring to each other. This means that the distance between neighboring trenches 112 in the direction of gate electrodes (word lines) 108 can be decreased, thereby to allow the cell size to be miniaturized, which may improve the integration density.

Another possible alternate arc-shaped side-wall contact positioning pattern is shown in FIG. 58B, wherein the side-wall contact portions of two adjacent circular trenches are diagonally opposed as designated by "138i" and "138j." The positions of such arc-shaped side-wall contact portions 138i, 138j may be planarly rotated by a desired angle around the round trench wall so that the diagonal angle is a differently determined angular value.

A NAND-cell DRAM shown in FIG. 59 is similar to the previous device of FIG. 28 with the storage electrodes 105 being alternately different in height from one another in each NAND cell unit. More specifically, while each NAND cell unit includes four cell trenches 112 of equal depth, adjacent ones of insulated storage electrodes 105 buried therein in the direction of bit line 111 are made different in height from each other, and neighboring storage electrodes in the word-line direction are also different in height from each other. Such "alternate height-differing" for the neighboring storage electrodes 105 in either the bit-line direction or the word-line direction causes the opposing N type diffusion side-wall contact layers 106 thereof to diagonally face to each other within the epitaxial layer 102, thereby to increase the effective distance therebetween. This may allow the cell size to further decrease. The trenches 112 may be modified so as to differ in depth to compensate for the height difference of storage electrodes 105 so that each storage electrode 105 provides the same capacitance. This may be attained by modifying a trench including a "tall" storage electrode to have the same vertical length measured downward from the position of N type diffusion side-wall contact layer 106 (side-wall contacts 138) as that of a neighboring trench including a "short" storage electrode 105, whereby the capacitor area is constant between the neighboring trenches 112.

A NAND-cell DRAM shown in FIG. 60 employs a sequential height differing arrangement for the storage electrodes 105 buried in four equal-depth trenches 112 in each NAND cell unit. More specifically, four storage electrodes 105 are made sequentially different in height in the bit-line direction in such a manner that a first-stage trench cell capacitor being positioned near the bit-line contact 110 is provided with the most short storage electrode, and that a fourth-stage trench cell positioned far from bit-line contact 110 includes the tallest storage electrode. This results in that the vertical positions of N type diffusion layers 106 (and the side-wall contact portions 138) formed in the epitaxial layer 102 become smaller sequentially in the first to fourth cell trenches 112 in this order, as shown in FIG. 60. With such "sequential storage-electrode differing" structure, it becomes possible to render substantially constant (or at least make smaller as compared with the embodiment of FIGS. 1, 2A and 2B) the "storage-capacitance to bit-line capacitance" ratio with respect to each trench-cell capacitor, where the "storage-capacitance to bit-line capacitance" ratio is the ratio of (1) the storage capacitance of each of the capacitors being connected through a corresponding vertical-type transistor to the series-connected transfer-gate MOS transistors to (2) the capacitance of a bit line 111 onto which a data stored in the each capacitor is read out. This can be said for the reasons as set forth below.

Assume that the capacitance of the bit line 111 with respect to a certain bit bit-line section extending from a sense amplifier (not shown) and the bit-line contact 110 is "CB." The capacitances of the first to fourth stage trench-cell capacitors are sequentially denoted by C1, C2, C3 and C4 in the order that these capacitors are series-connected to bit-line contact 110. The "storage-capacitance to bit-line capacitance" ratio SBRi (i=1, 2, 3, 4) of each capacitor may be represented approximately as follows:

(1) SBR1=CB/C1, (2) SBR2=(CB+C1)/C2, (3) SBR3=(CB+C1+C2)/C3, (4) SBR4=(CB+C1+C2+C3)/C4.

These equations indicate that, as the distance from bit-line contact 110 becomes longer, the bit-line capacitance is added with the capacitance of a capacitance positioned near bit-line contact 110, rather than the capacitance of a capacitor being presently selected for a data read operation. Therefore, it is possible, by employing the sequential storage-electrode differing structure of FIG. 60, that the "storage-capacitance to bit-line capacitance" ratios SBR remain substantially equivalent to one another among the four trench-cell capacitors; alternatively, it can be said that a difference between ratios SBR can be less than that of the embodiment shown in FIGS. 27 and 28.

Figure 61:
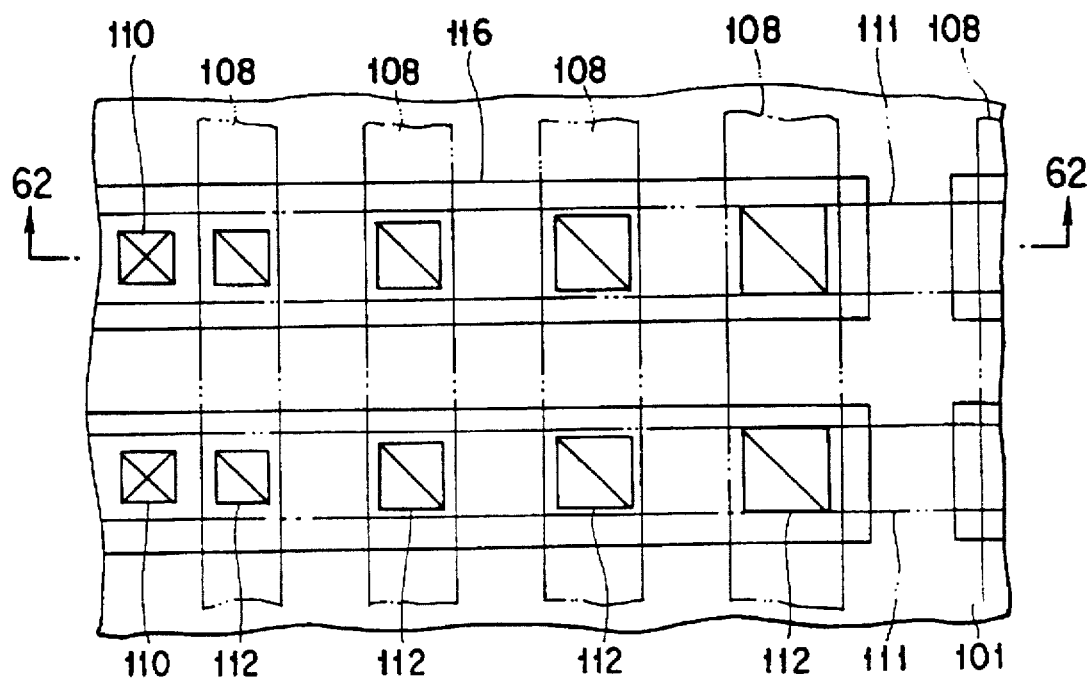
FIG. 61 is a plan view of a trench-type DRAM in accordance with an embodiment of the invention.
Figure 62:
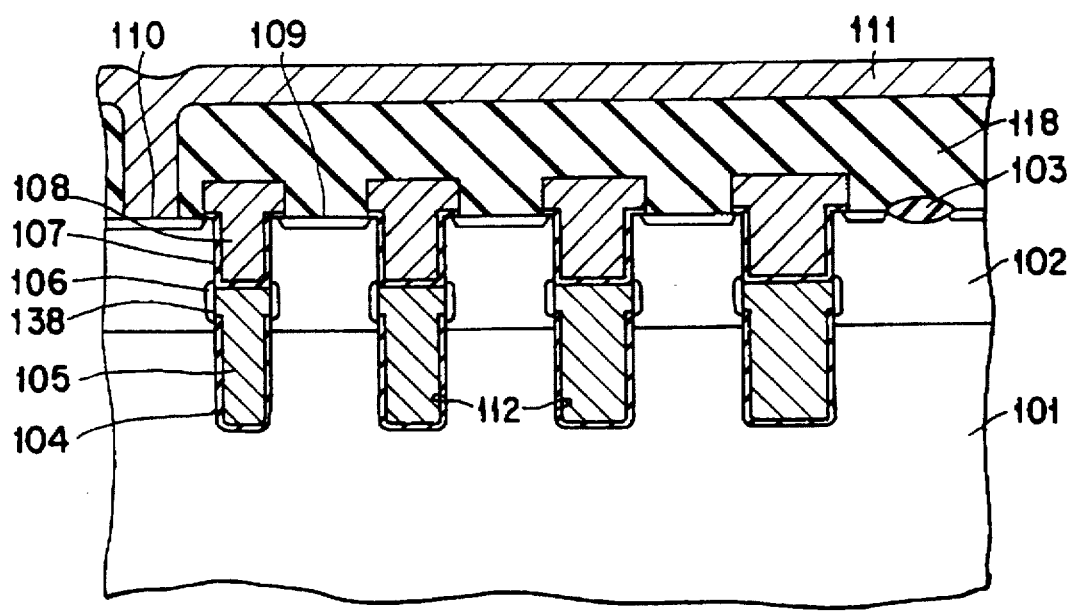
FIG. 62 shows the cross-sectional view of the DRAM of FIG. 61.
Figure 63:
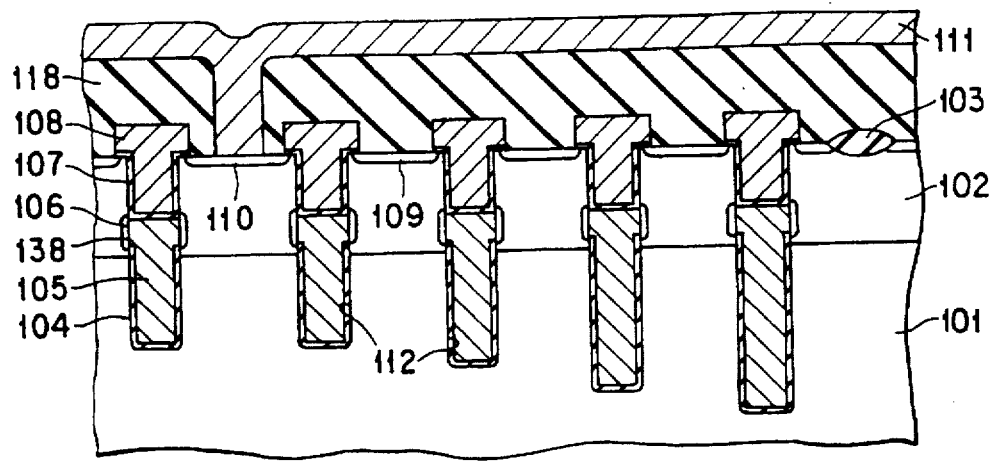
FIGS. 63 to 71 show several modifications of the cross-sectional structure of FIG. 62.

Another NAND-cell DRAM is shown in FIGS. 61 and 62, wherein the four trenches in a NAND cell unit are different from one another in trench opening size in such a manner that the trench opening area becomes wider sequentially as the distance from the bit-line contact 110 becomes longer. More specifically, the opening sizes of first to fourth stage trenches 112 for the series-connected transfer-gate MOS transistors, which trenches include the vertical type transistors and capacitors respectively, are sequentially enlarged or expanded in the direction parallel with bit lines 111 such that the first-stage trench near the bit-line contact 110 has the smallest square shape and the fourth-stage trench positioned far from contact 110 has the largest square shape as shown in FIG. 61. Also with such an arrangement, there can be obtained similar (or more significant) advantages concerning the achievement of an improve SBR ratios to (or than) those of the embodiment of FIGS. 27 and 28A–28B.

The memory-cell cross-sectional structure of FIG. 62 may be replaced with any one of those shown in FIGS. 63 to 71 as will be described below. A DRAM device of FIG. 63 employs the four NAND-cell trenches becoming sequentially deeper as the distance from the bit-line contact 110 increases. These trenches 112 are same as one another both in trench opening size and in the position of N type diffusion layers 106 and side-wall contact portions 138 formed in the epitaxial layer 102. With such an arrangement, there can be obtained similar advantages concerning the achievement of an improved SBR ratios to those of the embodiment of FIG. 60.

Figure 64:
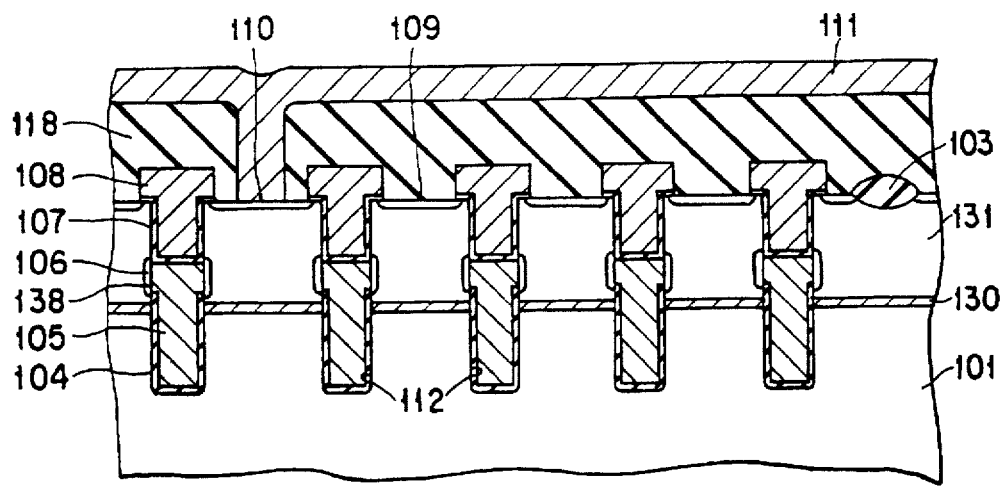

A DRAM device of FIG. 64 uses what is called the "SOI" (silicon on insulator) substrate structure, which is modified so that a silicon oxide film 130 is formed on the top surface of P+ type silicon substrate 101, and a single crystalline silicon layer 131 is formed on silicon oxide film 130. Employing such SOI substrate structure can lead to a suppression or elimination of the occurrence of a "soft error" phenomenon due to a decrease in the possibility of electrons or holes arriving at the N type diffusion layer 106 from P+ type silicon substrate 101 wherein the electrons or holes are produced by the radiation of a ray. Note that the conductivity of silicon substrate 101 may be changed from P+ type to N+ type. Substrate 101 may alternatively made from a chosen compound semiconductor material such as GaAs, InP, GaP; metal such as W, Ta, Ti, Al may also be used. The silicon oxide film 131 may be replaced with a single layer, a double-layered film, or a multi-layered film being made from silicon nitride, Al$_2$O$_3$, titanium oxide, tantalum oxide, or the like. If required, a polycrystalline silicon layer may be formed additionally on silicon oxide film 130.

Figure 65:
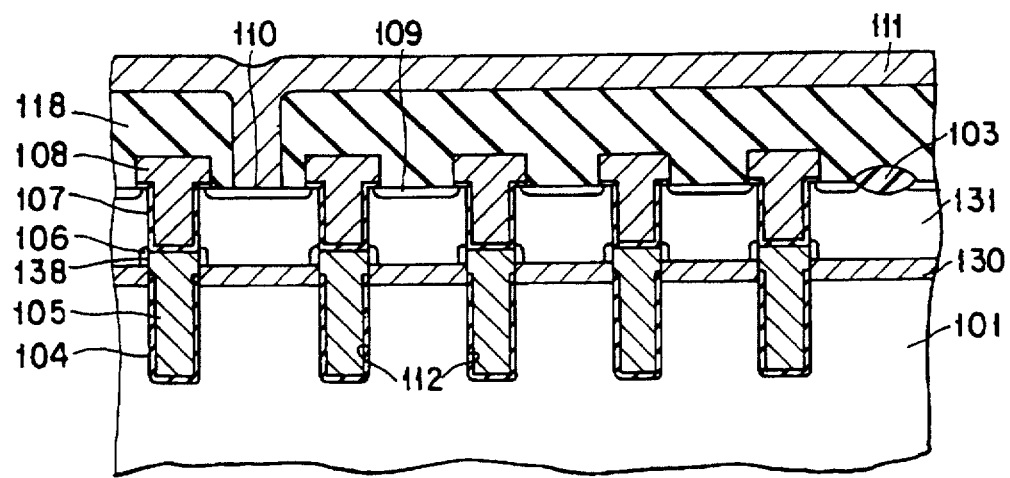

A device of FIG. 65 is similar to that of FIG. 64 with the silicon oxide film 130 being made thicker so that thick intermediate film 130 overlaps the lower half portions of the N type diffusion layers 106 being arranged at side walls of trenches 112 to be coupled through side-wall contacts 138 to the storage electrodes 105 respectively. The capacitor insulation film 104 of each trench 112 has its upper edge that terminates within thick film 138, which is thus also contacted partially with storage electrode 105 at the lower portion of side-wall contact 130 with respect to each trench 112. With such "insulator to storage-electrode coupling" feature, the elimination of occurrence of soft error can be strengthened. It becomes also possible to suppress the generation of a leak current due to the so-called "band-to-band tunneling" current that is well known among those skilled in the semiconductor memory art. For details of the band-to-band tunneling current, see VLSI Symposium Digest, "A Band-to-band Tunneling Effect in the Trench Transistor Cell," 1987 at pp. 97. The device of FIG. 65 may be modified in substantially the same manner as previously described with respect to the device of FIG. 64.

Figure 66:
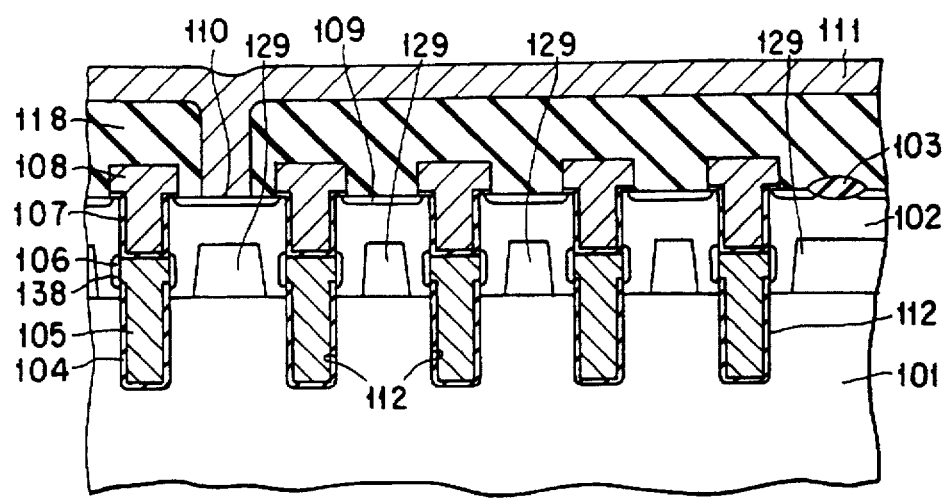

A DRAM device of FIG. 66 employs a modified substrate structure, wherein a plurality of P+ type regions 129 are arranged between adjacent ones of trenches 112 in the epitaxial layer 102 grown on the P+ type silicon substrate 101. Each of these P+ type regions 129 has a limited cross-section that is prevented from being contacted with the opposing N type diffusion layers 106 of neighboring trenches, thereby to strengthen the separation between of the opposing N type diffusion layers belonging to the neighboring trenches 112. With such an arrangement, the occurrence of an undesirable leak current due to punch-through phenomenon can be suppressed or eliminated between the opposing N type diffusion layers of any neighboring trenches. Note that, while the P+ type regions 129 are formed within epitaxial layer 102, it will be alternatively possible that a P+ type silicon substrate is used which is locally decreased in impurity concentration at certain regions to be formed with trenches 112, and that the P type epitaxial layer 102 is formed on such variable impurity-concentration substrate.

Figure 67:
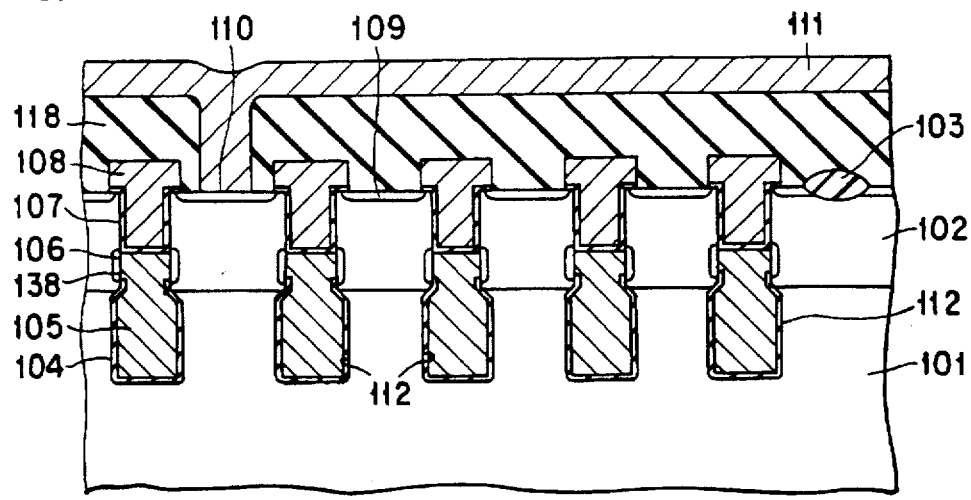

In a DRAM device shown in FIG. 67, each of the trenches 112 has a specific cross-sectional shape in the bit-line direction, wherein the profile of the lower trench portion positioned at the substrate 101 is greater (wider) in area than that of the upper portion in the epitaxial layer 102. With such an arrangement, the storage capacity of each trench capacitor can be increased.

Figure 68:
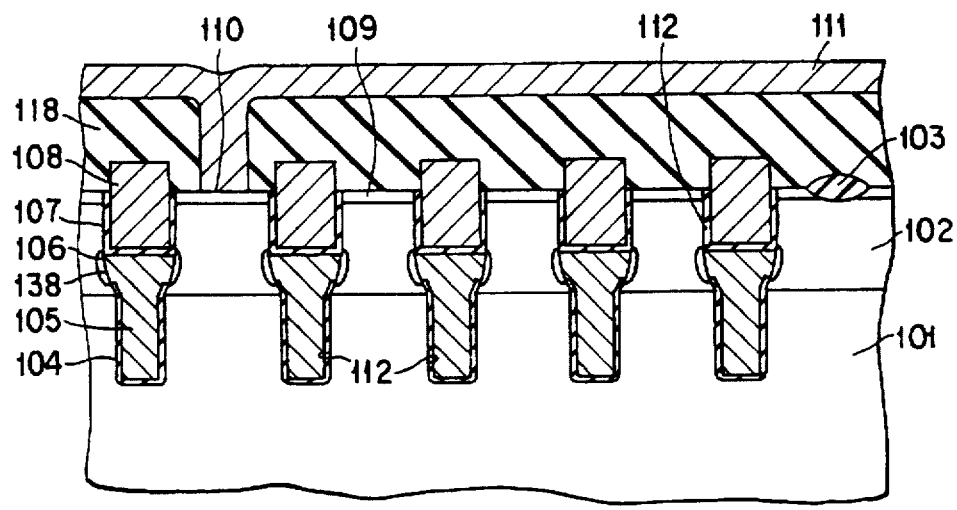

In a DRAM device shown in FIG. 68, the profile of each trench 112 in the bit-line direction is modified so that the profile of the lower trench portion positioned in the substrate 101 is less (narrower) in area than that of the upper portion in the P type epitaxial silicon layer 102. This causes the overlying gate electrode 108 to increase in cross-sectional area with respect to each of the vertical type MOS transistors. With such an arrangement, the peripheral length of vertical type MOS transistor can be made longer to increase its effective channel width, whereby the channel resistance can be reduced.

Figure 69:
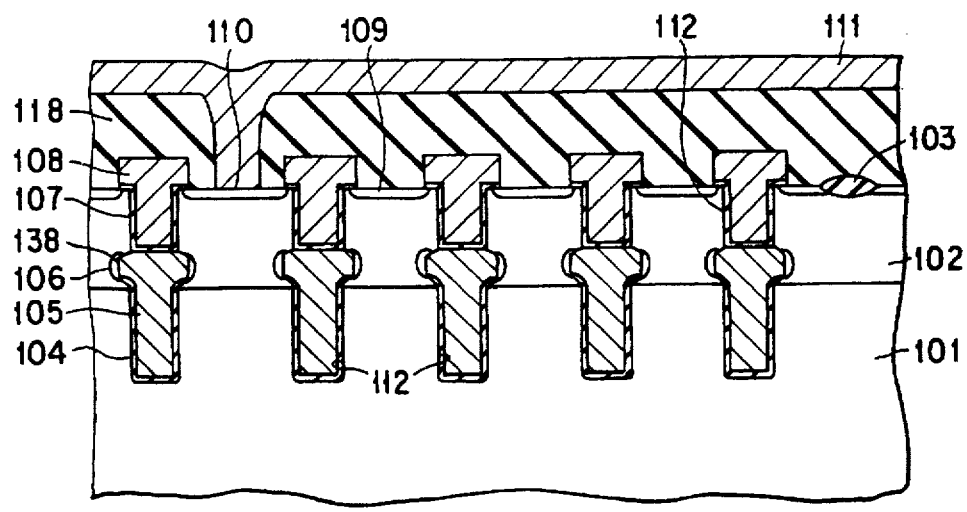

A DRAM shown in FIG. 69 is modified so that each trench 112 has a horizontally concave side wall. The concave portion is positioned in almost the middle position of the trench side-wall in the P type epitaxial silicon layer 102 in the vicinity of the top surface of silicon substrate 101. A storage electrode 105 is insulatively buried in such trench so that it has a "T"-shaped profile as shown. N type diffusion layer 106 is arranged to be in contact with both ends of the "cross-bar" portion of the T-shaped storage electrode 105. In other words, each trench 112 is partially increased in cross-sectional area at the selected side wall portion for forming N type diffusion layer 106. A T-shaped gate electrode 108 overlies the T-shaped storage electrode 105 in each trench 112. With such an arrangement, it becomes possible to decrease the contact resistance of the side-wall contact 138 in each trench 112.

Figure 70:
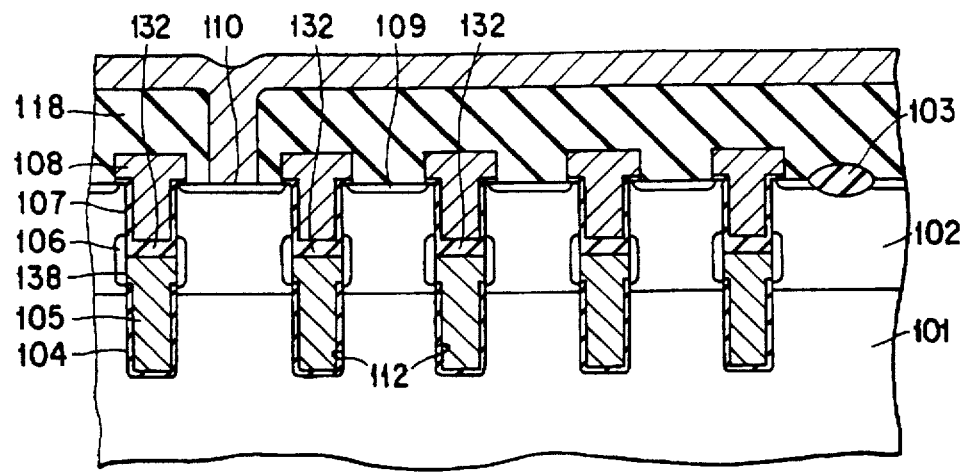

A DRAM shown in FIG. 70 uses a straight vertical trench 112 provided with a thick insulative film 132 being sandwiched between the buried storage electrode 105 and the overlying T-shaped gate electrode 108 in each trench 112. The sandwiched insulator 132 is greater in thickness than the gate insulation film 107. With such an arrangement, the withstanding voltage between storage electrode 105 and gate electrode 108 can be increased while allowing the capacitance therebetween to decrease, thereby to attain a high speed operation.

Figure 71:
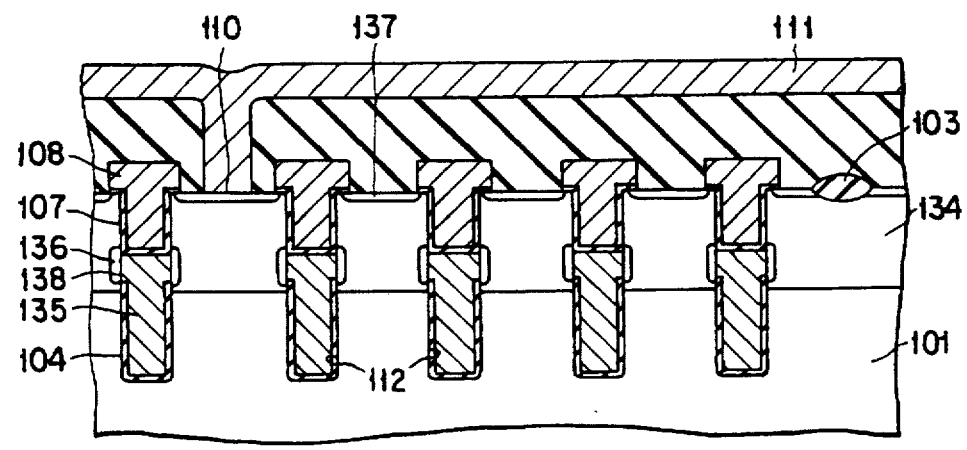

A DRAM shown in FIG. 71 employs an N type epitaxial silicon layer 134 grown on the P+ type silicon substrate 101. The transfer-gate MOS transistors and the vertical type MOS transistors are P type MOS transistors. More specifically, the source and drain of neighboring transfer-gate MOS transistors are formed of a P type diffusion layer 137 at the top surface of epitaxial layer 134. The source and drain of each vertical type MOS transistor are formed of a P type diffusion layer 136 and P type diffusion layer 137. The storage electrode 135 is made from a P+ type polycrystalline silicon being insulatively buried in the lower portion of each trench 112 so that storage electrode 135 is coupled to P type diffusion layer 136. With such a memory-cell structure, since the plate electrode (i.e., P+ type silicon substrate 101) and the storage electrode 135 of each trench capacitor are of the same type of conductivity, the voltage to be applied to capacitor insulation film 104 can be decreased as compared with a device wherein the plate and storage electrodes are different in conductivity type from each other. This makes it possible to increase or enhance the reliability of capacitor insulation film 104. Note that, while N type epitaxial layer 134 is formed on P+ type silicon substrate 101 in FIG. 71, a P type epitaxial silicon layer may alternatively formed on the P+ type substrate with an N type well being formed at a selected region containing memory cells.

A further NAND-cell DRAM shown is shown in FIGS. 72 and 73, wherein the substrate structure 101, 102 is provided with a cell separating groove 127 having silicon oxide film 128 buried therein. The insulated groove 127 is mainly formed in the P type epitaxial silicon layer 102 on P+ type silicon substrate 101, so as to define rows and columns of SDG island portions 116, as shown in FIG. 72, in which trenches 112 are arranged respectively. In each row of SDG islands 116, polycrystalline silicon layers 126 are arranged on epitaxial layer 102 causing transfer-gate MOS transistors therein to be series connected to one another in the direction parallel with the bit line 111. Each layer 126 is so patterned as to have its opposing edges that extend onto adjacent ones of the gate electrodes 108 in the bit-line direction as shown in FIG. 73. With such an arrangement, the fabrication process of polycrystalline silicon layers 126 can be made easier.

The rest of the present description will be devoted to the explanation of specific type of DRAM devices which have the one-capacitor/one-transistor cell structure, and which employ MOS transistors that are arranged by each using a semiconductive film on the side wall of a trench, rather than those MOS transistors arranged in the substrate at each trench side wall.

Figure 74:
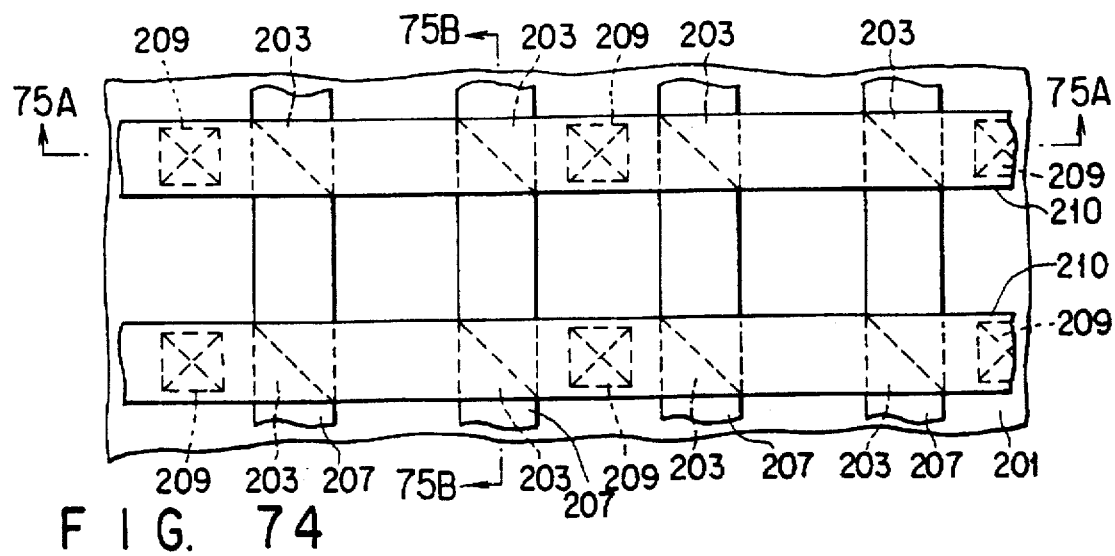
FIG. 74 is a plan view of a DRAM device in accordance with an embodiment of the invention.
Figure 75A:
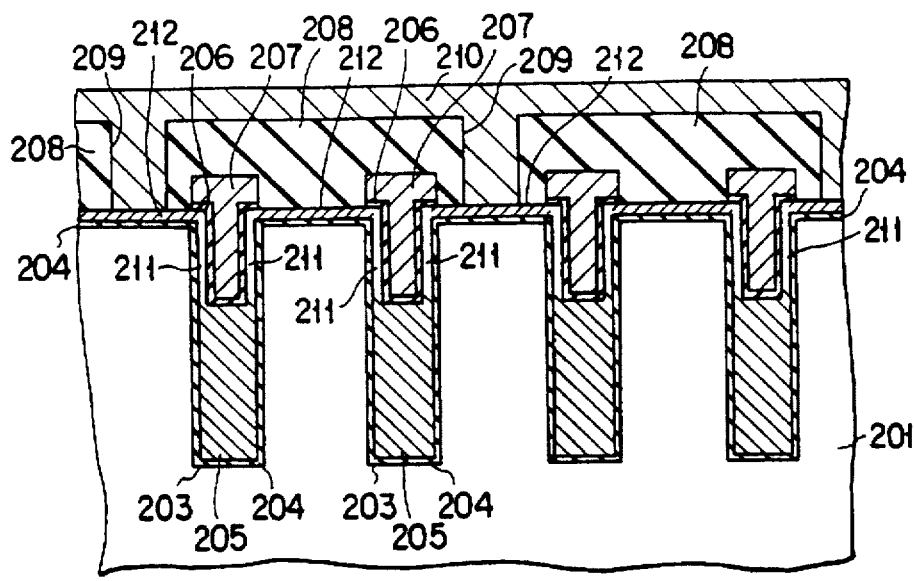
FIGS. 75A and 75B are diagrams showing the cross-sectional views of the device of FIG. 74.
Figure 75B:
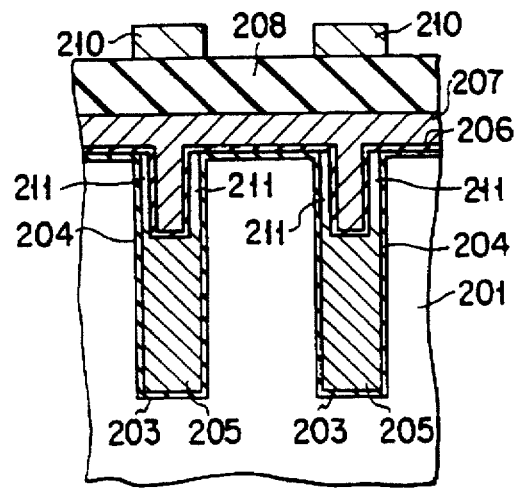

One preferred embodiment of such DRAM is shown in FIGS. 74, 75A and 75B, wherein a silicon substrate 201 is provided with a plurality of trenches 203 formed in memory cell regions thereof. Each trench 203 includes a MOS capacitor and an overlying MOS transistor insulatively stacked therein in this order. The capacitor has an insulated storage electrode 205 in the lower portion of trench 203 in such a manner that a capacitor insulation film 204 is arranged between storage electrode 205 and the inner wall surface of trench 203 to define a capacitance of a predetermined value. The buried storage electrode 205 may function as the source (or the drain) of a corresponding MOS transistor.

A semiconductive thin film 211 is specifically arranged on the inner side wall of the upper portion of trench 203 above the storage electrode 205. The thickness of such side-wall thin film 211 may be smaller than the half of the diameter (width) of trench. Side-wall film 211 is contacted at its bottom with the underlying storage electrode 205, and is insulated by capacitor insulation film 204 from substrate 201. The insulated side-wall film 211 acts as the channel region of the MOS transistor. A conductive layer 212 is arranged, as an N type electrode, on the top surface of substrate 201 so that layer 212 is insulated by insulation film 204 from substrate 201, and yet is coupled to the channel defining film 211 and storage electrode 205. Layer 212 may serve as the drain (or the source) region of the MOS transistor. A bit line 210 extends on a layer-to-layer insulating layer 208 on substrate 201 so that bit line 210 is connected to N type electrode 212 at bit-line contact portions 209 as shown in FIG. 75A. Side-wall film 211 defines a vertical trench-like concave portion in the upper portion of trench 203, causing a T-shaped gate electrode 207 to be arranged therein as shown in FIG. 75A. As a result, film 211 is located between substrate 201 and the "base" portion of the T-shaped gate electrode 207. Note that a part of the capacitor insulation film 204 which is contacted with side-wall film 211 in each trench may be omitted, causing film 211 to be in direct contact with substrate 201.

Figure 76A:
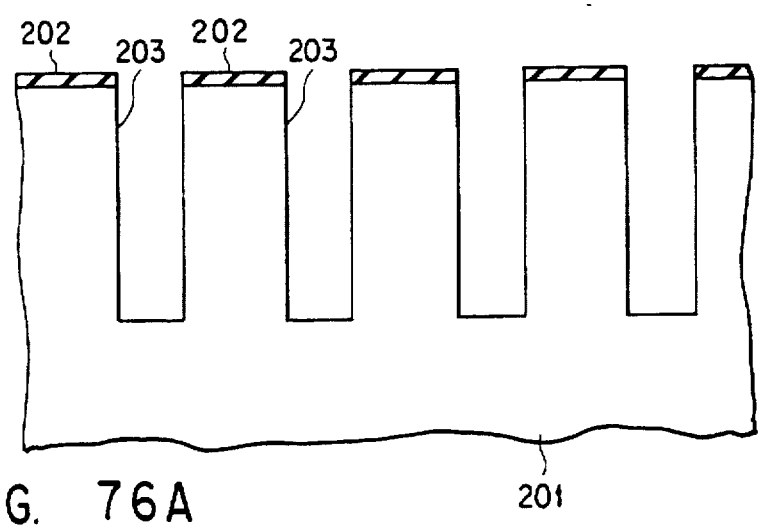
FIGS. 76A to 76F illustrate, in schematic cross-section, some of the major steps in the manufacturing process of the DRAM of FIGS. 74 and 75.

The manufacturing method of the DRAM device will be explained with reference to FIGS. 76A to 76F, which illustrate some cross-sectional structures corresponding to that of FIG. 75A which are obtained in the major steps of the manufacturing process. Firstly, as shown in FIG. 76A, a patterned silicon oxide film 202 is formed on a silicon wafer substrate as a mask layer for etching treatment. A plurality of trenches 203 are formed, using well-known lithography and reactive ion etching (RIE) techniques, in substrate 201 to a predetermined depth of 5 micrometers, for example.

Figure 76B:
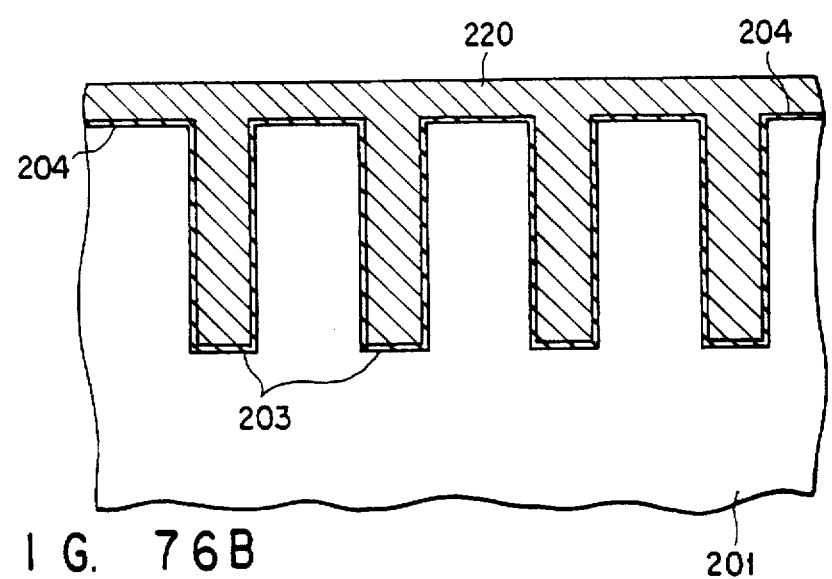

After the mask layer 202 is removed, a capacitor insulation film 204 and a first polycrystalline silicon film 220 are sequentially deposited on the entire surface of a resultant substrate including inner wall of trenches 203 as shown in FIG. 76B. The first polycrystalline silicon film 220 covers trenches 203 and has a flat top surface. Capacitor insulation film 204 may be a lamination of multiple layers of silicon oxide, silicon nitride and silicon oxide. The effective thickness of the lamination may be 10 micrometers. An n-type impurity such as As (arsenic) is doped into polycrystalline silicon layer 220, thereby causing this layer to decrease in resistivity.

Figure 76C:
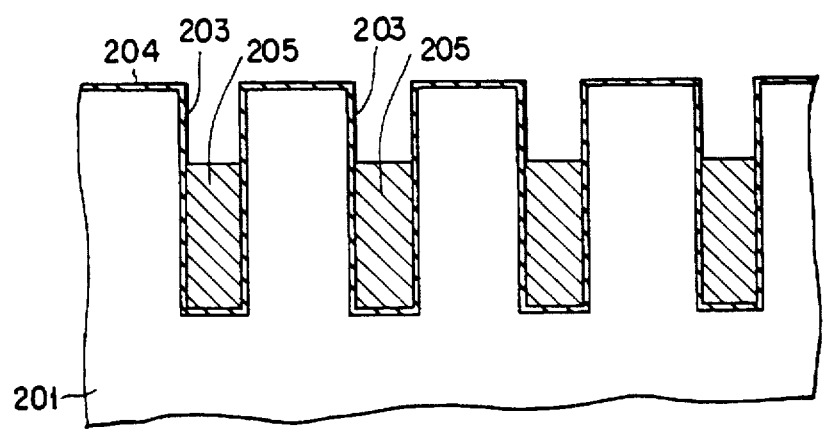

Subsequently, as shown in FIG. 76C, the first polycrystalline silicon layer 220 is partially etched using known chemical dry etching (CDE) technique so that the upper region of 1.5 micrometers thick is removed away. The remaining lower portions of layer 220 remain in respective trenches 203 to have an exposed top surfaces. These layer portions are storage electrodes 205.

Figure 76D:
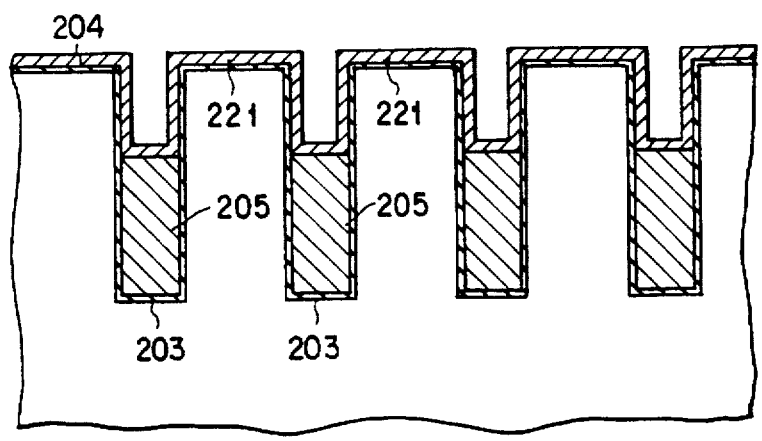

Subsequently, as shown in FIG. 76D, a second polycrystalline silicon layer 221 is deposited on the entire surface of a resultant structure. This second polycrystalline silicon layer 221 will be used as the channel region 211 and the drain electrode 212 of a MOS transistor in each trench as will be explained later. Second layer 221 is then patterned using lithography and RIE in the direction transverse to the word-line direction.

Figure 76E:
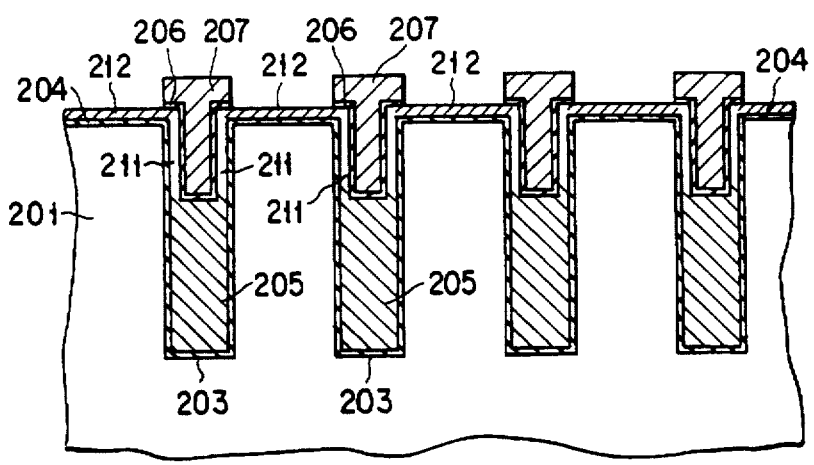

Subsequently, as shown in FIG. 76E, a gate insulation film 206 is formed on the entire surface of a resultant structure. A third polycrystalline silicon layer is then deposited on insulation film 206. After a chosen impurity is doped into the third polycrystalline silicon layer using known $POCl_3$ diffusion technique, the impurity-doped third polycrystalline silicon layer is etched using lithography and RIE to provide a plurality of gate electrodes 207 in trenches 203. An n-type impurity such as As is then doped into the entire surface of a resultant wafer structure, thereby causing the those portions of the second polycrystalline silicon layer on the wafer surface to become the N type electrode 212.

Figure 76F:
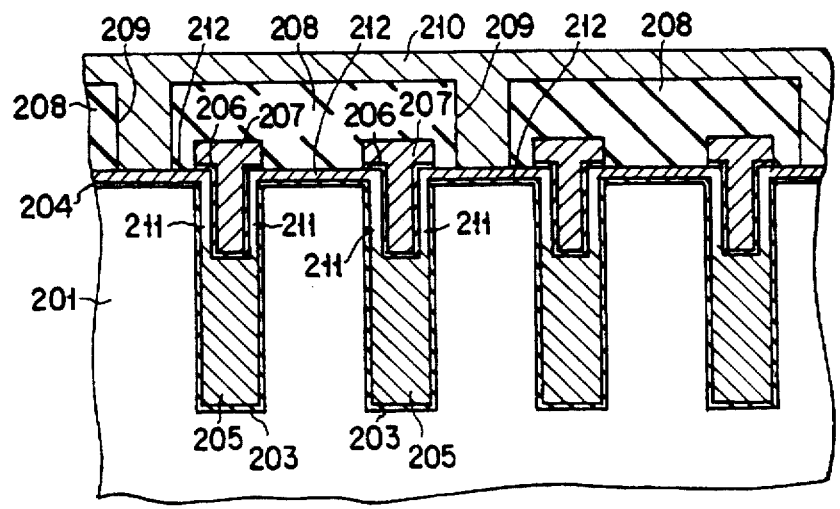

Subsequently, as shown in FIG. 76F, an insulative layer 208 is formed as the layer-to-layer insulating layer 208, and bit-line contact portions 209 are then formed using lithography and RIE technique. A conductive material is deposited on the entire surface of a resultant structure, and is patterned to provide a preselected number of parallel bit lines 210. Required wiring lines are formed to obtain the DRAM structure.

With the above embodiment, the trenches 203 are formed in the silicon substrate 201, and a MOS capacitor and a transfer-gate MOS transistor are then formed in each trench 203; therefore, it can assure that sufficient storage capacitance is attained while the occurrence of underlying step-pattern portions is suppressed. This makes it easier to fabricate the underlying wiring layers during the process of forming bit lines. In addition, since trenches 203 are not provided with any N type diffusion contact layers (106 of FIG. 68, for example) at the side walls thereof, it becomes possible to prevent a leak current from flowing between adjacent ones of trench cells. In other words, the "leak current" problem from which the conventional trench-cell type DRAMs have suffered can be successfully eliminated. This can improve the reliability while attaining an enhanced integration density.

A DRAM shown in FIGS. 77, 78A and 78B is similar to that of FIGS. 74 and 75 with the bit-line contacts 209 being arranged at all the N type electrode portions 212, each of which is located between adjacent ones of insulated gate electrodes 207 on substrate 210 in the direction parallel with the bit line 210. With such an increased number of bit-line contacts 209, the total bit-line contact area can be increased to decrease the bit-line contact resistance as compared with the embodiment of FIGS. 74, 75A and 75B.

Figure 79:
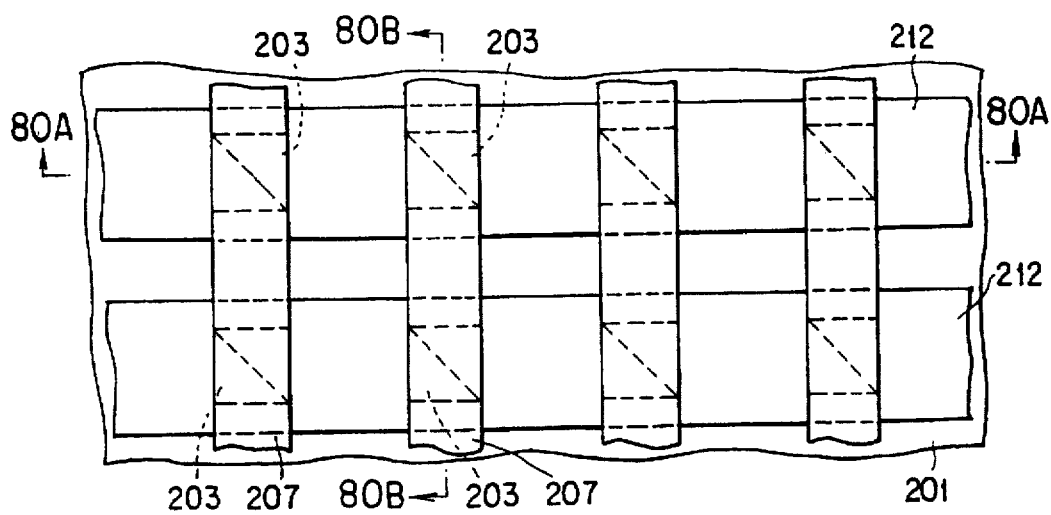
Figure 80A:
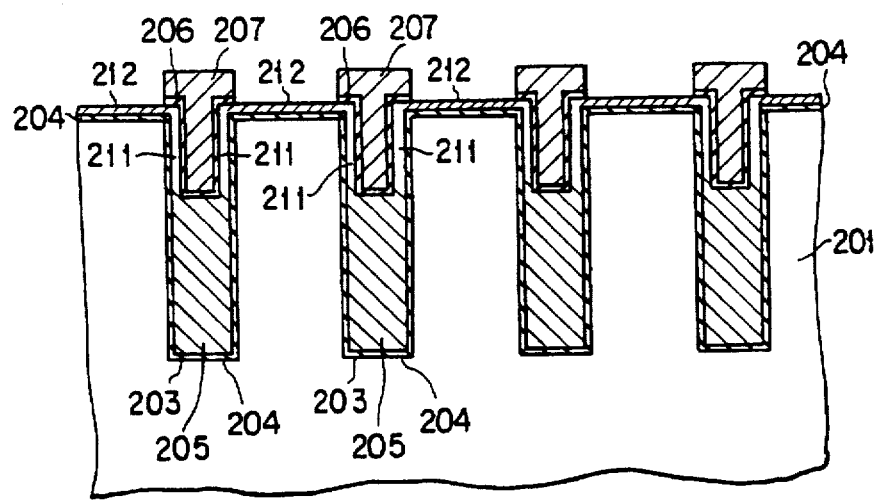
Figure 80B:
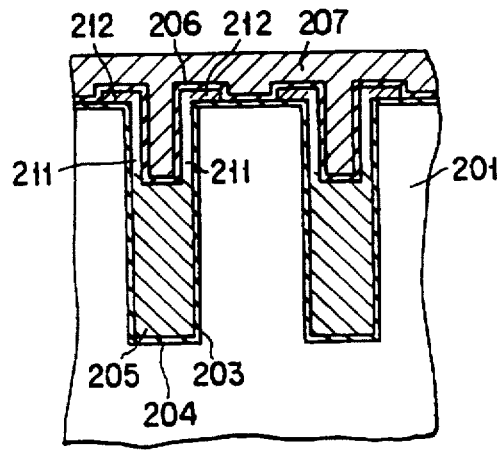

Another DRAM is shown in FIGS. 79, 80A and 80B, wherein the N type electrodes 212 is constituted by a single elongated layer having no separate portions at the trenches 203 and extending in the direction perpendicular to the word lines. With such an arrangement, N type electrode 212 can also function as a bit line, thereby to eliminate the necessity of additionally forming bit lines; therefore, the structure can be made simpler causing the production cost to decrease.

Figure 81:
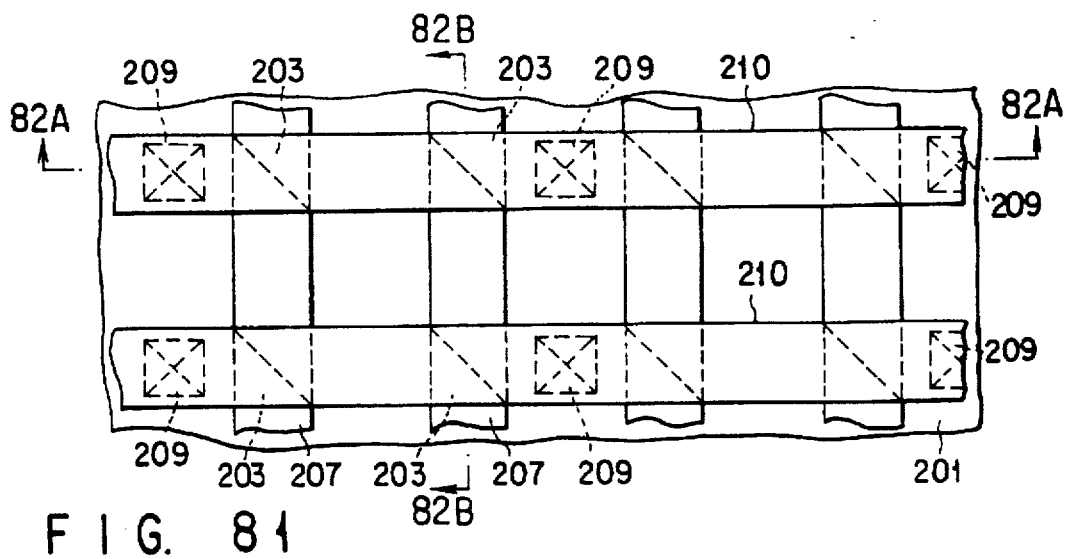
Figure 82A:
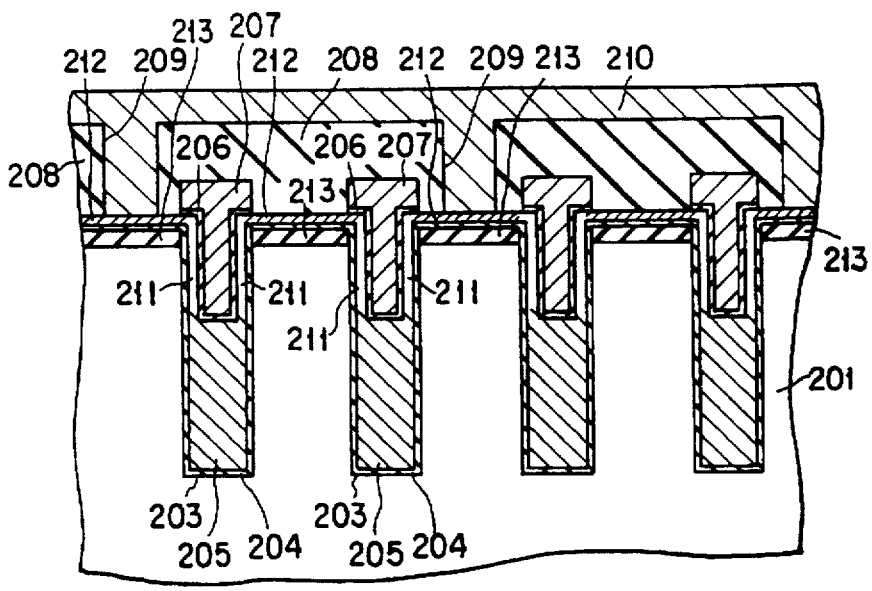
Figure 82B:
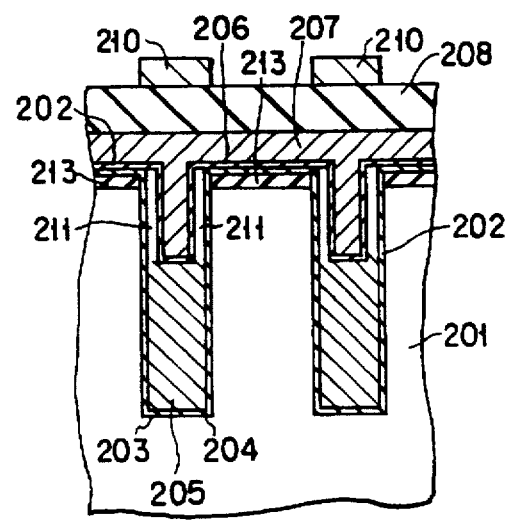

A DRAM shown in FIGS. 81, 82A and 82B is similar to that of FIGS. 77 and 78 with a silicon oxide film 213 being added on the top surface of substrate 201 in the memory cell region. With such an arrangement, it becomes possible to prevent the insulation breakdown from taking place in the capacitor insulation film 204 due to the damage during the formation of bit-line contact portions 209. Note that, in the embodiment, the silicon oxide film 213 formed on silicon substrate 201 may be replaced with another insulative film such as a silicon nitride film or the like.

Figure 83:
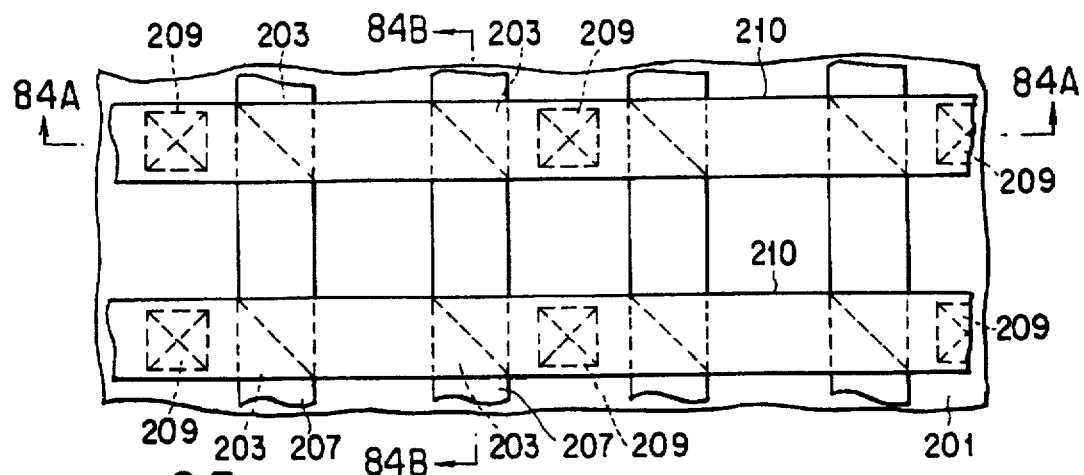
Figure 84A:
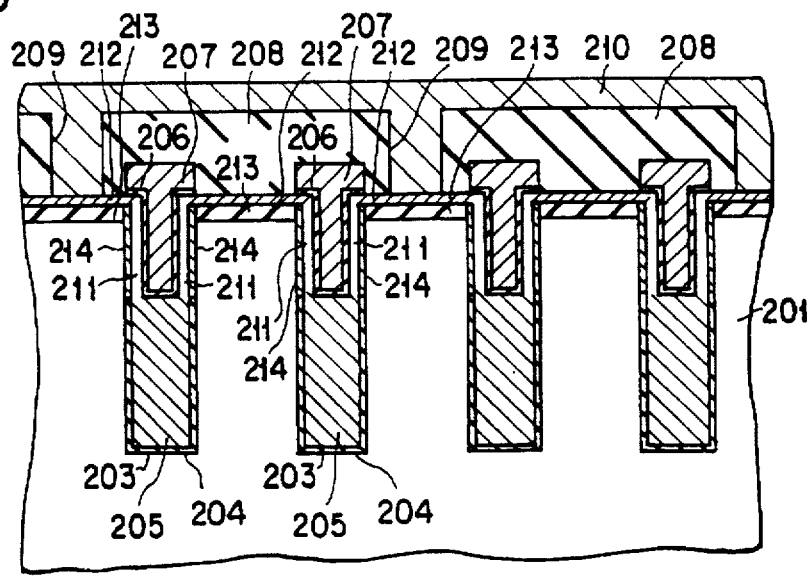
Figure 84B:
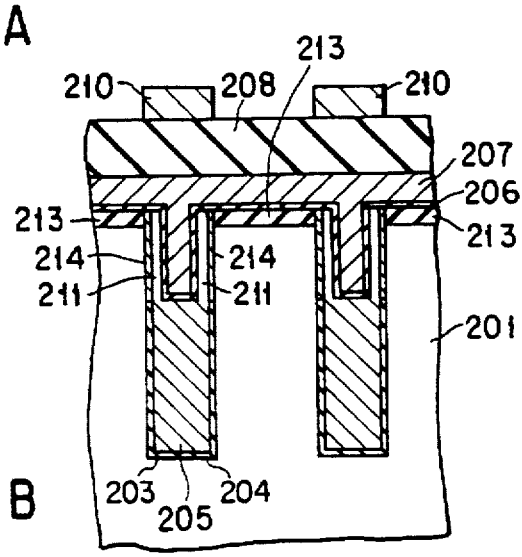

A DRAM shown in FIGS. 83, 84A and 84B is similar to that of FIGS. 81 and 82 with the capacitor insulation film 204 being partially replaced with a silicon-oxide film 214 at the upper side wall portion of each trench 203. A different hatching is applied to silicon oxide film 214 for purposes of illustration only. The thickness of silicon oxide film 214 is substantially equivalent to that of the underlying capacitor insulation film 204; however, this is not a critical condition, and film 214 may be different in thickness from capacitor insulation film 204. On the top surface of substrate 210, N type electrode 212 is arranged on silicon oxide film 213 in the memory cell region with no insulative thin film being sandwiched between films 212, 213. With such an arrangement, since silicon oxide film 214 has no concern with the capacity of a trench-cell capacitor, the thickness of it can be freely determined as required. Varying the thickness of silicon oxide film 214 can control the MOS transistor characteristics as desired. Note that the silicon oxide film 213 on silicon substrate 201 may be replaced with another insulative film such as a silicon nitride film or the like. Alternatively, such insulative layer may be removed if required. Also, silicon oxide film 214 at the upper portion of trench 203 may be replaced with another insulative material such as silicon nitride.

Figure 85:
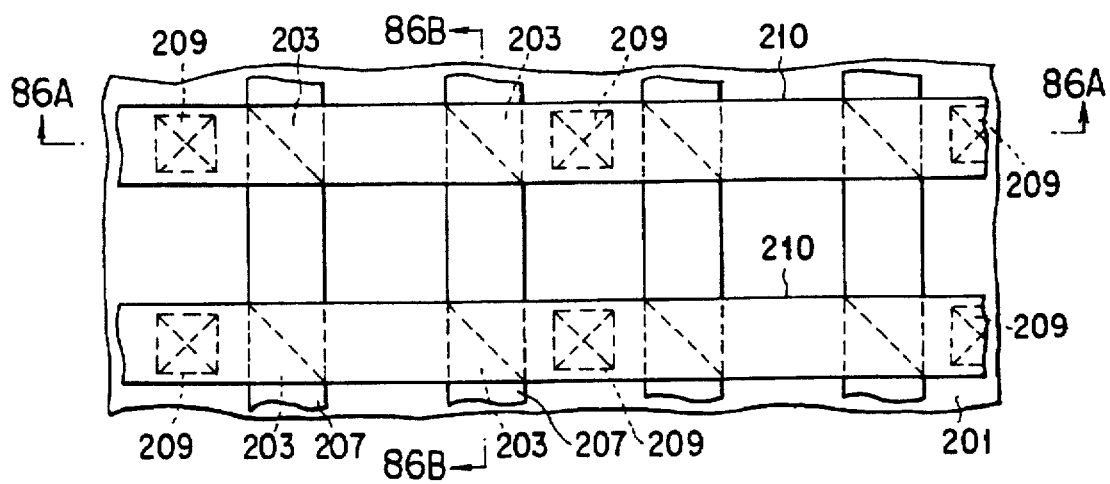
Figure 86A:
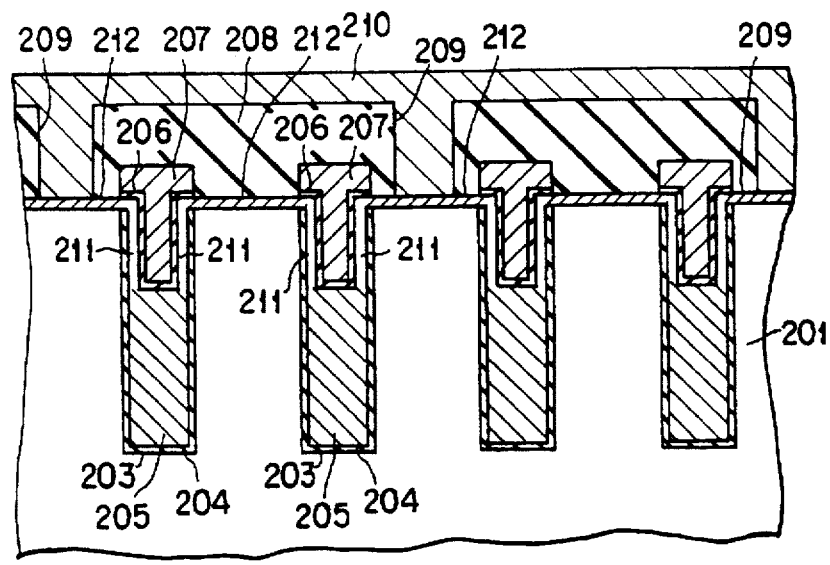
Figure 86B:
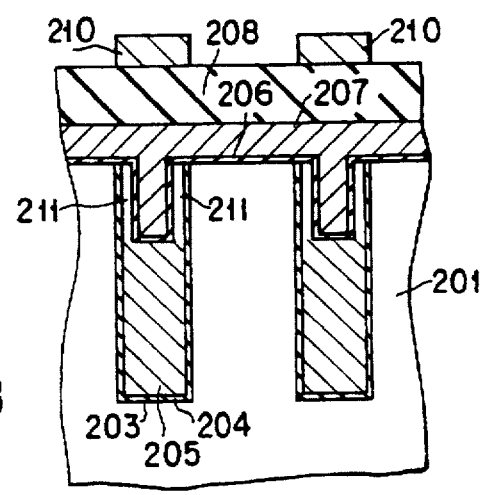

A DRAM shown in FIGS. 85, 86A and 86B is similar to that of FIGS. 74 and 75 with the capacitor insulation film 204 being formed only within each trench 203 thereby causing the top surface of the silicon substrate 201 to be in direct contact with the N type electrode 212. With Such an arrangement, the N type electrode 212 and the channel region 211 are allowed to be made of single crystalline material, whereby the MOS transistor characteristics can be improved.

A DRAM shown in FIGS. 87, 88A and 88B is similar to that of FIGS. 74 and 75 with (1) the substrate being replaced by a P type silicon substrate 219 having an N type diffusion layer 218 therein, and (2) the plate electrode being constituted by an insulated conductive layer 215 of "U" shaped profile. This U-shaped layer 215 is buried in the lower half portion of each trench 203, while a silicon oxide film 217 is formed between U-shaped layer 215 and the inner side wall of each trench. U-shaped buried plate layer 215 may be made from polycrystalline silicon doped with a chosen impurity such as P or As. U-shaped plate layer 215 is contacted, at its bottom contact portion 216, with N type diffusion layer 218. The resultant capacitor is constituted by U-shaped buried plate layer 215, capacitor insulation film 204 and storage electrode 205. With such an arrangement, the buried plate layer 215 can be potentially controlled independently of P type silicon substrate 219, thereby making it possible to improve the reliability of capacitor.

Note, in the embodiment, that the buried plate layer 215 may be made from not only polycrystalline silicon but also a different material such as one selected from the group consisting of single-crystalline silicon, porous silicon, metal such as W, Te, Ti, Hf, Co, Pt, Pd, or the like), or silicide of these metals. Plate layer 215 may also be a multi-layered structure including a plurality of stacked layers made from selected materials from the group. The P type silicon substrate 219 may be replaced with an N type silicon substrate; in such a case, the N type diffusion layer 218 of FIG. 88 is not required.

Figure 89:
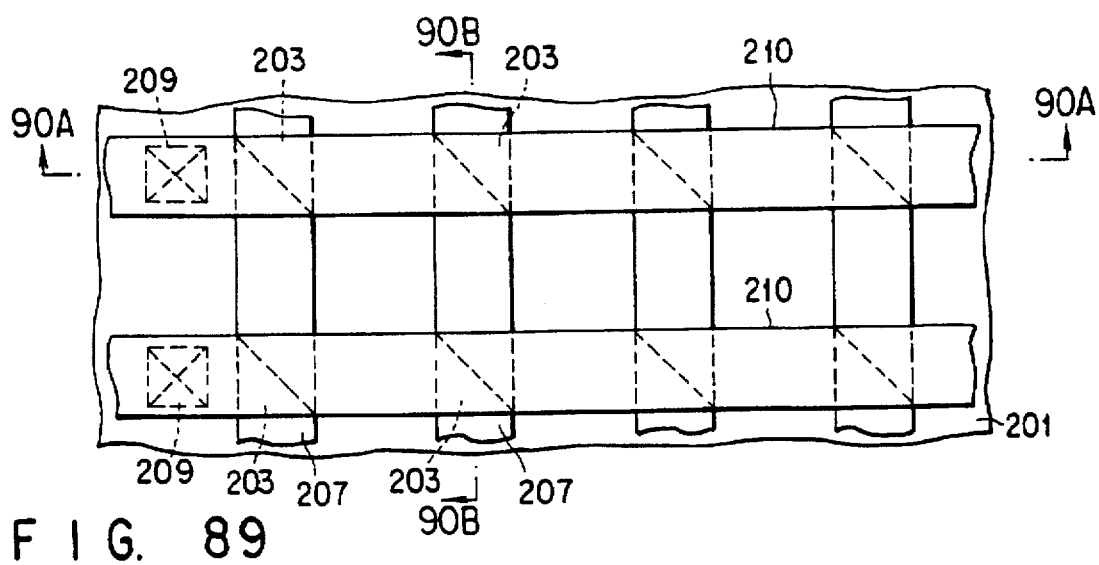
Figure 90A:
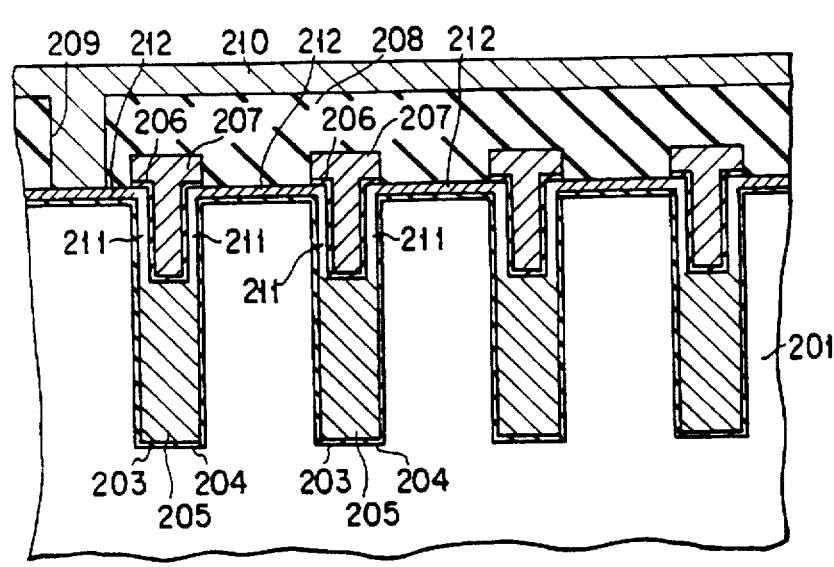
Figure 90B:
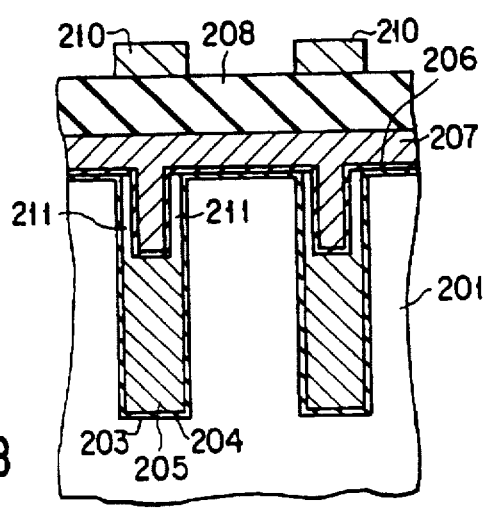

A DRAM shown in FIGS. 89, 90A and 90B is similar to that of FIGS. 74 and 75 with the bit-line contact portions 209 being reduced in number thus causing an increased number of vertical type MOS transistors to be connected in series with one another to provide a NAND type memory cell structure wherein the source (or drain) of each MOS transistor is coupled to an information storage capacitor. Each of the MOS transistors acts as both a transfer gate and a data-transfer MOS transistor. More specifically, the transfer gate is a vertical type MOS transistor that includes an insulated gate electrode 207 (common gate electrode), N type electrode 212, channel region 211 and storage electrode 205, whereas the data-transfer MOS transistor is a lateral type MOS transistor having the common gate electrode 207, channel region 211, and a part of N type electrode being contacted with channel region 211. The circuit diagram of a resultant memory cell structure is similar to that shown in FIG. 26, and the memory cell can therefore operate as a NAND cell.

The present invention is not limited to the above-described specific embodiments and may be practiced or embodied in still other ways without departing from the spirit or essential character thereof.

In the embodiment previously described with reference to FIGS. 1 to 3I and its related embodiments, the whole region of substrate 1 is made from P+ type semiconductor material serving as the plate electrode; however, this substrate may be replaced with another substrate partially doped with boron in its selected surface region (5 micrometers thick, for example) including at least the cell array region, thereby to form a P+ type layer in the selected surface region. There may alternatively be used a substrate having a P+ type layer, which is formed by known solid-phase diffusion technique using BPSG or by liquid-phase diffusion technique using BN (boron nitride). The P+ type silicon substrate 1 may be replaced with an N+ type silicon substrate (or a substrate having an N+ type region in its top surface). With such substrate structure, it becomes possible to attain a different voltage control between P type layer 2 and N+ type substrate in such a manner that the voltage applied to P type layer 2 wherein the MOS transistor is formed is determined independently of the voltage applied to N+ type substrate serving as the plate electrode. While the P type well is formed in the memory cell array region by using the wafer having P type epitaxial layer 2, such P type well may be omitted if the impurity concentration of epitaxial layer 2 is suitable. The P type epitaxial layer may be replaced with an N type epitaxial layer, in which a P type well is formed in its memory cell array region.

The substrate structure having the P type epitaxial layer 2 may be replaced with a silicon substrate having, as the plate electrode, a highly-doped P+ layer (or N+ layer) which is formed using well-known ion implantation technique by doping a chosen impurity of boron (or phosphorus) under the application of high acceleration voltage such as b 3MeV. The capacitor insulation film, which is made from the lamination of silicon oxide, silicon nitride and silicon oxide as previously described, may be alternatively made of one or composite of insulative films made from known ferroelectric or paraelectric material including silicon oxide, silicon nitride, tantalum oxide, hafnium oxide, and the like. Regarding the storage electrode 7, while it is made from the polycrystalline silicon doped with As (arsenic) impurity, this electrode may be modified as follows: The As is solid-diffused using AsSG, or what is called the "impurity-doped polycrystalline silicon film" is employed wherein As is doped therein during the formation of the film. As may be replaced with P.

Alternatively, storage electrode 7 may be a B-doped N type layer. The material constituting storage electrode may be replaced with a single layer, or a lamination, of single-crystalline silicon, porous silicon, metal (such as W, Te, Ti, Hf, Co, Pt, Pd, or the like), or silicide of these metals.

Regarding the cell-separating groove 3, it is not strictly required that groove 3 is so deep enough to reach the substrate 1; groove 3 may be more shallow as far as it is deeper than N type diffusion layers 9. Groove 3 may be equivalent in depth to or deeper than trenches 5, if required. While silicon oxide film is buried in groove 3, another dielectric material may alternatively be used, such as silicon nitride, polycrystalline silicon, singe-crystalline film, PSG, BSG, BPSG, or a composite film of some of these materials. The island-connecting layer for providing a bit line may be made from a material other than the N type polycrystalline semiconductor material, such as P type polycrystalline semiconductor, single-crystalline silicon, porous silicon, metal (including W, Ta, Ti, Hf, Co, Pt, Pd, Al, Cu, or the like), or silicide of these materials. A lamination selected from the above materials may be used alternatively. The conductivity type of the MOS transistors may be changed from N type to P type.

Concerning the embodiment of FIGS. 4 and 5A–5B, the conductivity type of the silicon substrate 1 may be changed from P type to N type; in such case, the N type buried layer 24 may be omitted. The P type epitaxial layer 2 may be modified to have N type; in such case, a P type well region may be formed in its memory cell array region. The N type buried layer 24 may be formed using an ion implantation technique for causing an impurity to be doped from the wafer surface under the application of a higher acceleration voltage. In such case, an epitaxial wafer will not be strictly required. The plate electrode wiring layer corresponding to the N type buried layer 24 may alternatively be formed by causing the impurity to be diffused from the plate electrodes 26. This plate electrode 26 may alternatively be made from P type polycrystalline semiconductor, single-crystalline silicon, porous silicon, metal (including W, Ta, Ti, Hf, Co, Pt, Pd, Al, Cu, or the like), or silicide of these materials. A lamination selected from the above materials may also be used for plate electrode 26.

Concerning the trench/NAND-cell type DRAM device previously described with reference to FIGS. 27 to 29H and its related embodiments, the P+ type silicon substrate 101 may be modified as follows. A chosen impurity such as B is ion-implanted into a limited region of the silicon substrate including memory cell region, so that only the substrate surface region including the trenches (for example, the surface region of 5 micrometers depth) is forced to be a P+ region. Alternatively, the solid-phase diffusion process using BPSG may be employed to cause the substrate surface region to be a P+ region. The liquid-phase diffusion technique using BN may also be used to form the P+ type region in the substrate surface. The P+ type silicon substrate 101 may be replaced with either an N+ type silicon substrate or a substrate having N+ type region in its surface including the memory cell region. With such a structure, the voltage applied to the N+ type substrate can be set independently of the voltage applied to the P well including a vertical type transistor and a data-transfer MOS transistor.

While the P type epitaxial layer 102 and P type well layer are formed in the substrate region including memory cells, the P type well layer may be omitted. Alternatively, an N type epitaxial layer and a p type well layer may be formed at least in the memory cell region. The capacitor insulation film may be alternatively made of one or a composite of insulative films made from known ferroelectric or paraelectric material including silicon oxide, silicon nitride, tantalum oxide, hafnium oxide, and the like. The storage electrode 105 may be alternatively formed by doping As-impurity into a polycrystalline silicon by known solid-phase diffusion technique using AsSG. An As-doped polycrystalline silicon may alternatively used which is formed by mixing As during the formation of the polycrystalline silicon layer. The As-doping into polycrystalline silicon may be replaced with P-doping. $POCl_3$-diffusion, PSG diffusion. A P-doped polycrystalline silicon may be used which is formed by mixing P-impurity during the formation of a polycrystalline silicon. A B-ion may be used which is doped into the polycrystalline silicon using either the ion implantation or solid-phase diffusion using BSG, for example, to form a P type polycrystalline silicon layer. A B-doped polycrystalline silicon may also be used.

Additionally, the storage electrode 105 may alternatively be made from single-crystalline silicon, porous silicon, metal (such as W, Ta, Ti, Hf, Co, Pt, Pd), or silicide of these materials. A lamination materials selected from the above materials may also be used. The gate insulation film 107 may be alternatively made from one or a compound of silicon nitride, ferroelectric material, and the like. The gate electrode 108 may be modified to be similar in structure to storage electrode 105; gate electrode 108 may be made from As-doped polycrystalline silicon (using known ion implantation or solid-phase diffusion), As-doped poly-silicon, P-doped polycrystalline silicon (using ion implantation or solid-phase diffusion), P-doped poly-silicon, B-doped polycrystalline silicon (using ion implantation or solid-phase diffusion), B-doped poly-silicon, monocrystalline silicon, porous silicon, metal (such as W, Ta, Ti, Hf, Co, Pt, Pd), or silicide of these materials. A lamination selected from the above materials may also be used. The element separation between adjacent memory cells may be alternatively arranged using another known technique such as trench-separation, MOAT separation, or the like.

The aforementioned modifications may also be applied to the DRAM device shown in FIGS. 74 to 76F and its related embodiments. Additionally, the substrate 201 may be alternatively made from germanium, carbon, GaAs at least in its memory cell region. The N-channel type MOS transistors may be replaced with P-channel type MOS transistors, wherein the upper portions of the storage electrode 205 and the second polycrystalline silicon 221 are changed to have the P type conductivity.

What is claimed is:

1. A random access memory comprising:

a semiconductor substrate having a plurality of trenches formed in a form of rows and columns on a main surface of said substrate;

a plurality of capacitors formed in lower portions of said trenches, respectively, each of said plurality of capacitors including a plate electrode composed of said semiconductor substrate, a capacitor insulating film formed thereon, a storage electrode formed on said capacitor insulation film and buried in each of said lower portions of said trenches;

a plurality of MOS transistors formed in upper portions of said trenches, respectively, each of said transistors including:

a channel formation region composed of a semiconductor film formed above a side surface of each of said upper portions of said trenches with a first insulating film interposed therebetween;

a gate electrode formed above said channel formation region with a gate insulation film interposed therebetween and insulatively buried in each of said upper portions of said trenches, said gate electrode being formed so as to continuously extend on said main surface of said substrate in a direction of said rows to serve as a word line;

a first impurity-doped region formed as said storage electrode and connected to a lower end of said channel formation region;

a second impurity-doped region formed, above said main surface of said substrate, beside said gate electrode and along one side of said word line; and a plurality of bit lines each connected to said second impurity-doped region and formed continuously in a direction of said columns above said main surface of said substrate wherein said second-impurity doped region is shared by adjacent ones of said transistors arranged in the direction of said columns and is connected, exclusively when said gate electrode is supplied with an activation signal to make said channel formation region conductive, to an adjacent one of said second impurity-doped region through an upper end of said channel formation region interposed therebetween on said main surface of said substrate, thereby being continuously linked in the direction of said columns to be served as another bit line.

2. The memory according to claim 1, wherein said second impurity-doped region is shared by adjacent ones of said plurality of transistors arranged in the direction of said columns and each of said bit lines is connected to said second impurity-doped region shared by each two of said transistors.

3. The memory according to claim 1, wherein said second impurity-doped region is formed above said main surface of said substrate with a second insulating film interposed therebetween.

4. The memory according to claim 3, wherein a third insulating film is formed between said main surface of said substrate and said second insulating film under said second impurity-doped region.

5. The memory according to claim 1, wherein said second impurity-doped region is directly formed on said main surface of said substrate.

6. The memory according to claim 1, wherein adjacent transistors of said plurality of MOS transistors arranged in a direction of said bit lines share said second impurity-doped region with each other, thereby connecting said MOS transistors in series which include a plurality of second impurity-doped regions and each of said plurality of bit lines is connected to said plurality of second impurity-doped regions alternatively along the direction of said bit lines.

* * * * *